United States Patent
Ou et al.

(10) Patent No.: US 8,369,148 B2
(45) Date of Patent: Feb. 5, 2013

(54) OPERATION METHODS FOR MEMORY CELL AND ARRAY THEREOF IMMUNE TO PUNCHTHROUGH LEAKAGE

(75) Inventors: Tien-Fan Ou, Taipei (TW); Wen-Jer Tsai, Hualien (TW); Jyun-Siang Huang, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 1009 days.

(21) Appl. No.: 12/264,893

(22) Filed: Nov. 4, 2008

(65) Prior Publication Data
US 2009/0116287 A1    May 7, 2009

Related U.S. Application Data

(60) Provisional application No. 60/985,966, filed on Nov. 6, 2007, provisional application No. 60/986,198, filed on Nov. 7, 2007, provisional application No. 60/986,479, filed on Nov. 8, 2007, provisional application No. 60/986,960, filed on Nov. 9, 2007.

(51) Int. Cl.
*G11C 11/34* (2006.01)
(52) U.S. Cl. .......... 365/185.17; 365/185.02; 365/185.28
(58) Field of Classification Search ............. 365/185.17, 365/185.02, 185.28
See application file for complete search history.

(56) References Cited

U.S. PATENT DOCUMENTS

| | | | |
|---|---|---|---|
| 4,803,662 A | 2/1989 | Tanaka | |
| 5,557,569 A | 9/1996 | Smayling et al. | |
| 5,912,843 A | 6/1999 | Jeng | |
| 6,172,909 B1 * | 1/2001 | Haddad et al. ............. | 365/185.19 |
| 6,232,634 B1 | 5/2001 | Wu et al. | |
| 6,441,443 B1 | 8/2002 | Hsu et al. | |
| 6,624,660 B2 * | 9/2003 | Li et al. ............................ | 326/83 |
| 6,654,283 B1 * | 11/2003 | Haddad ..................... | 365/185.17 |
| 6,667,511 B1 | 12/2003 | Fang | |
| 6,690,601 B2 | 2/2004 | Yeh et al. | |
| 6,757,196 B1 | 6/2004 | Tsao et al. | |
| 6,903,968 B2 | 6/2005 | Jeng | |
| 6,992,925 B2 | 1/2006 | Peng | |
| 7,054,196 B2 | 5/2006 | Chen et al. | |
| 7,057,938 B2 | 6/2006 | Yeh et al. | |

(Continued)

FOREIGN PATENT DOCUMENTS

| | | |
|---|---|---|
| CN | 1945837 A | 4/2007 |
| TW | 200421348 | 10/2004 |

(Continued)

OTHER PUBLICATIONS

Notice of Allowance for U.S. Appl. No. 12/264,886, mailed on Feb. 25, 2011, 5 pages.

(Continued)

*Primary Examiner* — Alexander Sofocleous
*Assistant Examiner* — Han Yang
(74) *Attorney, Agent, or Firm* — Kilpatrick Townsend & Stockton LLP

(57) ABSTRACT

An integrated circuit includes a memory cell structure including a first cell and a second cell. The first cell includes a first storage structure and a first gate over a substrate. The first gate is over the first storage structure. The second cell includes a second storage structure and a second gate over the substrate. The second gate is over the second storage structure. The first gate is separated from the second gate. A first doped region is adjacent to the first cell and is coupled to a first source. A second doped region is configured within the substrate and adjacent to the second cell. The second doped region is coupled to a second source. At least one third doped region is between the first cell and the second cell, wherein the third doped region is floating.

16 Claims, 37 Drawing Sheets

U.S. PATENT DOCUMENTS

| | | |
|---|---|---|
| 7,072,215 B2 | 7/2006 | Chih |
| 7,099,192 B2 | 8/2006 | Want et al. |
| 7,190,623 B2 | 3/2007 | Hsu et al. |
| 7,291,882 B2 | 11/2007 | Yang et al. |
| 7,345,920 B2 * | 3/2008 | Yeh .................. 365/185.21 |
| 7,394,703 B2 | 7/2008 | Ogura et al. |
| 7,411,836 B2 | 8/2008 | Kuo et al. |
| 7,583,530 B2 | 9/2009 | Thomas |
| 7,663,916 B2 | 2/2010 | Chih et al. |
| 7,864,594 B2 | 1/2011 | Tsai et al. |
| 7,876,610 B2 | 1/2011 | Gomikawa |
| 7,974,127 B2 | 7/2011 | Chong et al. |
| 2005/0145927 A1 * | 7/2005 | Hsu et al. ............... 257/321 |
| 2005/0226054 A1 * | 10/2005 | Yeh et al. ............ 365/185.28 |
| 2007/0120171 A1 * | 5/2007 | He et al. ................. 257/315 |
| 2009/0116286 A1 | 5/2009 | Chong et al. |
| 2009/0116287 A1 | 5/2009 | Ou et al. |

FOREIGN PATENT DOCUMENTS

| | | |
|---|---|---|
| TW | 200423146 | 11/2004 |
| TW | 200713289 | 4/2007 |

OTHER PUBLICATIONS

Non-Final Office Action for U.S. Appl. No. 12/264,886, mailed on Nov. 3, 2010, 8 pages.

Office Action of Chinese Application No. 200810170463.7, dated Sep. 6, 2010, 4 pages total (English translation not included).

Requirement for Restriction/Election for U.S. Appl. No. 12/264,886, mailed on Sep. 7, 2010, 6 pages.

Requirement for Restriction/Election for U.S. Appl. No. 12/264,886 mailed on Sep. 7, 2010, 6 pages.

Office Action for U.S. Appl. No. 12/264,886, mailed on Sep. 6, 2010, 9 pages.

* cited by examiner

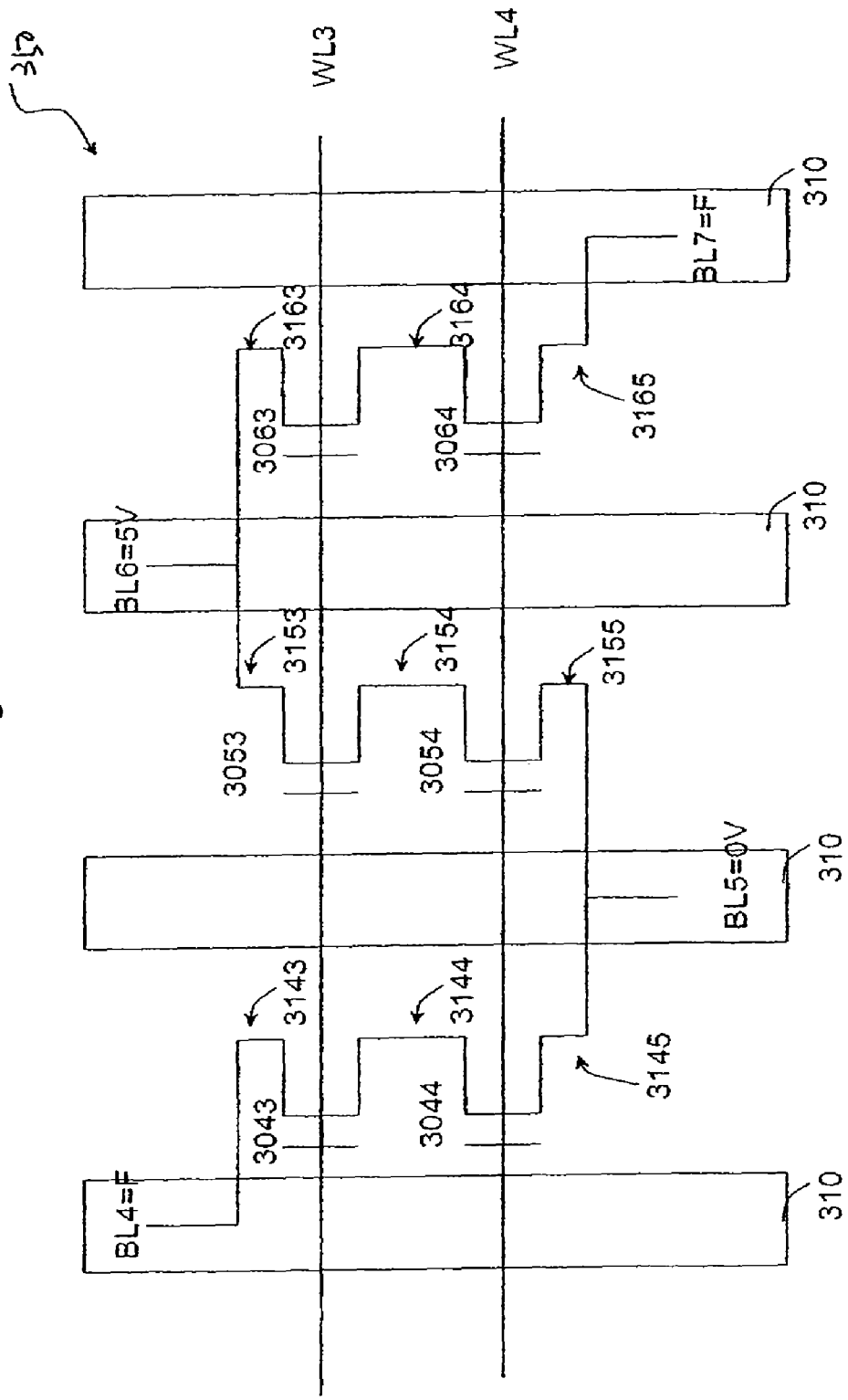

-FN Erase to High Vt

FIG. 5C

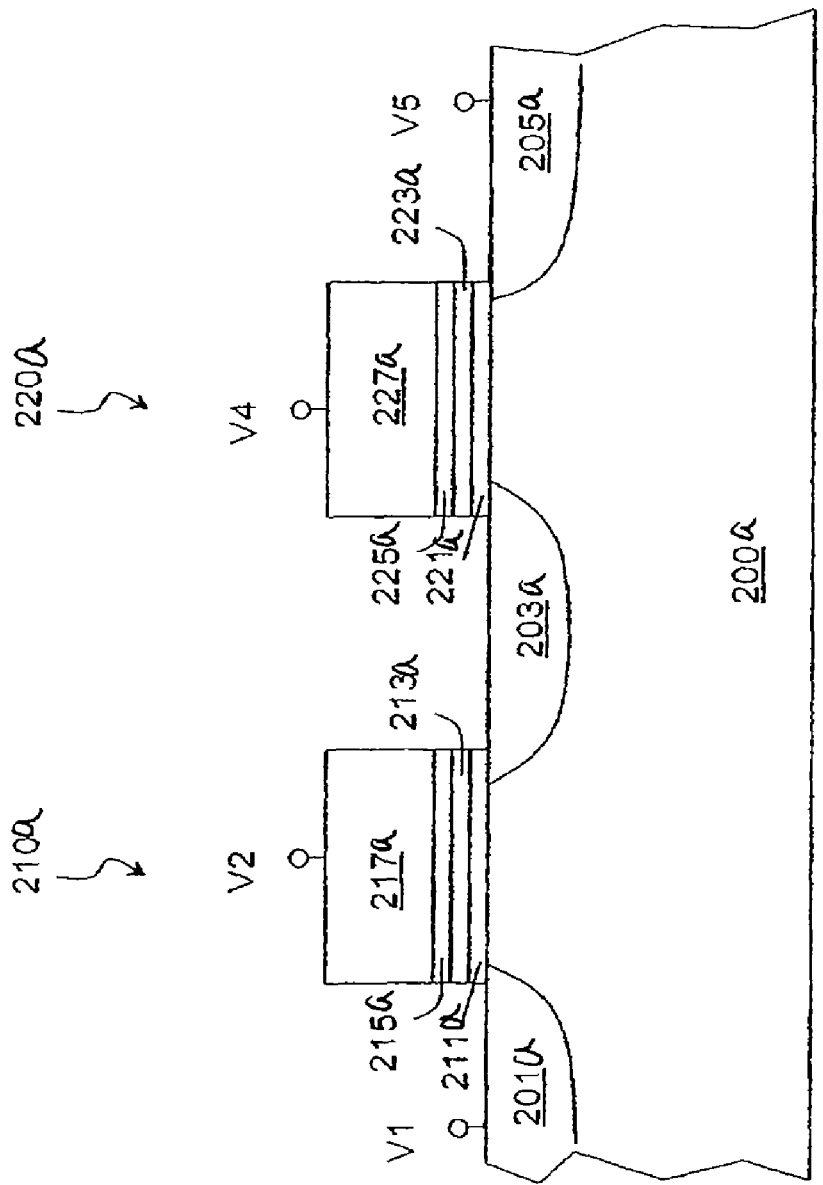

OPERATION METHODS FOR MEMORY CELL AND ARRAY THEREOF IMMUNE TO PUNCHTHROUGH LEAKAGE

CROSS-REFERENCES TO RELATED APPLICATIONS

This application claims benefit of priority to U.S. Provisional Application 60/985,966, filed Nov. 6, 2007, U.S. Provisional Application 60/986,960 filed Nov. 9, 2007, U.S. Provisional Application 60/986,198, filed Nov. 7, 2007, and U.S. Provisional Application 60/986,479, filed Nov. 8, 2007, commonly assigned, which are incorporated in their entirety by reference for all purpose. This application is also related to concurrently filed U.S. patent application Ser. No. 12/264,886, commonly assigned and incorporated by reference herein for all purposes.

BACKGROUND OF THE INVENTION

This application relates to semiconductor structures and methods for forming and operating the semiconductor structures and more particularly to Flash cell structures, array structures and methods for operating the Flash array structures.

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

FIG. 1 is a cross-sectional view of a traditional EEPROM cell structure. In FIG. 1, select transistor 110 is adjacent to memory cell 120 to constitute a cell unit. Select transistor 110 has source 101 and common source 103 formed within substrate 100. Gate oxide layer 111 and select gate 113 are formed over substrate 100. Memory cell 120 has common source 103 and drain 105. Tunneling oxide layer 121, floating gate 122, oxide layer 123/nitride layer 124/oxide layer 125 (ONO), and gate 126 are sequentially formed over substrate 100. Select transistor 110 is configured to control the operations of memory cell 120.

In a traditional channel hot electron programming method, select transistor 110 is turned on. Source 101 is ground. Drain 105 is coupled to a 4-5V power. 8-10V is applied to gate 126, such that hot electrons are injected into floating gate 122.

In a traditional source-side FN erasing method, select transistor 110 is turned on. Source 101 is coupled to a 5V power. Drain 105 is floating. −10V is applied to gate 126, such that electrons are pulled into common source 103 from floating gate 122.

In a traditional channel FN erasing method, source 101 is floating. Substrate 100 is coupled to a 6-8V power. Drain 105 is floating. −8V is applied to gate 126, such that electrons are pulled into substrate 100 from floating gate 122.

In a traditional read method, select transistor 110 is turned on. Source 101 is ground. Drain 105 is coupled to a 0.6V power. 5V is applied to gate 126 so as to determine the state of memory cell 120.

In a traditional memory cell having a so-called SONOS (silicon-oxide-nitride-oxide-silicon) structure, the nitride layer serves as a charge storage layer (not shown). In a traditional channel hot electron programming method for SONOS cell, a select transistor is turned on. A source is ground. A drain is coupled to a 5V power. 10V is applied to a gate of the SONOS memory cell, such that hot electrons are injected into the charge storage layer.

In a traditional band-to-band erase method for SONOS cell, a select transistor is turned off. A source is floating. A substrate is grounded. A drain is coupled to a 5V power. −10V is applied to a gate of the SONOS memory cell, such that hot holes are injected into the charge storage layer and combine with trapped electrons.

In a traditional read method for SONOS cell, a select transistor is turned on. A source is grounded. The drain is coupled to a 0.6V power. 5V is applied to a gate of the SONOS memory cell so as to determine the state of the SONOS memory cell.

BRIEF SUMMARY OF THE INVENTION

According to an exemplary embodiment of the present invention, an integrated circuit includes a memory cell structure. The memory cell structure includes a first cell and a second cell. The first cell includes a first storage structure and a first gate over a substrate, the first gate being over the first storage structure. The second cell includes a second storage structure and a second gate over the substrate, the second gate being over the second storage structure, the first gate being separated from the second gate. A first doped region is adjacent to the first cell and is coupled to a first source. A second doped region is configured within the substrate and adjacent to the second cell. The second doped region is coupled to a second source. At least one third doped region is between the first cell and the second cell. The third doped region is floating.

According to another exemplary embodiment of the present invention, an integrated circuit includes a memory array. The memory array includes a plurality of series of cells. Each of the plurality of series of cells is disposed between a first isolation region and a second isolation region. Each of the plurality of series of cells includes a plurality of cell pairs. Each of the cell pairs includes a first cell including a first storage structure and a first gate over a substrate. The first gate is over the first storage structure. A second cell includes a second storage structure and a second gate over the substrate. The second gate is over the second storage structure. The first gate is separated from the second gate. A first doped region is adjacent to the first cell. A second doped region is adjacent to the second cell. At least one third doped region is between the first cell and the second cell and the third doped region is floating. A first bit line is coupled with the first doped region. The first bit line is shared with another series of cells next to one of the first and the second isolation regions. A second bit line is coupled with the second doped region. The second bit line is shared with another series of cells next to the other one of the first and the second isolation regions.

According to an exemplary embodiment of the present invention, an integrated circuit includes a memory array. The memory array includes a plurality of series of cells. Each of the plurality of series of cells is disposed between a first isolation region and a second isolation region. Each of the plurality of series of cells includes a plurality of cell pairs. Each of the cell pairs includes a first cell including a first storage structure and a first gate over a substrate. The first gate is over the first storage structure. A second cell includes a second storage structure and a second gate over the substrate. The second gate is over the second storage structure. The first gate is separated from the second gate. A first doped region is adjacent to the first cell, a second doped region is adjacent to the second cell; and at least one third doped region is between the first cell and the second cell. The third doped region is floating. A first bit line is coupled with the first doped region. A second bit line is coupled with the second doped region, wherein the first and second bit lines are not shared with other series of cells.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 2I is a schematic drawing showing an exemplary method for reading one of two exemplary memory cells;

FIG. 3B is a schematic drawing showing an exemplary process for programming a cell of area 350 shown in FIG. 3A;

FIG. 5C is a schematic drawing showing an exemplary method for erasing at least one of the two exemplary memory cells;

FIG. 5F is a schematic drawing showing an exemplary biasing of two unselected exemplary memory cells;

FIG. 5G is a schematic drawing showing an exemplary method for reading one of two exemplary memory cells;

Figure 1:
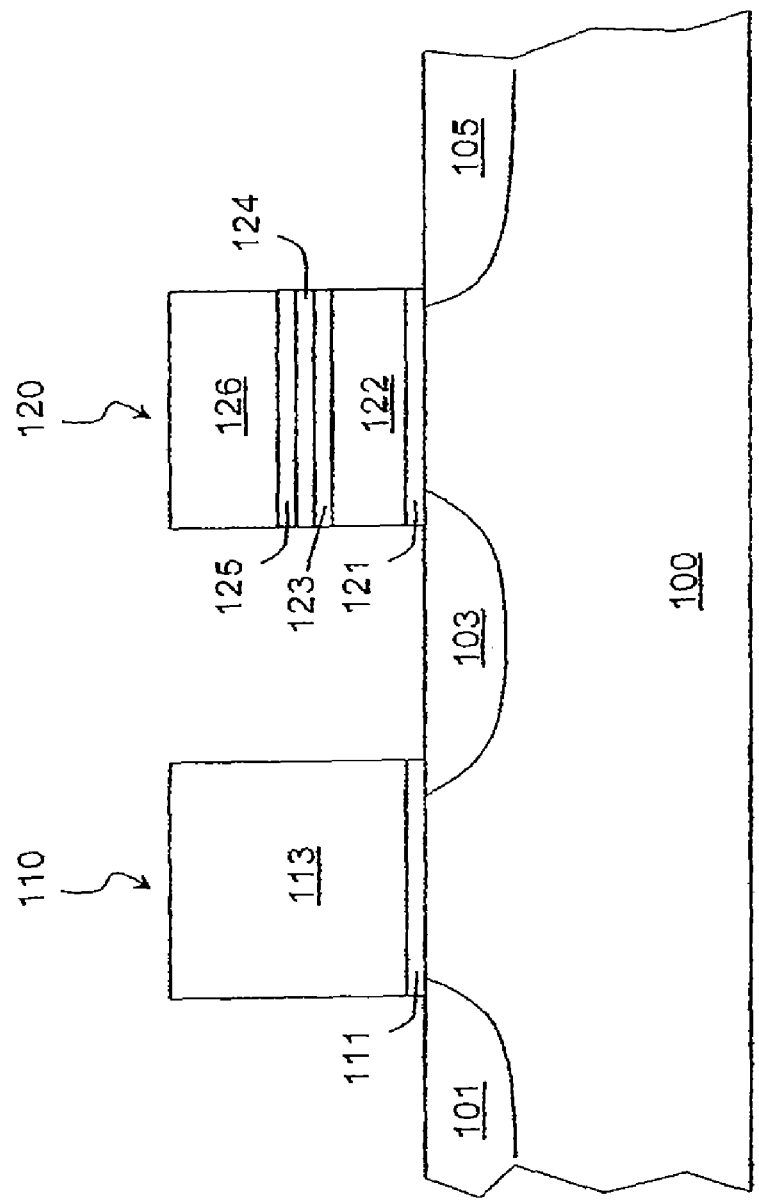
FIG. 1 is a cross-sectional view of a traditional EEPROM cell structure.

It is to be noted that the appended drawings illustrate merely some exemplary embodiments and are therefore not to be considered limiting of its scope, for the invention may admit to other equally effective embodiments.

DETAILED DESCRIPTION OF THE INVENTION

Reference will now be made in detail to the presently exemplary embodiments which are illustrated in the accompanying drawings. The same or similar reference numbers are used in the drawings and the description to refer to the same or like parts. It should be noted that the non-graph drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation.

Memory cells and array structures in accordance with the present invention can overcome some operational issues. The cell and array structures include two neighboring cells. While operating one the cells, the other one is configured to serve as a select transistor. The two cells are coupled to a common floating doped region. With the common floating doped region, the length between the drain side of the one of the two cells to the source side of the other one of the two cells is increased. With the enhanced channel length, punchthrough occurred by operations such as programming and reading one of the cells can be desirably avoided.

Figure 2A:
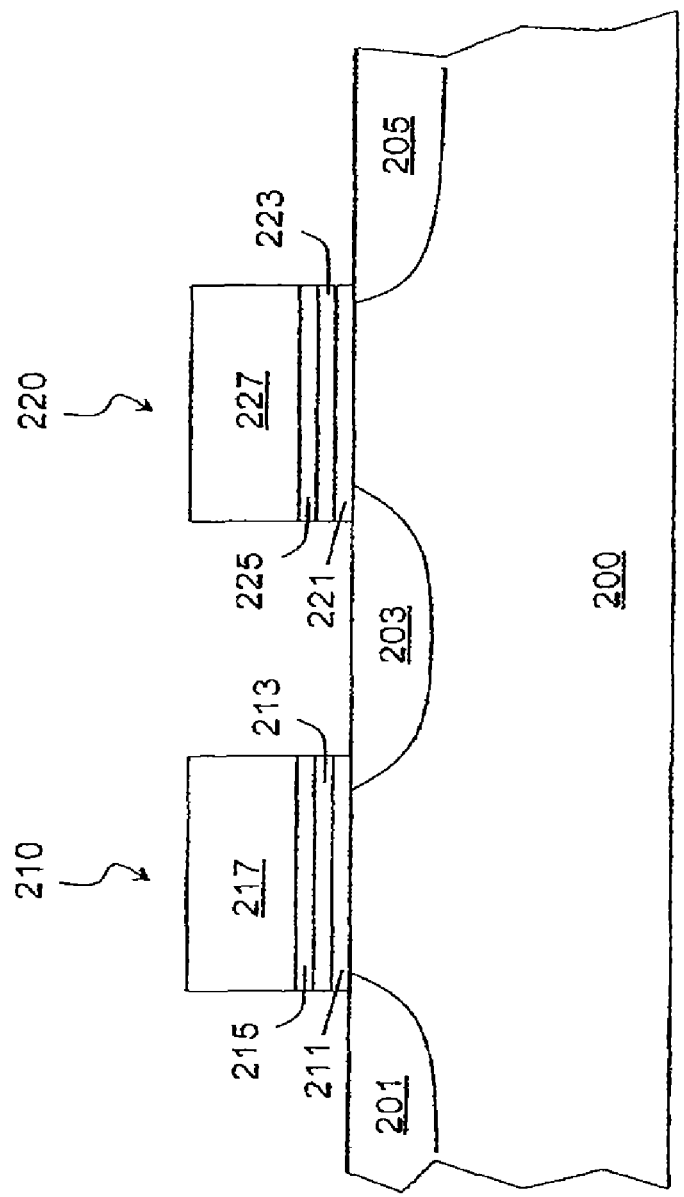
FIG. 2A is a schematic cross-sectional view of two exemplary Flash memory cells.

FIG. 2A is a schematic cross-sectional view of two exemplary Flash memory cells. According to FIG. 2A, doped regions 201, 203, and 205 are within a substrate 200. Substrate 200 can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. Doped regions 201, 203, and 205 can be n-type or p-type doped regions. For n-type doped regions, doped regions 201, 203, and 205 may include dopants such as arsenic, phosphorus and/or other group V element. For p-type doped regions, doped regions 201, 203, and 205 may include dopants such as boron and/or other group III element. In some embodiments, doped regions 201, 203, and 205 can be formed by, for example, an implantation process.

Referring again to FIG. 2A, memory cells 210, and 220 are over substrate 200. Memory cell 210 can include tunneling barrier 211, charge storage layer 213, dielectric layer 215, and conductive layer 217. Memory cell 220 can include tunneling barrier 221, charge storage layer 223, dielectric layer 225, and conductive layer 227. Tunneling barriers 211 and 221, charge storage layers 213 and 223, dielectric layers 215 and 225, and conductive layers 217 and 227 are over substrate 200. In some embodiments, tunneling barriers 211 and 221 can be oxide barriers and/or formed by the same process. Charge storage layers 213 and 223 can be nitride layers and/or formed by the same process. Charge storage layers 213 and 223 can be configured to store charges such as electrons and/or holes. Dielectric layers 215 and 225 can be oxide layers and/or formed by the same process. Conductive layers 217 and 227 can be, for example, polysilicon layers, amorphous silicon layers, metal-containing layers, tungsten silicide layers, copper layers, aluminum layers or other conductive material layers. In some embodiments, conductive layers 217 and 227 can be formed by the same process. In some embodiments, tunneling barriers 211 and 221, charge storage layers 213 and 223, dielectric layers 215 and 225, and conductive layers 217 and 227 can be formed by chemical vapor deposition (CVD) processes, ultra high vacuum chemical vapor deposition (UHVCVD) processes, atomic layer chemical vapor deposition (ALCVD) processes, metal organic chemical vapor deposition (MOCVD) processes or other CVD processes.

Figure 2B:
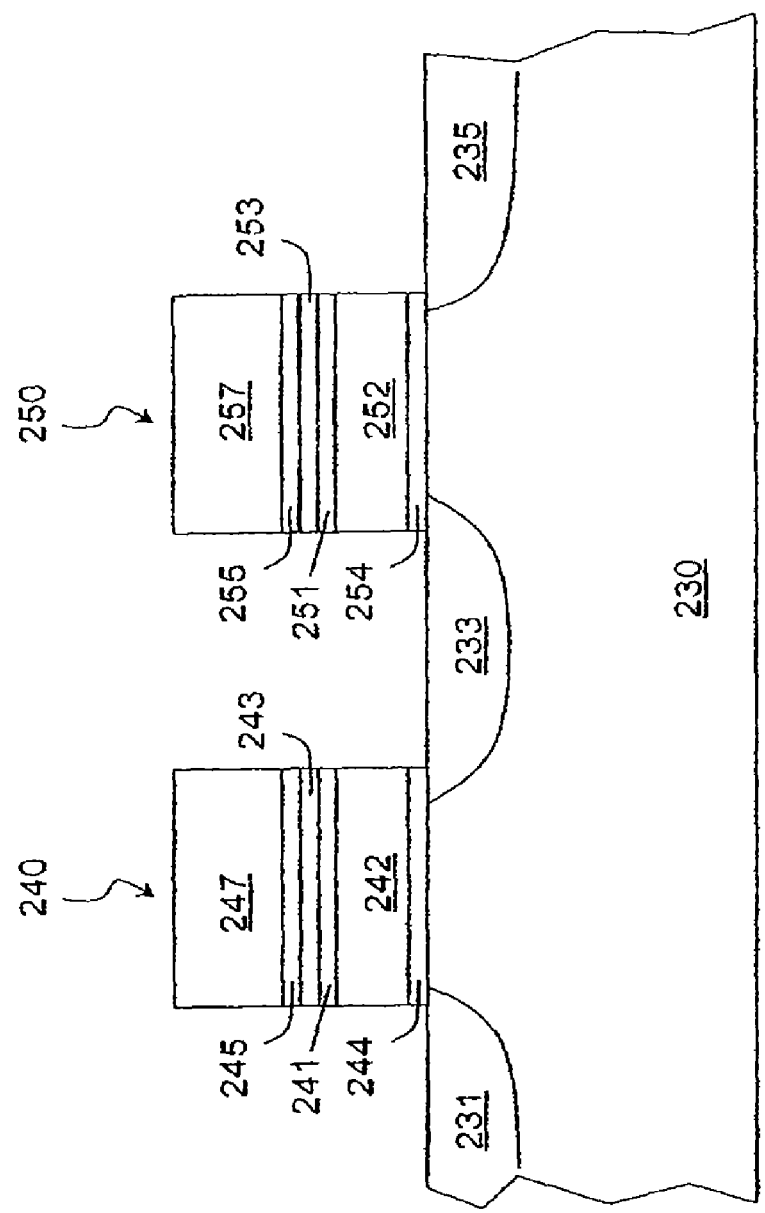
FIG. 2B is a schematic cross-sectional view of two exemplary Flash memory cells.

FIG. 2B is a schematic cross-sectional view of two exemplary Flash memory cells. Memory cells 240 and 250 are over substrate 230. Memory cell 240 can include barrier layer 244, floating gate 242, dielectric layers 241, 243, and 245, and conductive layer 247. Memory cell 250 can include barrier layer 254, floating gate 252, dielectric layers 251, 253, and 255, and conductive layer 257. In FIG. 2B, substrate 230 is similar to substrate 200 described above in conjunction with FIG. 2A. Doped regions 231, 233, and 235 are similar to doped regions 201, 203, and 205 respectively, described above in conjunction with FIG. 2A. Dielectric layers 241, 243, 245, 251, 253, and 255 are dielectric layers. In some embodiments, dielectric layers 241, 243, and 245 are oxide/nitride/oxide (ONO). In some embodiments, dielectric layers 251, 253, and 255 are oxide/nitride/oxide (ONO). In some embodiments, conductive layers 247 and 257 can be similar to the conductive layers 217 and 227. Tunneling layers 244 and 254 are over substrate 230. In some embodiments, tunneling layers 244 and 254 can be oxide layers. Floating gates 242 and 252 can be, for example, silicon layers such as polysilicon layers. Floating gates 242 and 252 are configured to store charges such as electrons and/or holes. In some embodiments, tunneling layers 244 and 254, floating gates 242 and 252, dielectric layers 241, 243, 245, 251, 253, and 255 and conductive layers 247 and 257 can be formed by chemical vapor deposition (CVD) processes, ultra high vacuum chemical vapor deposition (UHVCVD) processes, atomic layer chemical vapor deposition (ALCVD) processes, metal organic chemical vapor deposition (MOCVD) processes or other CVD processes.

Figure 2C:
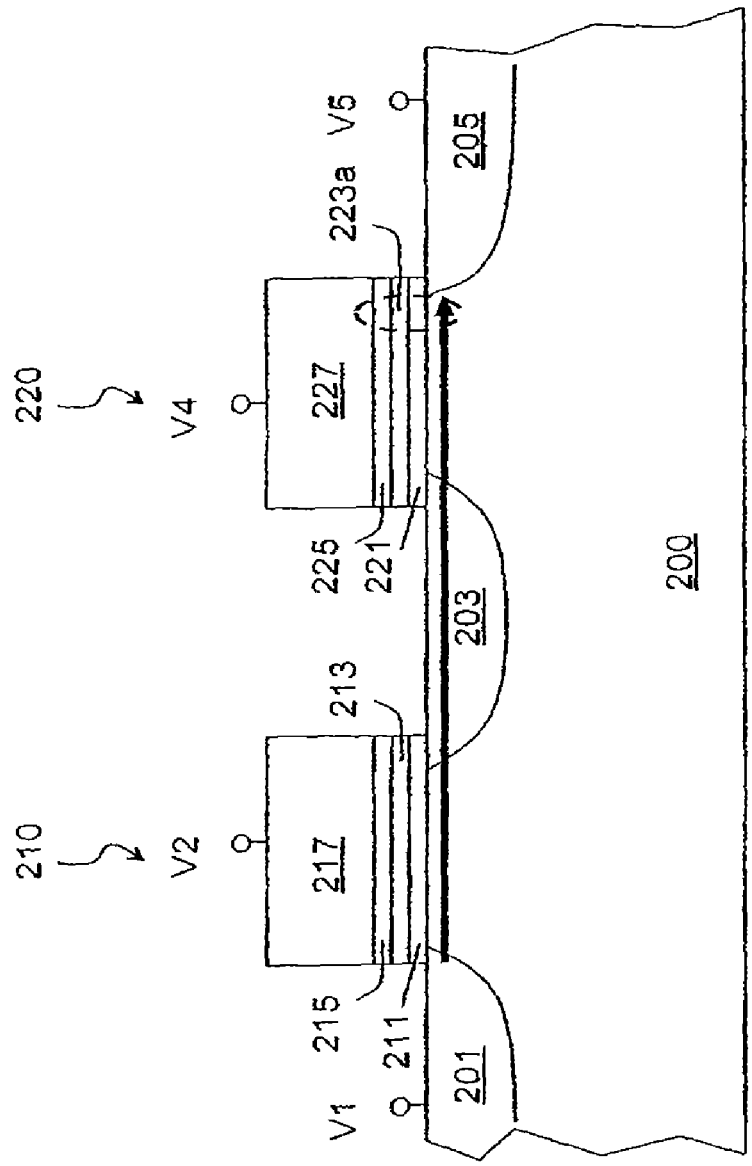
FIG. 2C is a schematic drawing showing an exemplary method for programming one of the two exemplary memory cells.

FIG. 2C is a schematic drawing showing an exemplary method for programming one of the two exemplary memory cells. Referring to FIG. 2C, voltage V1 can be applied to doped region 201, voltage V2 can be applied to gate 217 of cell 210, doped region 203 can be floating, voltage V4 can be applied to gate 227 of cell 220, and voltage V5 can be applied to doped region 205. In some embodiments, substrate 200 can be grounded. In some embodiments programming cell 220, voltage V5 can be higher than voltage V1. Voltage V2 can be higher than a predetermined threshold voltage of cell 210, such that voltage V2 can turn on cell 210. Voltage V4 can be a programming voltage. In this configuration, voltage V2 can turn on cell 210. Charges such as electrons can flow from doped region 201 to doped region 205 through floating doped region 203. Due to the applying of voltage V4 at cell 220, charges will be injected and trapped at right side region 223a of charge storage layer 223. In some embodiments, the predetermined threshold voltage of cell 210 can be a voltage representing a "0" state of cell 210. In some embodiments, the predetermined threshold voltage of cell 210 can be a voltage for turning on programmed cell 210. For example, voltage V1 can be substantially grounded, voltage V2 can be about 12V, doped region 203 can be floating, voltage V4 can be about 10 V, and voltage V5 can be about 5V. It is noted that the scope of the present invention is not limited to the specific voltages described above. One of ordinary skill in the art can modify the voltages to achieve a desired programming process for either cell 210 or cell 220.

In some embodiments, the programming process described above in conjunction with FIG. 2C can be repeated one or more times so as to form a multi-state to cells 210 and/or 220. In other embodiments, cell 220 can be programmed once with some voltages higher than voltages V4 and/or V5, such that the threshold voltage of the programmed cell 220 meets one level of several target voltages. Accordingly, cells 210 and/or 220 can be used for multi-level cells.

Figure 2D:
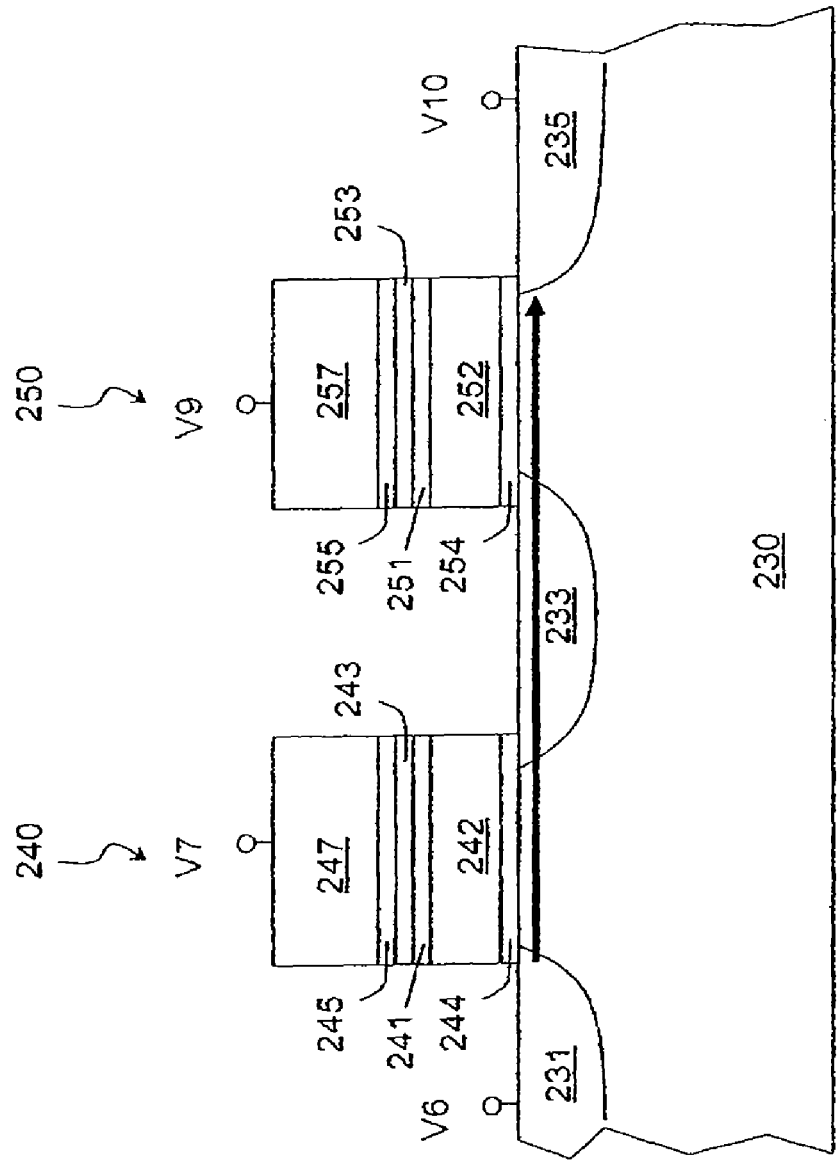
FIG. 2D is a schematic drawing showing an exemplary method for programming one of the two exemplary memory cells.

FIG. 2D is a schematic drawing showing an exemplary method for programming one of the two exemplary memory cells. Referring to FIG. 2D, voltage V6 can be applied to doped region 231, voltage V7 can be applied to gate 247 of cell 240, doped region 233 can be floating, voltage V9 can be applied to gate 257 of cell 250, and voltage V10 can be applied to doped region 235. In some embodiments, substrate 230 can be grounded. In some embodiments programming cell 250, voltage V10 can be higher than voltage V6. Voltage V7 can be higher than a predetermined threshold voltage of cell 240, such that voltage V7 can turn on cell 240. Voltage V9 can be a programming voltage. In this configuration, voltage V7 can turn on cell 240. Charges such as electrons can flow from doped region 231 to doped region 235 through floating doped region 233. Due to the applying of voltage V9 at cell 250, charges will be injected and trapped at floating gate 252. In some embodiments, the predetermined threshold voltage of cell 240 can be a voltage representing a "0" state of cell 240. In some embodiments, the predetermined threshold voltage of cell 240 can be a voltage for turning on programmed cell 240. For example, voltage V6 can be substantially grounded, voltage V7 can be about 12V, doped region 233 can be floating, voltage V9 can be about 10V, and voltage V10 can be about 5V. It is noted that the scope of the present invention is not limited to the specific voltages described above. One of ordinary skill in the art can modify the voltages to achieve a desired programming process for either cell 240 or cell 250.

In some embodiments, the programming process described above in conjunction with FIG. 2D can be repeated one or more times so as to form a multi-state to cells 240 and/or 250. In other embodiments, cell 250 can be programmed once with some voltages higher than voltages V9 and/or V10, such that the threshold voltage of the programmed cell 250 meets one level of several target voltages. Accordingly, cells 240 and/or 250 can be used for multi-level cells.

Figure 2E:
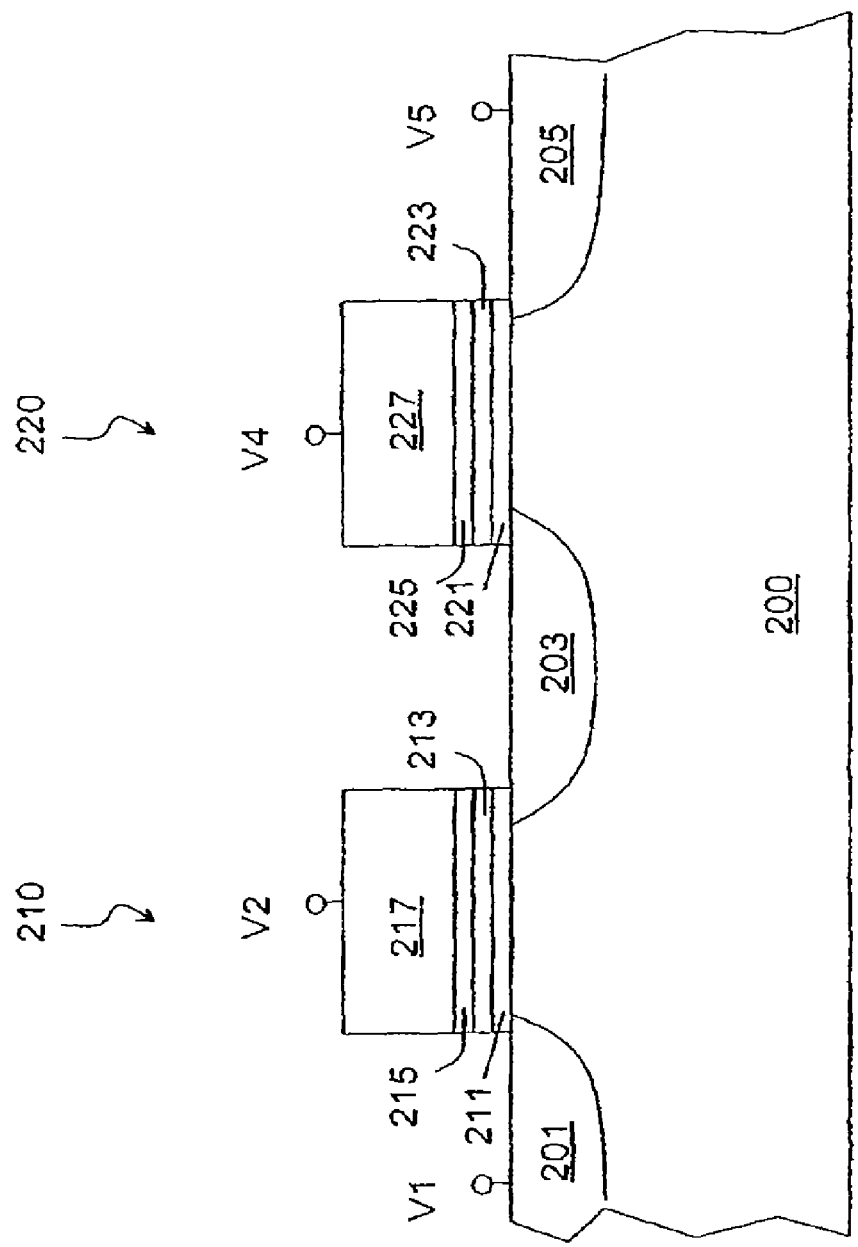
FIG. 2E is a schematic drawing showing an exemplary biasing of two unselected exemplary memory cells.

FIG. 2E is a schematic drawing showing an exemplary method for biasing two unselected exemplary memory cells. In some embodiments, cells 210, and 220 can be unselected cells. To prevent undesirably programming disturbances and further suppress the punchthrough current between doped region 201 and doped region 205, voltages V2 and V4 can be substantially grounded and/or a negative bias. In some embodiments, the negative bias applied to voltages V2 and/or V4 may desirably prevent programming disturb and punchthrough current. In some embodiments, voltage V1 may be substantially grounded, doped region 203 may be floating, and/or voltage V5 may be about 5V. With floating doped region 203, the length between doped regions 201 and 205 is longer than the length between doped regions 203, and 205. The punch through effect between doped regions 201 and 205 can be desirably reduced. It is noted that the scope of the present invention is not limited to the specific voltages described above. One of ordinary skill in the art can modify the voltages to desirably prevent programming disturb to cells 210 and/or cell 220.

Figure 2F:
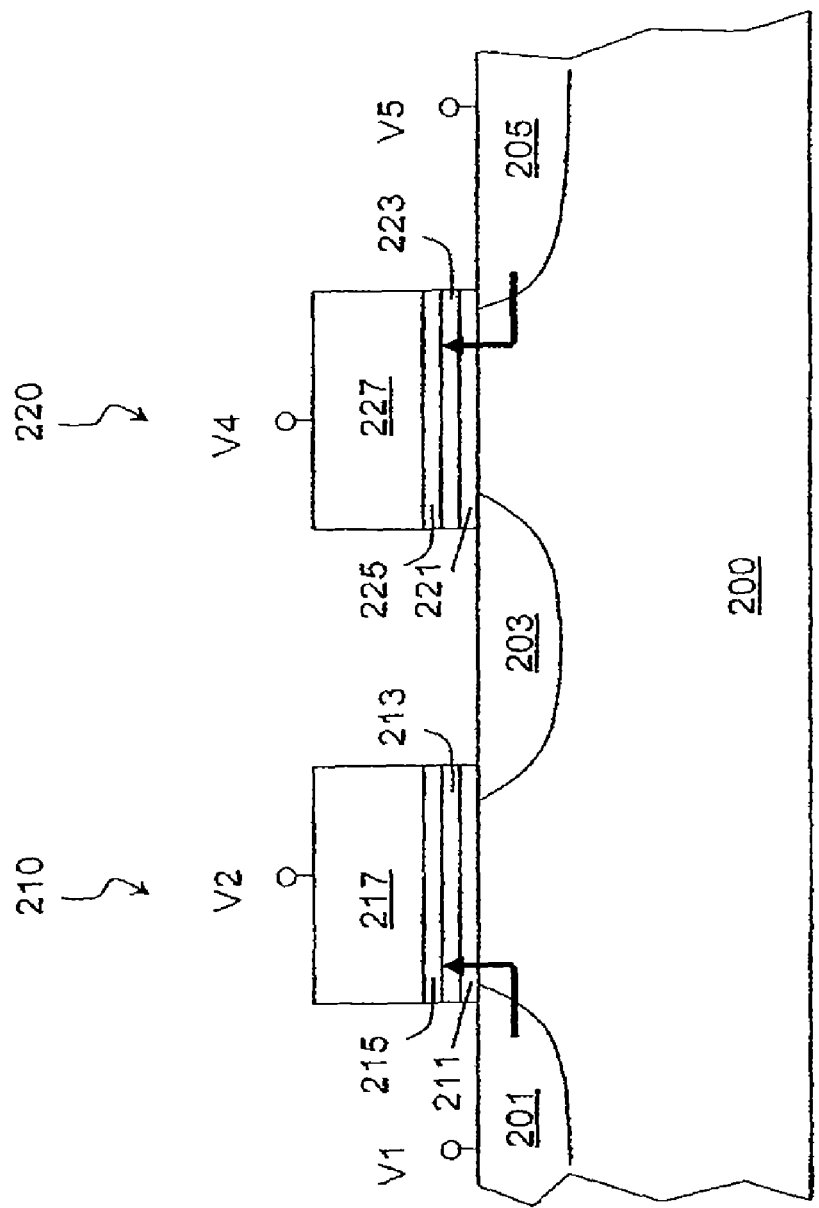
FIG. 2F is a schematic drawing showing an exemplary method for erasing at least one of two exemplary memory cells.

FIG. 2F is a schematic drawing showing an exemplary method for erasing at least one of two exemplary memory cells. In some embodiments, cells 210 and/or 220 can be programmed and have charges, e.g., electrons, trapped in charge storage layers 213, and 223, respectively. In some embodiments erasing the stored charges in programmed cells 210 and/or 220, substrate 200 may be substantially grounded, voltage V1 can be about 5V, voltage V2 can be −10V, doped region 203 can be floating, voltage V4 can be −10V, and voltage V5 can be 5V. Due to the voltage drop between voltages V1 and V2, hot holes can be injected into charge storage layer 213 to combine with trapped electrons, such that cell 210 can be erased. Due to the voltage drop between voltages V4 and V5, hot holes can be injected into charge storage layer 223 to combine with trapped electrons, such that cell 220 can be erased. The threshold voltage of cell 210 is, therefore, reduced. In some embodiments, this erasing method can be referred to as a band-to-band tunneling induced hot hole erasing method. It is noted that the scope of the present invention is not limited to the specific voltages described above. One of ordinary skill in the art can modify the voltages to desirably erase cells 210 and/or 220.

Figure 2G:
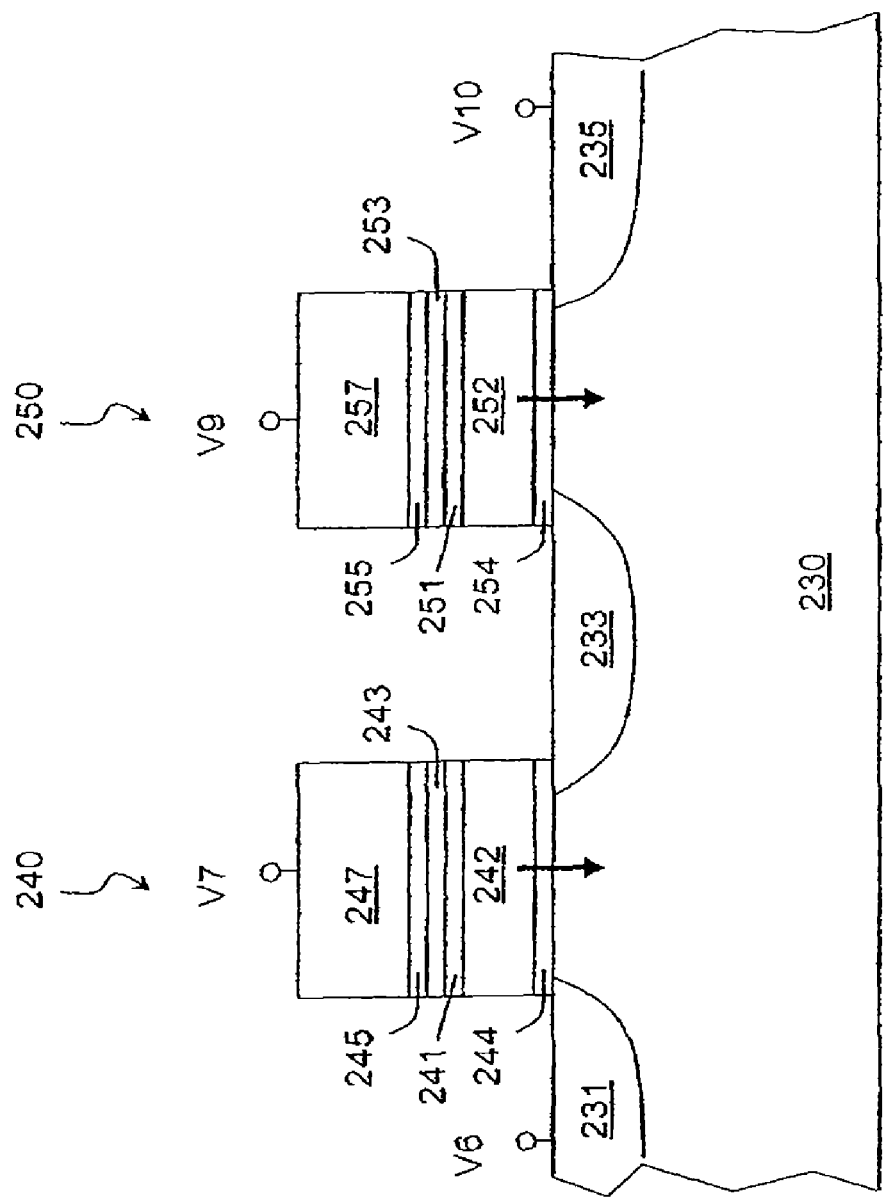
FIG. 2G is a schematic drawing showing an exemplary method for erasing at least one of two exemplary memory cells.

FIG. 2G is a schematic drawing showing an exemplary method for erasing at least one of two exemplary memory cells. In some embodiments, cells 240 and/or 250 can be programmed and have charges, e.g., electrons, trapped in floating gates 242 and 252, respectively. In some embodiments erasing the stored charges in programmed cells 240 and/or 250, substrate 230 may be substantially grounded, voltage V6 can be floating, voltage V7 can be −20V, doped region 233 can be floating, voltage V9 can be −20V, and voltage V10 can be floating. Due to the voltage drop between voltages V7, V9 and voltage of substrate 230, electrons can be ejected from floating gates 242 and 252, such that cells 240 and/or 250 can be erased. The threshold voltages of cells 240 and/or 250 are, therefore, reduced. In some embodiments, this erasing method can be referred to as a negative gate Fowler-Nordheim (−FN) erasing method. It is noted that the scope of the present invention is not limited to the specific voltages described above. One of ordinary skill in the art can modify the voltages to desirably erase cells 240 and/or 250.

Figure 2H:
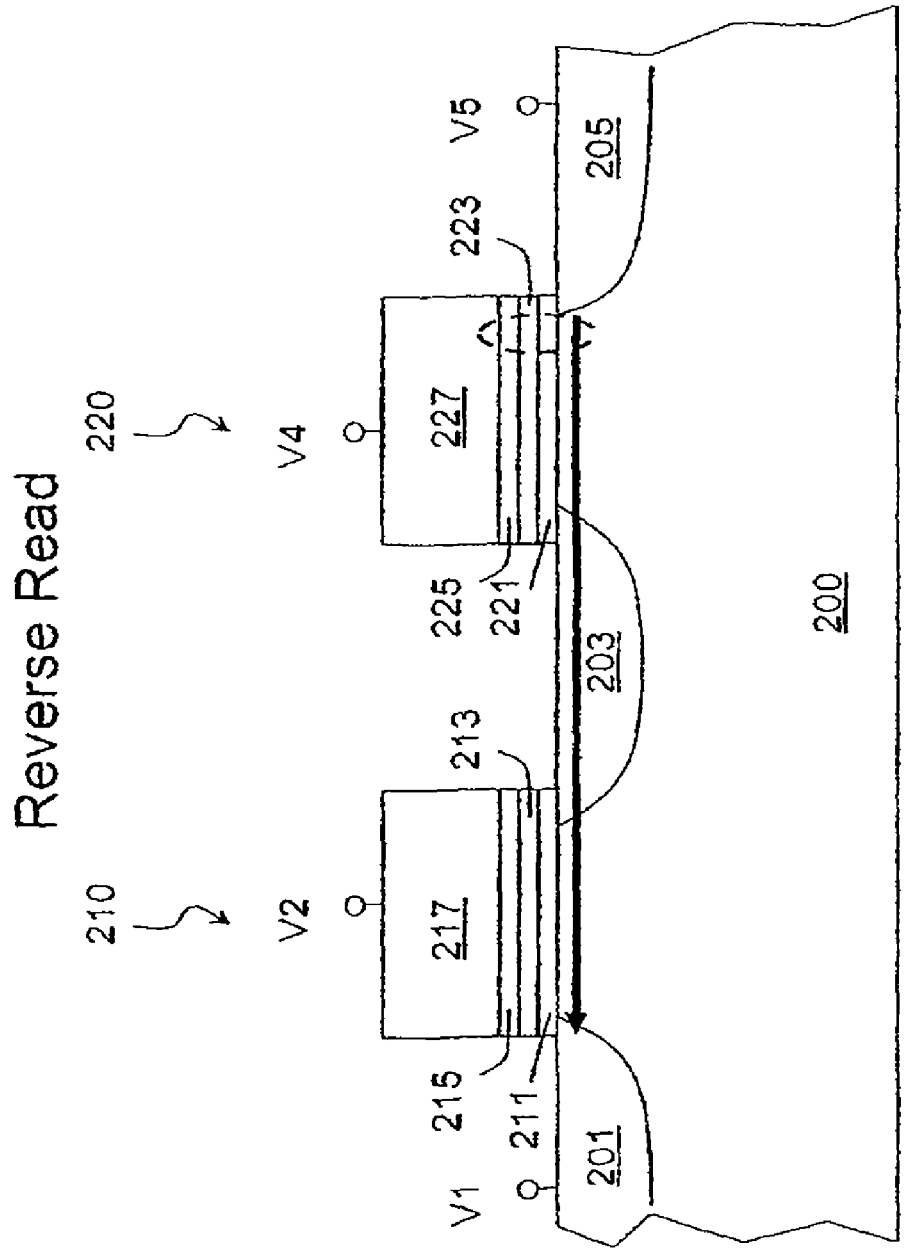
FIG. 2H is a schematic drawing showing an exemplary method for reading one of two exemplary memory cells.
Figure 21:
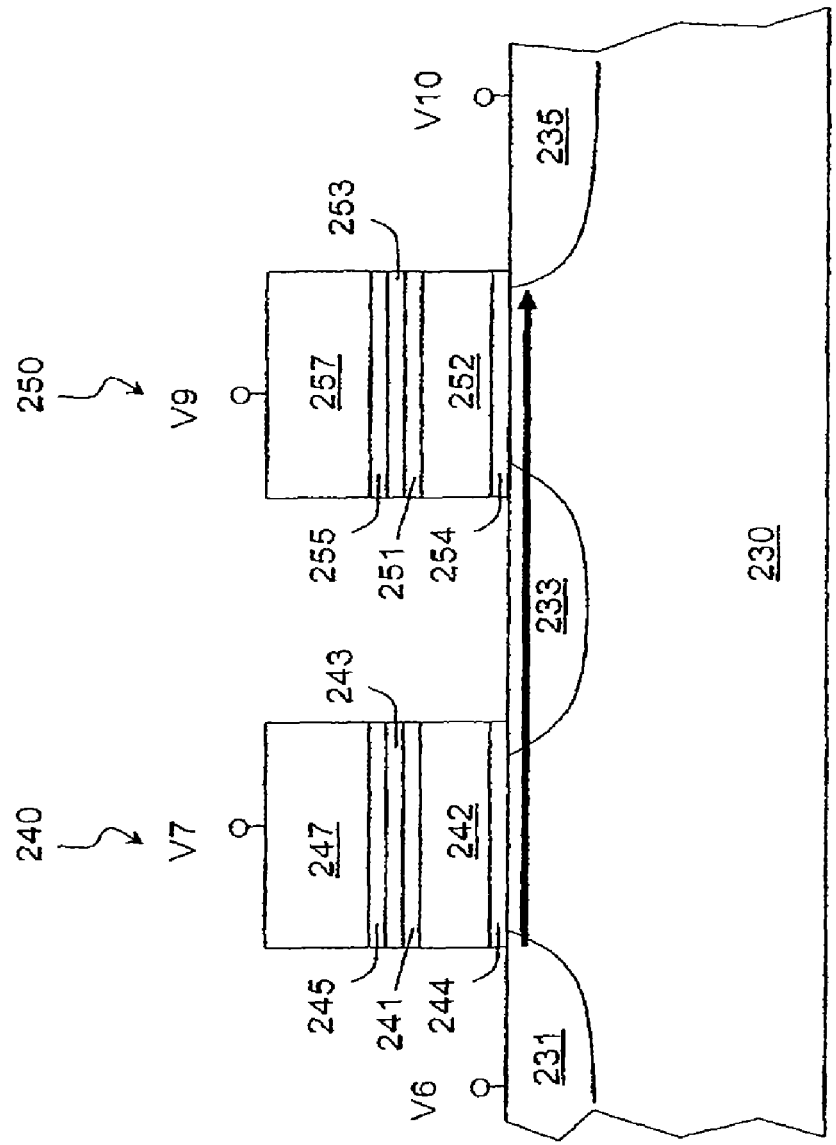

FIG. 2H is a schematic drawing showing an exemplary method for reading one of two exemplary memory cells. In some embodiments reading cell 220, substrate 200 can be substantially grounded, voltage V1 can be higher than voltage V5, voltage V2 can be applied a voltage higher than a predetermined threshold voltage of cell 210, such that voltage V2 can turn on cell 210. Voltage V4 can be a sense voltage. In some embodiments, the sense voltage can be between a "0" state voltage and a "1" state voltage of cell 220. In some embodiments having cell 220 being "1" state, voltage V4 can turn on cell 220. Electrons can flow from doped region 205 to doped region 201 through floating doped region 203. In some embodiments having cell 220 being "0" state, voltage V4 can not turn on cell 220. Electrons thus may not substantially flow from doped region 205 to doped region 201. In some embodiments reading cell 220, voltage V1 can be about 1.6V, voltage V2 can be about 10V, doped region 203 can be floating, voltage V4 can be between a "0" state voltage and a "1" state voltage of cell 220, and voltage V5 can be substantially grounded.

In some embodiments reading cell 210, substrate 200 can be substantially grounded, voltage V5 can be higher than voltage V1, voltage V4 can be applied a voltage higher than a predetermined threshold voltage of cell 220, such that voltage V4 can turn on cell 220. Voltage V2 can be a sense voltage. In some embodiments, the sense voltage can be between a "0" state voltage and a "1" state voltage of cell 210. In some embodiments, this read method can be referred to as a reverse read method. It is noted that the scope of the present invention is not limited to the specific voltages described above. One of ordinary skill in the art can modify the voltages to desirably read cells 210 or 220.

FIG. 2I is a schematic drawing showing an exemplary method for reading one of two exemplary memory cells. In some embodiments reading cell 250, substrate 200 can be substantially grounded, voltage V10 can be higher than voltage V6, voltage V7 can be applied a voltage higher than a predetermined threshold voltage of cell 240, such that voltage V7 can turn on cell 240. Voltage V9 can be a sense voltage. In some embodiments, the sense voltage can be between a "0" state voltage and a "1" state voltage of cell 250. In some embodiments having cell 250 being "1" state, voltage V9 can turn on cell 250. Electrons can flow from doped region 231 to doped region 235 through floating doped region 233. In some embodiments having cell 250 being "0" state, voltage V9 can not turn on cell 250. Electrons thus may not substantially flow from doped region 231 to doped region 235. In some embodiments reading cell 250, voltage V6 can be substantially grounded, voltage V7 can be about 8V, doped region 233 can be floating, voltage V9 can be between a "0" state voltage and a "1" state voltage of cell 250, and voltage V10 can be about 0.6V.

In some embodiments reading cell 240, substrate 200 can be substantially grounded, voltage V6 can be higher than voltage V10, voltage V9 can be applied a voltage higher than a predetermined threshold voltage of cell 250, such that voltage V9 can turn on cell 250. Voltage V7 can be a sense voltage. In some embodiments, the sense voltage can be between a "0" state voltage and a "1" state voltage of cell 240. In some embodiments, this read method can be referred to as a forward read method. It is noted that the scope of the present invention is not limited to the specific voltages described above. One of ordinary skill in the art can modify the voltages to desirably read cells 240 or 250.

Figure 3A:
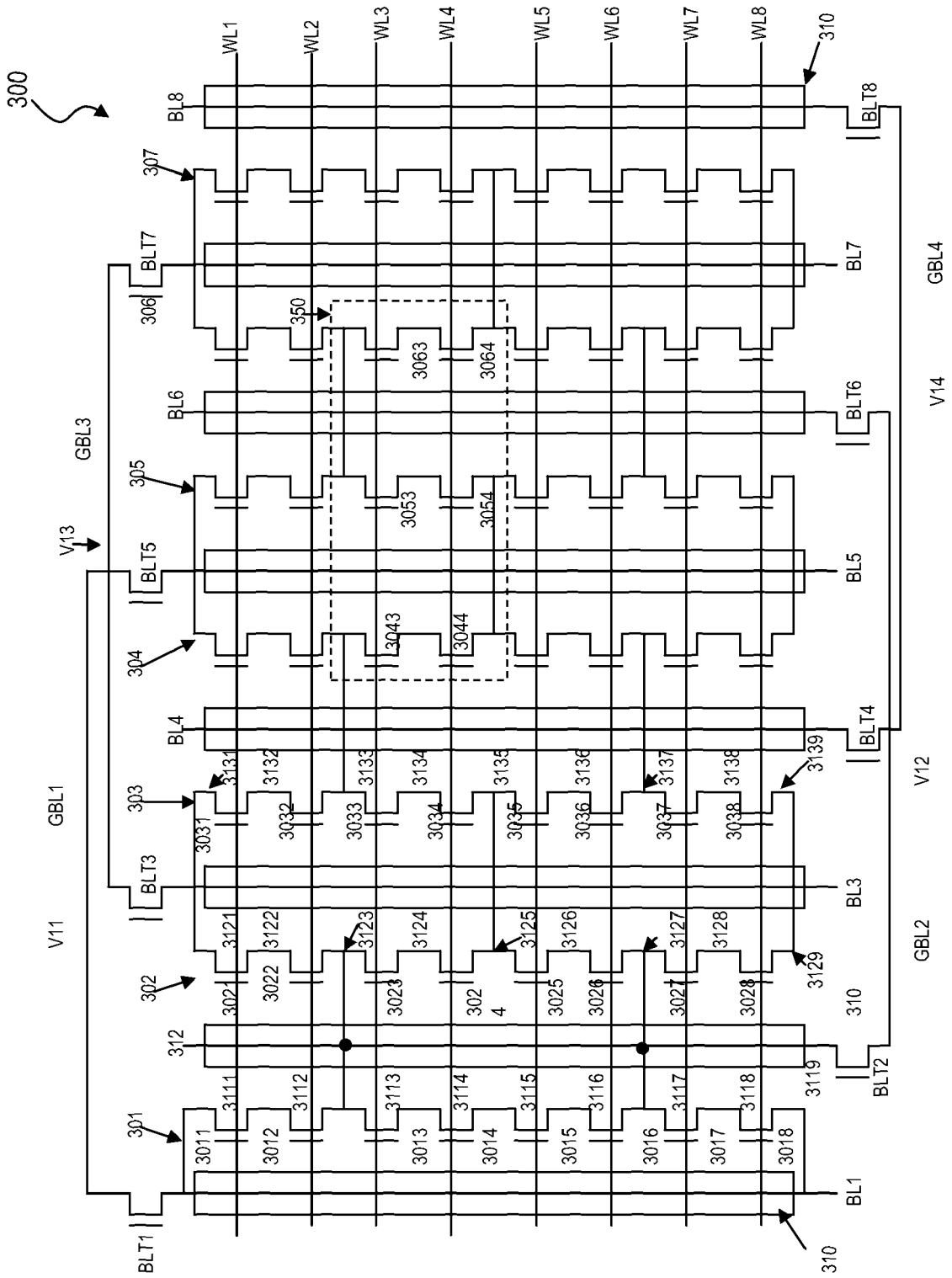
FIG. 3A is a schematic drawing showing a portion of an exemplary array structure.

FIG. 3A is a schematic drawing showing a portion of an exemplary array structure. In some embodiments, a memory array structure comprises a plurality of parallel series of cells and a plurality of bit lines substantially parallel to the plurality of parallel series of cells. In some embodiments, at least one isolation structure 310 is configured between the adjacent parallel series of cells. Each of the plurality of parallel series of cells can be configured between two of the plurality of bit lines. The plurality of parallel series of cells can comprise a $2m^{th}$ series of cells being configured between a $2m-1^{th}$ series of cells and a $2m+1^{th}$ series of cells. The $2m^{th}$ series of cells can comprise $4n+1^{th}$ doped regions coupled to $2m^{th}+1$ bit line that is also coupled to the $4n+1^{th}$ doped regions of the $2m+1^{th}$ series of cells, respectively. The $2m^{th}$ series of cells can comprise $4n+2^{th}$ and $4n+4^{th}$ doped regions which are floating (not coupled to any interconnect). The $2m^{th}$ series of cells can comprise $4n+3^{th}$ doped regions coupled to $2m^{th}$ bit line that is also coupled to the $4n+3^{th}$ doped regions of the $2m-1^{th}$ series of cells, respectively, wherein m and n are integers. First word lines can be coupled to a plurality of the first cells of the plurality of parallel series of the cells. Second word lines can be coupled to a plurality of the second cells of the plurality of series of the cells, and so on. In some embodiments, the cells of array structure 300 can be cells 210, 220, 240, and/or 250 described above in conjunction with FIGS. 2A and 2B.

Referring again to FIG. 3A, in some embodiments, array structure 300, for example, can include parallel series of cells 301-307 and bit lines BL1-BL8. Series of cells 301-303 can include cells 3011-3018, 3021-3028, and 3031-3038, respectively. Series of cells 301-303 can include doped regions 3111-3119, 3121-3129, and 3131-3139, respectively. Word lines WL1-WL8 can be configured substantially perpendicular to bit lines BL1-BL8. Word line WL1 can be coupled to first cells of the parallel series of cells 301-307. Word line WL2 can be coupled to second cells of the parallel series of cells 301-307. For series of cells 302, doped regions 3121, 3125, and 3129 can be coupled to doped regions 3131, 3135, and 3139, respectively. Doped regions 3123 and 3127 can be coupled to doped regions 3113, and 3117, respectively. Doped regions 3122, 3124, 3126, and 3128 can be floating.

In some embodiments, bit lines BL1-BL8 can be coupled to bit line transistors or switches BLT1-BLT8, respectively. In some embodiments, bit lines BL1 and BL5 can be coupled to a global bit line GBL1 that is coupled to a voltage sources V1. Bit lines BL2 and BL6 can be coupled to a global bit line GBL2 that is coupled to a voltage source V12. Bit lines BL3 and BL7 can be coupled to a global bit line GBL3 that is coupled to a voltage source V13. Bit lines BL4 and BL8 can be coupled to a global bit line GBL4 that is coupled to a voltage source V14. In some embodiments, bit line transistors BLT1-BLT8 can be configured to control the applying of voltages V11-V14 to bit lines BL1-BL8.

FIG. 3B is a schematic drawing showing an exemplary process for programming a cell of area 350 shown in FIG. 3A. In some embodiments programming cell 3053, bit line transistors BLT5 and BLT6 (shown in FIG. 3A) can be turned on. Voltage V12 coupled to doped region 3153 can be higher than voltage VII coupled to doped region 3155. In some embodiments, bit lines BL4 and/or BL7 can be floating. A voltage applied to word line WL4 can be higher than a predetermined threshold voltage of cell 3054, such that the voltage of word line WL4 can turn on cell 3054. A voltage applied to word line WL3 can be a programming voltage. In this configuration, the voltage of word line WL4 can turn on cell 3054. Charges such as electrons can flow from doped region 3155 to doped region 3153 through floating doped region 3154. Due to the applying of the voltage of word line WL3 at cell 3053, charges will be injected and trapped at a charge storage layer or a floating gate of cell 3053. In some embodiments, the predetermined threshold voltage of cell 3054 can be a voltage representing a "0" state of cell 3054. In some embodiments, the predetermined threshold voltage of cell 3054 can be a voltage for turning on programmed cell 3054. For example, bit line BL5 can be substantially grounded, the voltage of word line WL3 can be about 10V, doped region 3154 can be floating, the voltage of word line WL4 can be about 12 V, and bit line BL6 can be about 5V. In some embodiments, the programming method can be referred to as a channel hot electron programming methods. It is noted that the scope of the present invention is not limited to the specific voltages described above. One of ordinary skill in the art can modify the voltages to achieve a desired programming process for a cell of array structure 300.

In some embodiments, the programming process described above in conjunction with FIG. 3B can be repeated one or more times so as to form a multi-state to a cell of array structure 300.

Figure 3C:
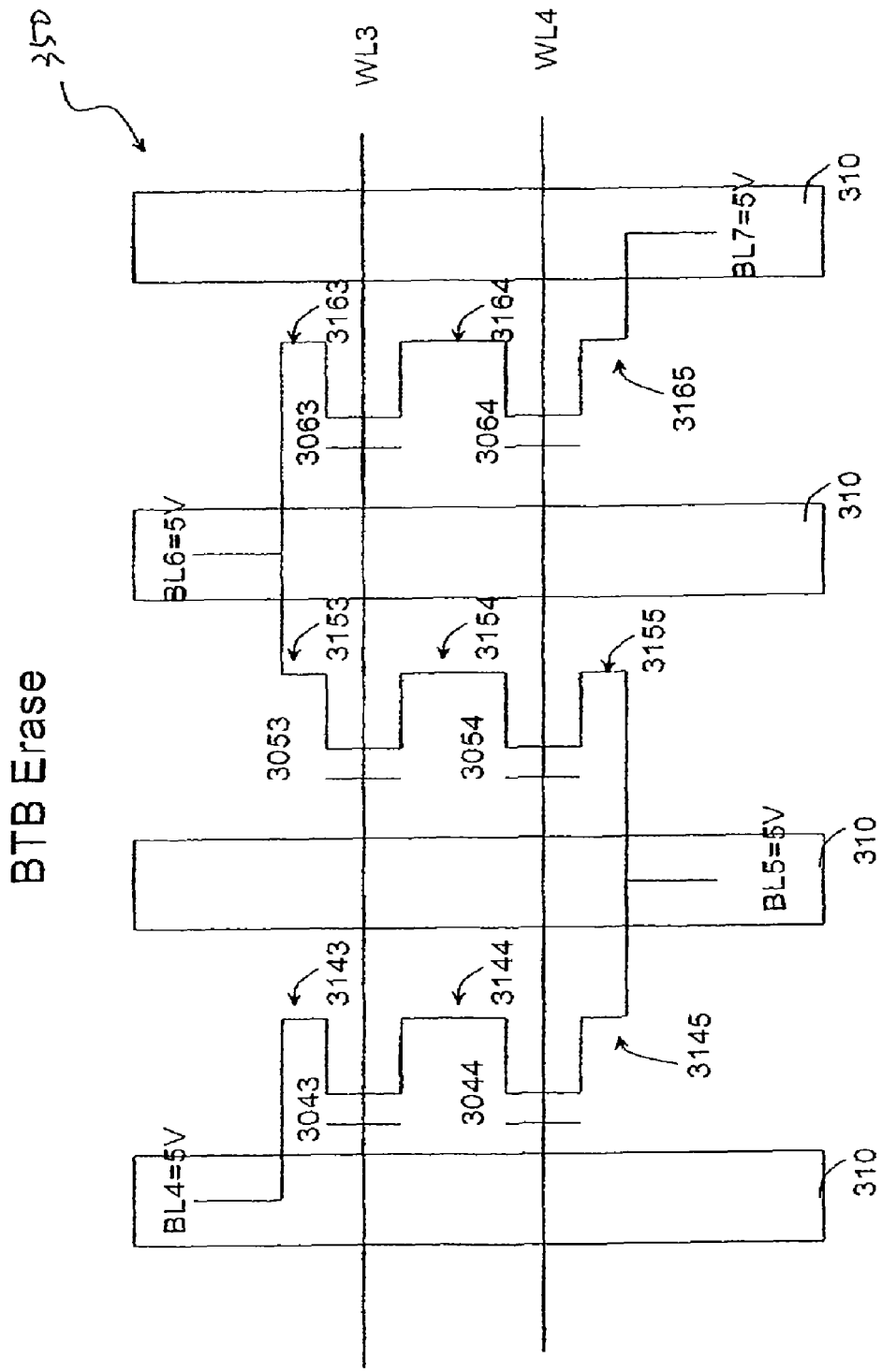
FIG. 3C is a schematic drawing showing an exemplary process for erasing at least one cell of area 350 shown in FIG. 3A.

FIG. 3C is a schematic drawing showing an exemplary process for erasing at least one cell of area 350 shown in FIG. 3A. For embodiments having structures of cells 210 and 220 described above in conjunction with FIG. 2A, cells 3053 and/or 3054 can be programmed and have charges, e.g., electrons, trapped in charge storage layers. In some embodiments erasing the stored charges in programmed cells 3053 and/or 3054, substrate of array structure 300 may be substantially grounded. Bit line transistors BLT5 and BLT6 (shown in FIG. 3A) can be turned on. Bit line BL5 can be about 5V, a voltage of word line WL3 can be about −10V, doped region 3154 can be floating, a voltage of word line WL4 can be about −10V, and bit line BL6 can be 5V. Due to the voltage drop between voltages of bit line BL6 and word line WL3, hot holes can be injected into a charge storage layer of cell 3053 to combine with trapped electrons, such that cell 3053 can be erased. Due to the voltage drop between voltages of bit line BL5 and word line WL4, hot holes can be injected into a charge storage layer of cell 3054 to combine with trapped electrons, such that cell 3054 can be erased. In some embodiments, this erasing method can be referred to as a band-to-band tunneling induced hot hole erasing method. It is noted that the scope of the present invention is not limited to the specific voltages described above. One of ordinary skill in the art can modify the voltages to desirably erase cells 3053 and/or 3054.

In some embodiments, other bit lines such as bit lines BL4 and BL7 can be about 5V, such that cells 3043, 3044, 3063, and 3064 can be erased. With this configuration, a regional or block erasing can be desirably achieved.

Figure 3D:
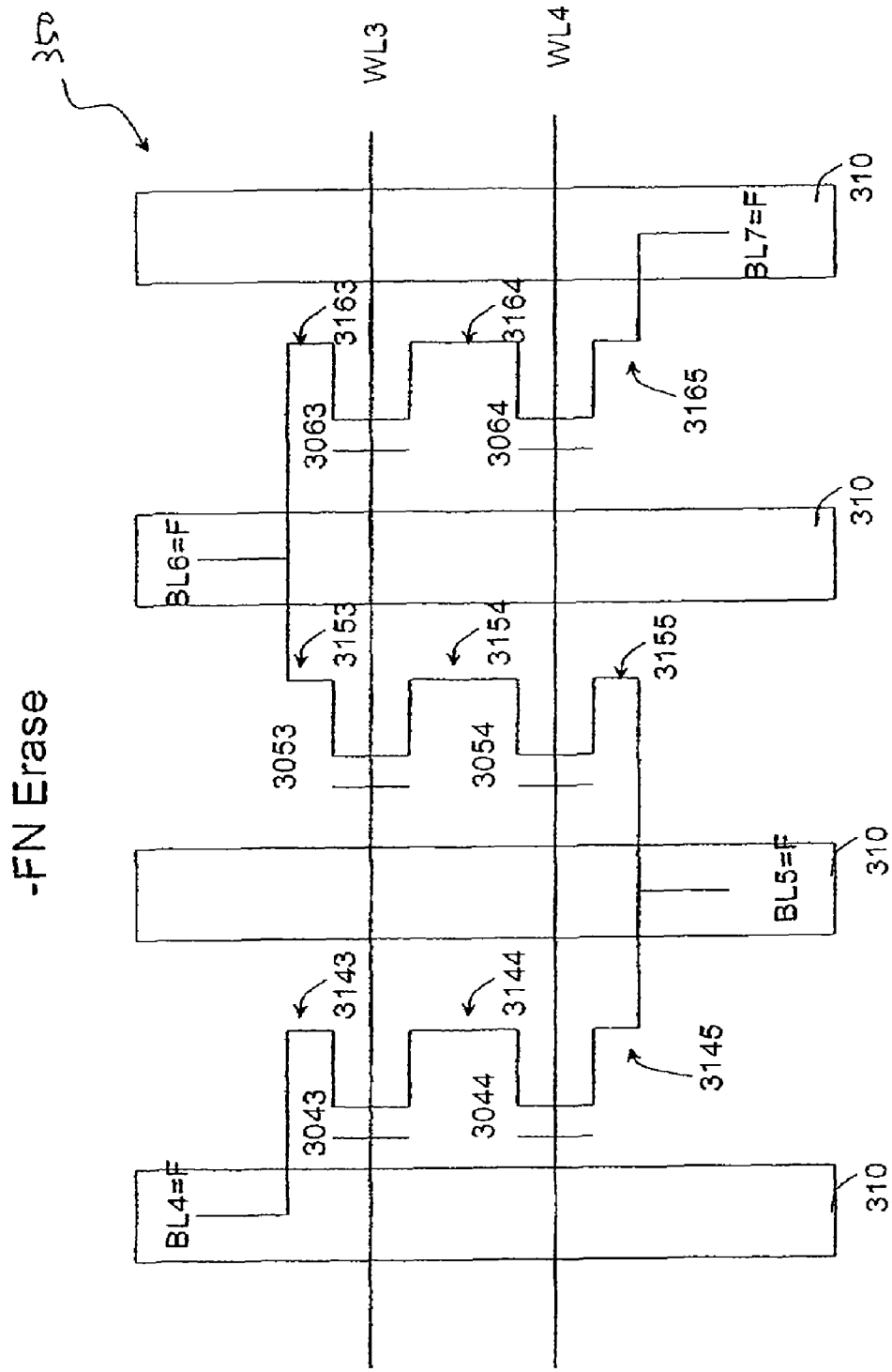
FIG. 3D is a schematic drawing showing an exemplary method for erasing at least one cell of area 350 shown in FIG. 3A.

FIG. 3D is a schematic drawing showing an exemplary method for erasing at least one cell of area 350 shown in FIG. 3A. For embodiments having structures cells 240 and 250 described above in conjunction with FIG. 2B, cells 3053 and/or 3054 can be programmed and have charges, e.g., electrons, trapped in floating gates of cells 3053 and/or 3054. In some embodiments erasing the stored charges in programmed cells 3053 and/or 3054, the substrate of array structure 300 may be substantially grounded, bit line BL5 can be floating, a voltage of word line WL3 can be about −20V, doped region 3154 can be floating, a voltage of word line WL4 can be about −20V, and bit line BL6 can be floating. Due to the voltage drop between word lines WL3, WL4 and the voltage of the substrate of array structure 300, electrons can be ejected from floating gates, such that cells 3053 and/or 3054 can be erased. In some embodiments, this erasing method can be referred to as a negative gate Fowler-Nordheim (−FN) erasing method. It is noted that the scope of the present invention is not limited to the specific voltages described above. One of ordinary skill in the art can modify the voltages to desirably erase cells 3053 and/or 3054.

In some embodiments, other bit lines such as bit lines BL4 and BL7 can be floating, such that cells 3043, 3044, 3063, and 3064 can be erased. With this configuration, a regional or block erasing can be desirably achieved.

In some embodiments reading cell 3053 having a structure similar to cell 220 described above in conjunction with FIG. 2A, a voltage of the substrate of array structure 300 can be substantially grounded, a voltage of bit line BL5 can be higher than a voltage of bit line BL6, word line WL4 can be applied a voltage higher than a predetermined threshold voltage of cell 3054, such that the voltage of word line WL4 can turn on cell 3054. A voltage of word line WL3 can be a sense voltage. In some embodiments, the sense voltage can be between a "0" state voltage and a "1" state voltage of cell 3053. In some embodiments having cell 3053 being "1" state, the voltage of word line WL3 can turn on cell 3053. Electrons can flow from doped region 3153 to doped region 3155 through floating doped region 3154. In some embodiments having cell 3053 being "0" state, the voltage of word line WL3 can not turn on cell 3053. Electrons thus may not substantially flow from doped region 3153 to doped region 3155. In some embodiments reading cell 3053, the voltage of bit line BL5 can be about 1.6V, the voltage of word line WL4 can be about 10V, doped region 3154 can be floating, a voltage of word line WL3 can be between a "0" state voltage and a "1" state voltage of cell 3053, and a voltage of bit line BL6 can be substantially grounded.

In some embodiments reading cell 3054, the substrate of array structure 300 can be substantially grounded, a voltage of bit line BL6 can be higher than a voltage of bit line BL5, a voltage of word line WL3 can be applied a voltage higher than a predetermined threshold voltage of cell 3053, such that the voltage of word line WL3 can turn on cell 3053. A voltage of word line WL4 can be a sense voltage. In some embodiments, the sense voltage can be between a "0" state voltage and a "1" state voltage of cell 3054. In some embodiments, this read method can be referred to as a reverse read method. It is noted that the scope of the present invention is not limited to the specific voltages described above. One of ordinary skill in the art can modify the voltages to desirably read cells 3053 or 3054.

In some embodiments reading cell 3053 having a structure similar to cell 250 described above in conjunction with FIG. 2B, the substrate of array structure 300 can be substantially grounded, a voltage of bit line BL6 can be higher than a voltage of bit line BL5, word line WL4 can be applied a voltage higher than a predetermined threshold voltage of cell 3054, such that the voltage of word line WL4 can turn on cell 3054. A voltage of word line WL3 can be a sense voltage. In some embodiments, the sense voltage can be between a "0" state voltage and a "1" state voltage of cell 3053. In some embodiments having cell 3053 being "1" state, the voltage of word line WL3 can turn on cell 3053. Electrons can flow from doped region 3155 to doped region 3153 through floating doped region 3154. In some embodiments having cell 3053 being "0" state, the voltage of word line WL3 can not turn on cell 3053. Electrons thus may not substantially flow from doped region 3155 to doped region 3153. In some embodiments reading cell 3053, bit line BL5 can be substantially grounded, the voltage of word line WL4 can be about 8V, doped region 3154 can be floating, the voltage of word line WL3 can be between a "0" state voltage and a "1" state voltage of cell 3053, and bit line BL6 can be about 0.6V.

In some embodiments reading cell 3054, the substrate of array structure 300 can be substantially grounded, the voltage of bit line BL5 can be higher than the voltage of bit line BL6, the voltage of word line WL3 can be higher than a predetermined threshold voltage of cell 3053, such that the voltage of word line WL3 can turn on cell 3053. The voltage of word line WL4 can be a sense voltage. In some embodiments, the sense voltage can be between a "0" state voltage and a "1" state voltage of cell 3054. In some embodiments, this read method can be referred to as a forward read method. It is noted that the scope of the present invention is not limited to the specific voltages described above. One of ordinary skill in the art can modify the voltages to desirably read cells 3053 or 3054.

Table I shows exemplary methods for operating cells 3053 and/or 3054 array structure 300 described above in conjunction with FIG. 3A.

TABLE I

| | Cell | WL3 | WL4 | BL4 | BL5 | BL6 | BL7 | Substrate | Other (Unselected) WL |
|---|---|---|---|---|---|---|---|---|---|
| Program (CHE) | 3053 | 10 V | 12 V | Floating | 0 V | 5 V | Floating | 0 V | 0 V or −Vg |
| | 3054 | 12 V | 10 V | Floating | 5 V | 0 V | Floating | 0 V | 0 V or −Vg |
| Read (Reverse) | 3053 | 5 V | 10 V | Floating | 1.6 V | 0 V | Floating | 0 V | 0 V or −Vg |
| | 3054 | 10 V | 5 V | Floating | 0 V | 1.6 V | Floating | 0 V | 0 V or −Vg |
| Read (Forward) | 3053 | 5 V | 8 V | Floating | 0 V | 0.6 V | Floating | 0 V | 0 V or −Vg |
| | 3054 | 8 V | 5 V | Floating | 0.6 V | 0 V | Floating | 0 V | 0 V or −Vg |
| Erase (−FN) | All | −20 V | −20 V | Floating | Floating | Floating | Floating | 0 V | −20 V |
| Erase (BTB) | All | −10 V | −10 V | 5 V | 5 V | 5 V | 5 V | 0 V | −10 V |

It is noted that the scope of the present invention is not limited to the specific voltages described above. One of ordinary skill in the art can modify the voltages to desirably operate cells 3053 or 3054.

Figure 4A:
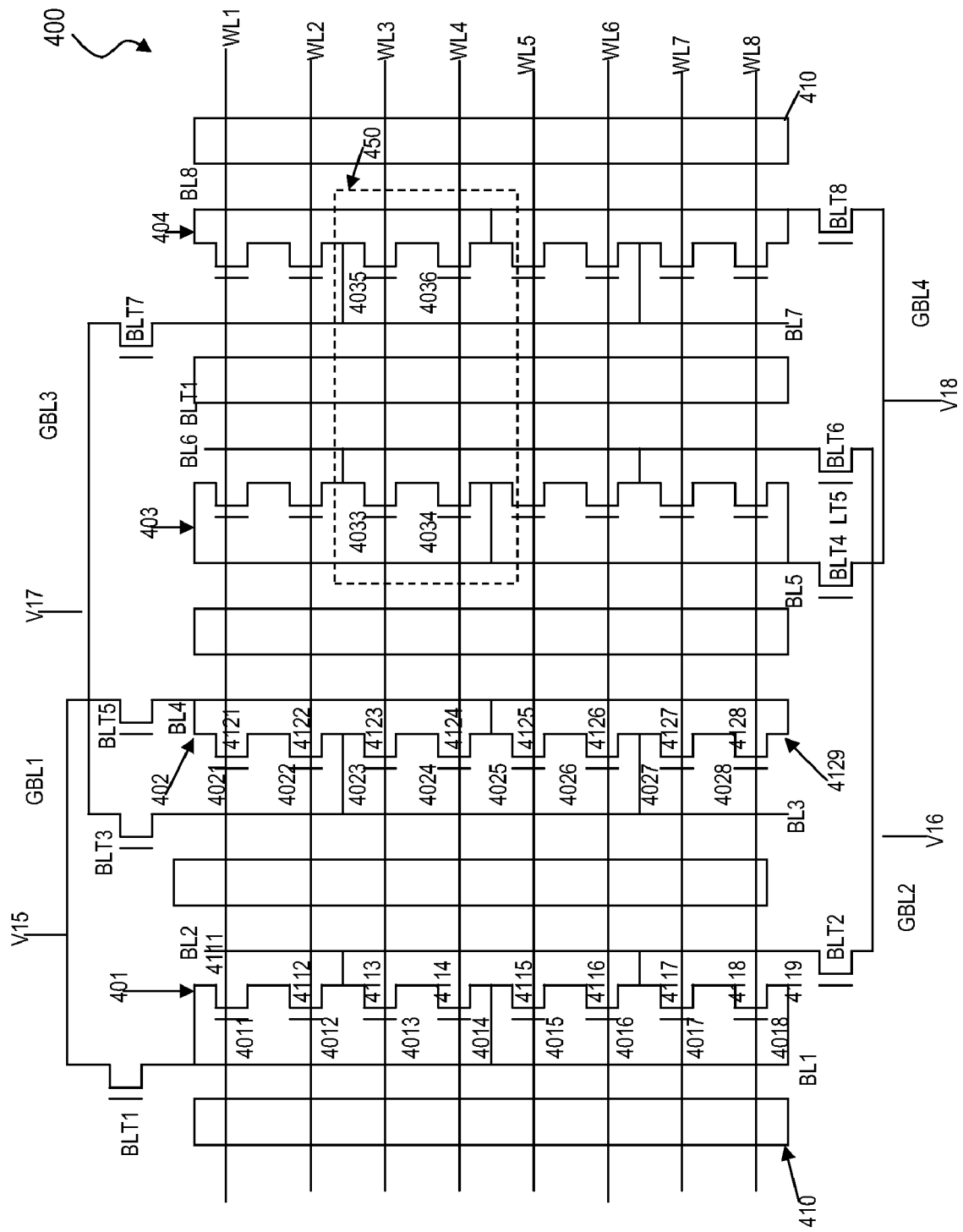
FIG. 4A is a schematic drawing showing a portion of an exemplary array structure.

FIG. 4A is a schematic drawing showing a portion of an exemplary array structure. In some embodiments, a memory array structure comprises a plurality of parallel series of cells and a plurality of bit lines substantially parallel to the plurality of series of cells. Each of the plurality of series of cells can be configured between two bit lines. Each of the plurality of parallel series of cells can include $4n+1^{th}$, $4n+2^{th}$, $4n+3^{th}$ and $4n+4^{th}$ doped regions. The $4n+1^{th}$ doped regions can be coupled to first one of the two bit lines, the $4n+2^{th}$ and $4n+4^{th}$ doped region can be floating (e.g., not coupled to any interconnect), and the $4n+3^{th}$ doped regions can be coupled to second one of the two bit lines, wherein n is an integer. In some embodiments, the series of cells can be configured between two isolation structures 410. First word lines can be coupled to the first cells of the plurality of parallel series of the cells. Second word lines can be coupled to the second cells of the plurality of series of the cells, and so on. In some embodiments, the cells of array structure 400 can be cells 210, 220, 240, and/or 250 described above in conjunction with FIGS. 2A and 2B.

Referring again to FIG. 4A, in some embodiments, array structure 400, for example, can include parallel series of cells 401-404 and bit lines BL1-BL8. Series of cells 401 and 402 can include cells 4011-4018, and 4021-4028, respectively. Series of cells 401 and 402 can include doped regions 4111-4119, and 4121-4129, respectively. Word lines WL1-WL8 can be configured substantially perpendicular to bit lines BL1-BL8. Word line WL1 can be coupled to first cells of the parallel series of cells 401-404. Word line WL2 can be coupled to second cells of the parallel series of cells 401-404. For series of cells 402, doped regions 4121, 4125, and 4129 can be coupled to bit line BL4. Doped regions 4123 and 4127 can be coupled to bit line BL3. Doped regions 4122, 4124, 4126, and 4128 can be floating.

In some embodiments, bit lines BL1-BL8 can be coupled to bit line transistor switches BLT1-BLT8, respectively. In some embodiments, bit lines BL1 and BL5 can be coupled to a global bit line GBL1 that is coupled to a voltage source V15. Bit lines BL2 and BL6 can be coupled to a global bit line GBL2 that is coupled to a voltage sources V16. Bit lines BL3 and BL7 can be coupled to a global bit line GBL3 that is coupled to a voltage source V17. Bit lines BL4 and BL8 can be coupled to a global bit line GBL4 that is coupled to a voltage source V18. In some embodiments, bit line transistors BLT1-BLT8 can be configured to control the applying of voltages V15-V18 to respective bit lines BL1-BL8.

Figure 4B:
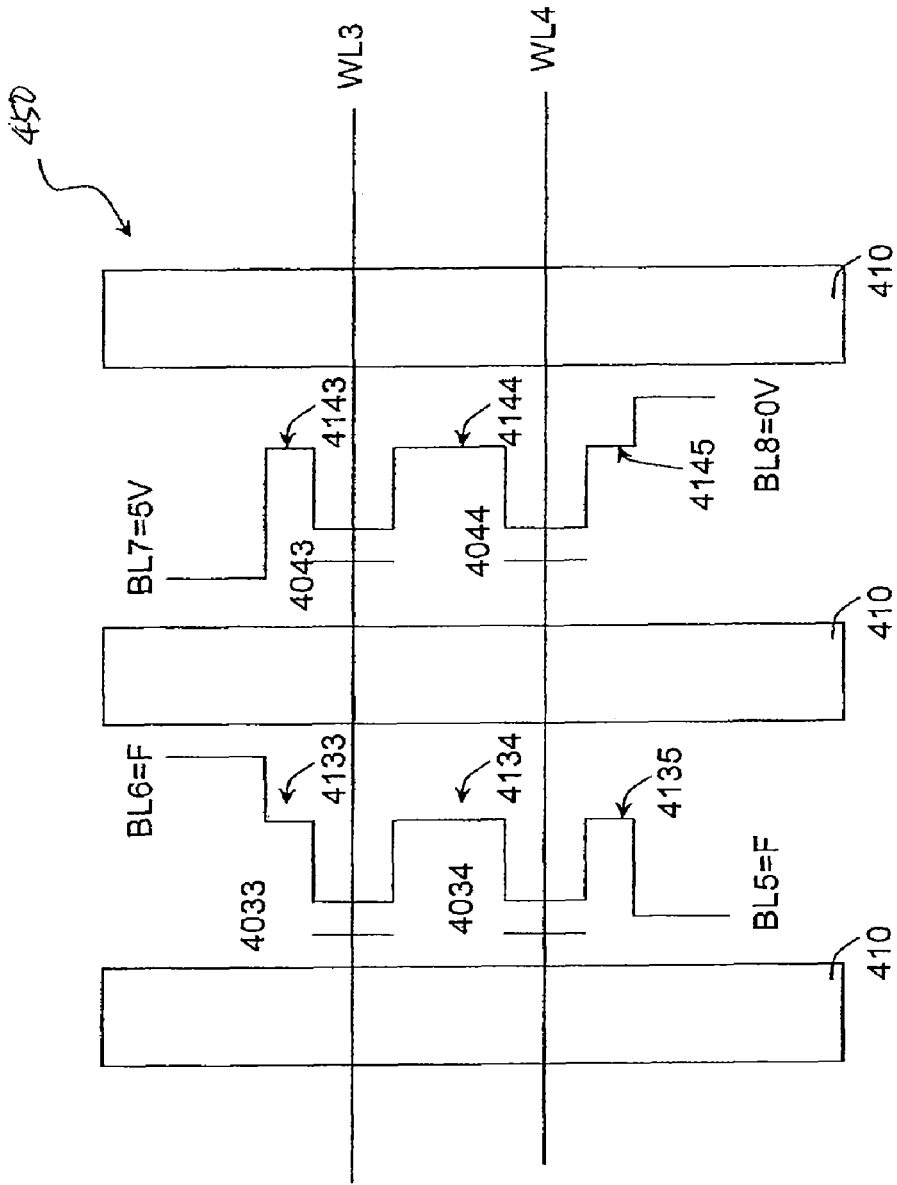
FIG. 4B is a schematic drawing showing an exemplary process for programming a cell of area 450 shown in FIG. 4A.

FIG. 4B is a schematic drawing showing an exemplary process for programming a cell of area 450 shown in FIG. 4A. In some embodiments programming cell 4043, bit line transistors BLT7 and BLT8 (shown in FIG. 4A) can be turned on. Voltage V17 coupled to doped region 4143 can be higher than voltage V18 coupled to doped region 4145. In some embodiments, bit lines BL5 and/or BL6 can be floating. A voltage applied to word line WL4 can be higher than a predetermined threshold voltage of cell 4044, such that the voltage of word line WL4 can turn on cell 4044. A voltage applied to word line WL3 can be a programming voltage. In this configuration, the voltage of word line WL4 can turn on cell 4044. Charges such as electrons can flow from doped region 4145 to doped region 4143 through floating doped region 4144. Due to the applying of the voltage of word line WL3 at cell 4043, charges will be injected and trapped at a charge storage layer or a floating gate of cell 4043. In some embodiments, the predetermined threshold voltage of cell 4044 can be a voltage representing a "0" state of cell 4044. In some embodiments, the predetermined threshold voltage of cell 4044 can be a voltage for turning on programmed cell 4044. For example, bit line BL8 can be substantially grounded, the voltage of word line WL3 can be about 10V, doped region 4144 can be floating, the voltage of word line WL4 can be about 12V, and bit line BL7 can be about 5V. In some embodiments, the programming method can be referred to as a channel hot electron programming methods. It is noted that the scope of the present invention is not limited to the specific voltages described above. One of ordinary skill in the art can modify the voltages to achieve a desired programming process for a cell of array structure 400.

In some embodiments, the programming process described above in conjunction with FIG. 4B can be repeated one or more times so as to form a multi-state to a cell of array structure 400.

Figure 4C:
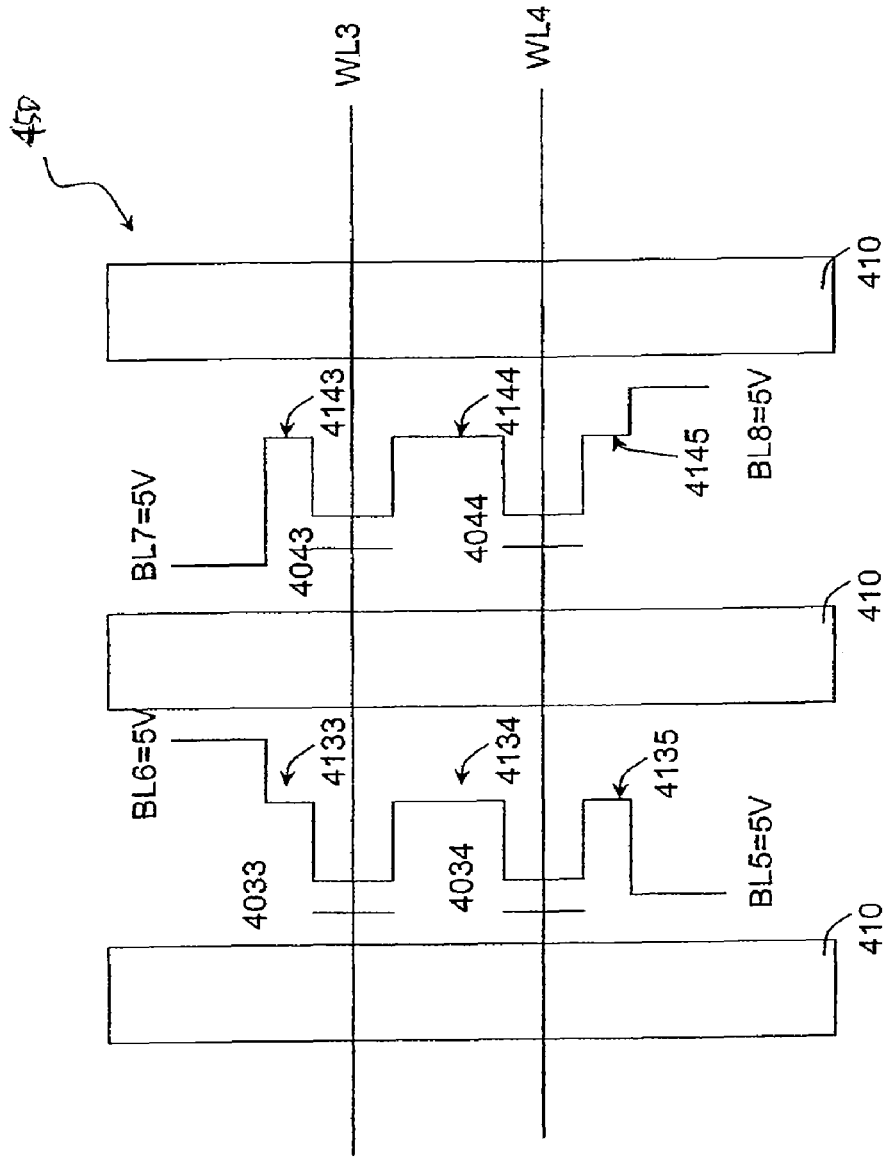
FIG. 4C is a schematic drawing showing an exemplary process for erasing at least one cell of area 450 shown in FIG. 4A.

FIG. 4C is a schematic drawing showing an exemplary process for erasing at least one cell of area 450 shown in FIG. 4A. For embodiments having structures of cells 210 and 220 described above in conjunction with FIG. 2A, cells 4043 and/or 4044 can be programmed and have charges, e.g., electrons, trapped in charge storage layers. In some embodiments erasing the stored charges in programmed cells 4043 and/or 4044, substrate of array structure 400 may be substantially grounded. Bit line transistors BLT7 and BLT8 (shown in FIG. 4A) can be turned on. Bit line BL7 can be about 5V, a voltage of word line WL3 can be about −10V, doped region 4144 can be floating, a voltage of word line WL4 can be about −10V, and bit line BL8 can be 5V. Due to the voltage drop between voltages of bit line BL7 and word line WL3, hot holes can be injected into a charge storage layer of cell 4043 to combine with trapped electrons, such that cell 4043 can be erased. Due to the voltage drop between voltages of bit line BL8 and word line WL4, hot holes can be injected into a charge storage layer of cell 4044 to combine with trapped electrons, such that cell 4044 can be erased. In some embodiments, this erasing method can be referred to as a band-to-band tunneling induced hot hole erasing method. It is noted that the scope of the present invention is not limited to the specific voltages described above. One of ordinary skill in the art can modify the voltages to desirably erase cells 4043 and/or 4044.

In some embodiments, other bit lines such as bit lines BL5 and BL6 can be about 5V, such that cells 4033, and 4034 can be erased. With this configuration, a regional or block erasing can be desirably achieved.

Figure 4D:
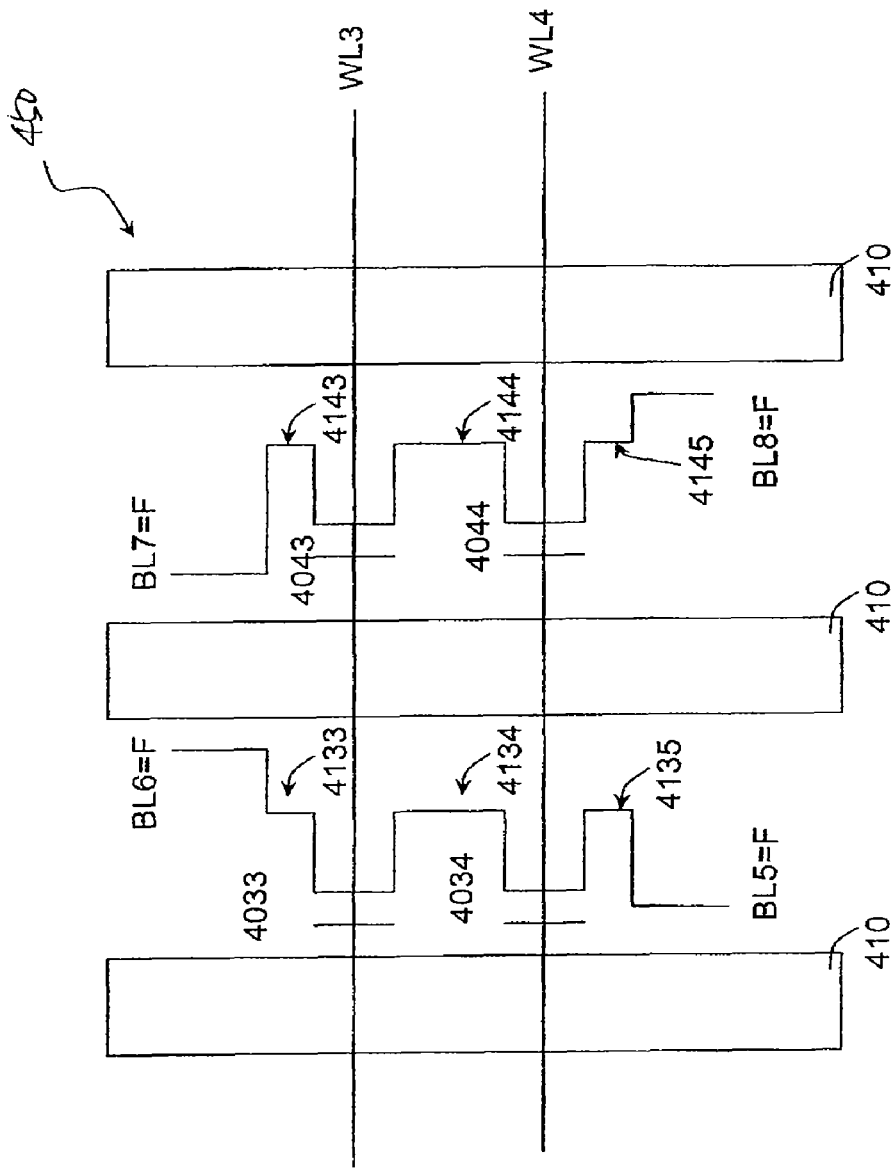
FIG. 4D is a schematic drawing showing an exemplary method for erasing at least one cell of area 450 shown in FIG. 4A.

FIG. 4D is a schematic drawing showing an exemplary method for erasing at least one cell of area 450 shown in FIG. 4A. For embodiments having structures of cells 240 and 250 described above in conjunction with FIG. 2B, cells 4043 and/or 4044 can be programmed and have charges, e.g., electrons, trapped in floating gates of cells 4043 and/or 4044. In some embodiments erasing the stored charges in programmed cells 4043 and/or 4044, the substrate of array structure 400 may be substantially grounded, bit line BL7 can be floating, a voltage of word line WL3 can be about −20V, doped region 4144 can be floating, a voltage of word line WL4 can be about −20V, and bit line BL8 can be floating. Due to the voltage drop between word lines WL3, WL4 and the voltage of the substrate of array structure 400, electrons can be ejected from floating gates, such that cells 4043 and/or 4044 can be erased. In some embodiments, this erasing method can be referred to as a negative gate Fowler-Nordheim (−FN) erasing method. It is noted that the scope of the present invention is not limited to the specific voltages described above. One of ordinary skill in the art can modify the voltages to desirably erase cells 4043 and/or 4044.

In some embodiments, other bit lines such as bit lines BL5 and BL6 can be floating, such that cells 4033, and 4034 can be erased. With this configuration, a regional or block erasing can be desirably achieved.

In some embodiments reading cell 4043 having a structure similar to cell 220 described above in conjunction with FIG.

2A, a voltage of the substrate of array structure 400 can be substantially grounded, a voltage of bit line BL8 can be higher than a voltage of bit line BL7, word line WL4 can be applied a voltage higher than a predetermined threshold voltage of cell 4044, such that the voltage of word line WL4 can turn on cell 4044. A voltage of word line WL3 can be a sense voltage. In some embodiments, the sense voltage can be between a "0" state voltage and a "1" state voltage of cell 4043. In some embodiments having cell 4043 being "1" state, the voltage of word line WL3 can turn on cell 4043. Electrons can flow from doped region 4143 to doped region 4145 through floating doped region 4144. In some embodiments having cell 4043 being "0" state, the voltage of word line WL3 can not turn on cell 4043. Electrons thus may not substantially flow from doped region 4143 to doped region 4145. In some embodiments reading cell 4043, the voltage of bit line BL8 can be about 1.6V, the voltage of word line WL4 can be about 10V, doped region 4144 can be floating, a voltage of word line WL3 can be between a "0" state voltage and a "1" state voltage of cell 4043, and a voltage of bit line BL7 can be substantially grounded.

In some embodiments reading cell 4044, the substrate of array structure 400 can be substantially grounded, a voltage of bit line BL7 can be higher than a voltage of bit line BL8, a voltage of word line WL3 can be applied a voltage higher than a predetermined threshold voltage of cell 4043, such that the voltage of word line WL3 can turn on cell 4043. A voltage of word line WL4 can be a sense voltage. In some embodiments, the sense voltage can be between a "0" state voltage and a "1" state voltage of cell 4044. In some embodiments, this read method can be referred to as a reverse read method. It is noted that the scope of the present invention is not limited to the specific voltages described above. One of ordinary skill in the art can modify the voltages to desirably read cells 4043 or 4044.

In some embodiments reading cell 4043 having a structure similar to cell 250 described above in conjunction with FIG. 2B, the substrate of array structure 400 can be substantially grounded, a voltage of bit line BL7 can be higher than a voltage of bit line BL8, word line WL4 can be applied a voltage higher than a predetermined threshold voltage of cell 4044, such that the voltage of word line WL4 can turn on cell 4044. A voltage of word line WL3 can be a sense voltage. In some embodiments, the sense voltage can be between a "0" state voltage and a "1" state voltage of cell 4043. In some embodiments having cell 4043 being "1" state, the voltage of word line WL3 can turn on cell 4043. Electrons can flow from doped region 4145 to doped region 4143 through floating doped region 4144. In some embodiments having cell 4043 being "0" state, the voltage of word line WL3 can not turn on cell 4043. Electrons thus may not substantially flow from doped region 4145 to doped region 4143. In some embodiments reading cell 4043, bit line BL8 can be substantially grounded, the voltage of word line WL4 can be about 8V, doped region 4144 can be floating, the voltage of word line WL3 can be between a "0" state voltage and a "1" state voltage of cell 4043, and bit line BL7 can be about 0.6V.

In some embodiments reading cell 4044, the substrate of array structure 400 can be substantially grounded, the voltage of bit line BL8 can be higher than the voltage of bit line BL7, the voltage of word line WL3 can be higher than a predetermined threshold voltage of cell 4043, such that the voltage of word line WL3 can turn on cell 4043. The voltage of word line WL4 can be a sense voltage. In some embodiments, the sense voltage can be between a "0" state voltage and a "1" state voltage of cell 4044. In some embodiments, this read method can be referred to as a forward read method. It is noted that the scope of the present invention is not limited to the specific voltages described above. One of ordinary skill in the art can modify the voltages to desirably read cells 4043 or 4044.

Table II shows exemplary methods for operating cells 4043 and/or 4044 array structure 400 described above in conjunction with FIG. 4A.

TABLE II

| | Cell | WL3 | WL4 | BL5 | BL6 | BL7 | BL8 | Substrate | Other (Unselected) WL |
|---|---|---|---|---|---|---|---|---|---|
| Program (CHE) | 4043 | 10 V | 12 V | Floating | Floating | 5 V | 0 V | 0 V | 0 V or −Vg |
| | 4044 | 12 V | 10 V | Floating | Floating | 0 V | 5 V | 0 V | 0 V or −Vg |
| Read (Reverse) | 4043 | 5 V | 10 V | Floating | Floating | 0 V | 1.6 V | 0 V | 0 V or −Vg |
| | 4044 | 10 V | 5 V | Floating | Floating | 1.6 V | 0 V | 0 V | 0 V or −Vg |
| Read (Forward) | 4043 | 5 V | 8 V | Floating | Floating | 0.6 V | 0 V | 0 V | 0 V or −Vg |
| | 4044 | 8 V | 5 V | Floating | Floating | 0 V | 0.6 V | 0 V | 0 V or −Vg |
| Erase (−FN) | All | −20 V | −20 V | Floating | Floating | Floating | Floating | 0 V | −20 V |
| Erase (BTB) | All | −10 V | −10 V | 5 V | 5 V | 5 V | 5 V | 0 V | −10 V |

It is noted that the scope of the present invention is not limited to the specific voltages described above. One of ordinary skill in the art can modify the voltages to desirably operate cells 4043 or 4044.

Figure 5A:
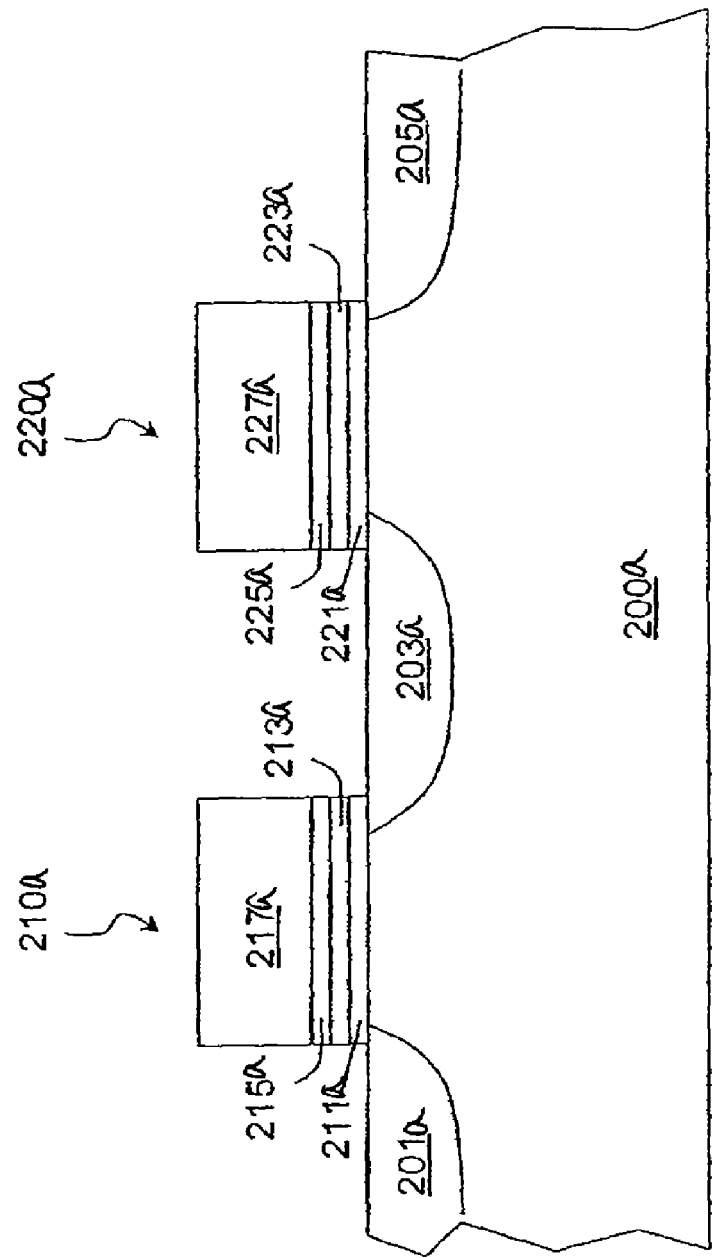
FIG. 5A is a schematic cross-sectional view of two exemplary Flash memory cells.

FIG. 5A is a schematic cross-sectional view of two exemplary Flash memory cells. According to FIG. 5A, doped regions 201a, 203a, and 205a are within a substrate 200a. Substrate 200a can be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. Doped regions 201a, 203a, and 205a can be n-type or p-type doped regions. For n-type doped regions, doped regions 201a, 203a, and 205a may include dopants such as arsenic, phosphorus and/or other group V element. For p-type doped regions, doped regions 201a, 203a, and 205a may include dopants such as boron and/or other group III element. In some embodiments, doped regions 201a, 203a, and 205a can be formed by, for example, an implantation process.

Referring again to FIG. 5A, memory cells 210a and 220a are over substrate 200a. Memory cell 210a can include tunneling barrier 211a, charge storage layer 213a, dielectric layer 215a, and conductive layer 217a. Memory cell 220a can include tunneling barrier 221a, charge storage layer 223a, dielectric layer 225a, and conductive layer 227a. Tunneling barriers 211a and 221a, charge storage layers 213a and 223a, dielectric layers 215a and 225a, and conductive layers 217a and 227a are over substrate 200a. In some embodiments, tunneling barriers 211a and 221a can be oxide barriers and/or formed by the same process. Charge storage layers 213a and 223a can be nitride layers and/or formed by the same process. Charge storage layers 213a and 223a can be configured to store charges such as electrons and/or holes. Dielectric layers 215a and 225a can be oxide layers and/or formed by the same process. Conductive layers 217a and 227a can be, for example, polysilicon layers, amorphous silicon layers, metal-containing layers, tungsten silicide layers, copper layers, aluminum layers or other conductive material layers. In some embodiments, conductive layers 217a and 227a can be formed by the same process. In some embodiments, tunneling barriers 211a and 221a, charge storage layers 213a and 223a, dielectric layers 215a and 225a, and conductive layers 217a and 227a can be formed by chemical vapor deposition (CVD) processes, ultra high vacuum chemical vapor deposition (UHVCVD) processes, atomic layer chemical vapor deposition (ALCVD) processes, metal organic chemical vapor deposition (MOCVD) processes or other CVD processes.

Figure 5B:
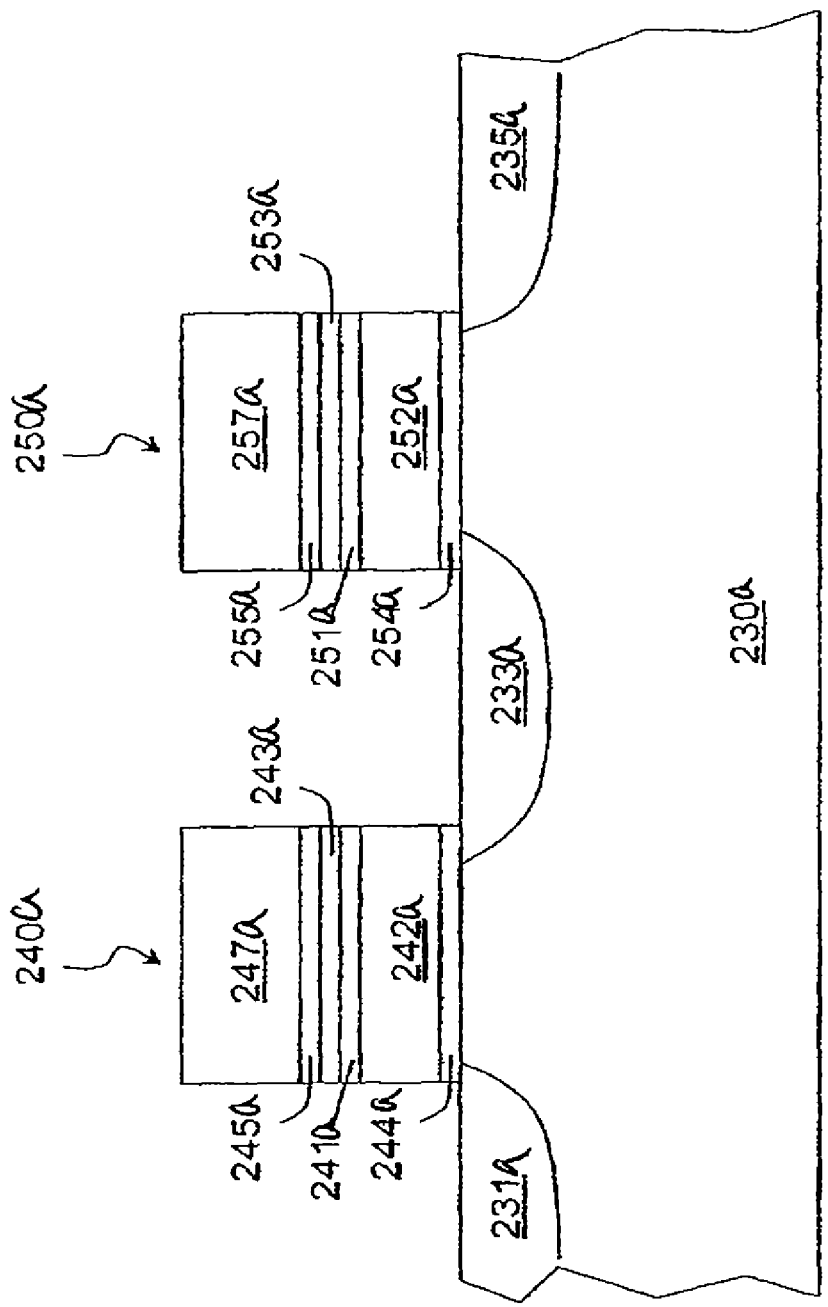
FIG. 5B is a schematic cross-sectional view of two exemplary Flash memory cells.

FIG. 5B is a schematic cross-sectional view of two exemplary Flash memory cells. Memory cells 240a and 250a are over substrate 230a. Memory cell 240a can include barrier layer 244a, floating gate 242a, dielectric layers 241a, 243a, and 245a, and conductive layer 247a. Memory cell 250a can include barrier layer 254a, floating gate 252a, dielectric layers 251a, 253a, and 255a, and conductive layer 257a. In FIG. 5B, substrate 230a is similar to substrate 200a described above in conjunction with FIG. 5A. Doped regions 231a, 233a, and 235a are similar to doped regions 201a, 203a, and 205a, respectively, described above in conjunction with FIG. 5A. Dielectric layers 241a, 243a, 245a, 251a, 253a, and 255a are dielectric layers. In some embodiments, dielectric layers 241a, 243a, and 245a are oxide/nitride/oxide (ONO). In some embodiments, dielectric layers 251a, 253a, and 255a are oxide/nitride/oxide (ONO). In some embodiments, conductive layers 247a and 257a can be similar to the conductive layers 217a and 227a, respectively. Tunneling layers 244a and 254a are over substrate 230a. In some embodiments, tunneling layers 244a, and 254a can be oxide layers. Floating gates 242a and 252a can be, for example, silicon layers such as polysilicon layers. Floating gates 242a and 252a are configured to store charges such as electrons and/or holes. In some embodiments, tunneling layers 244a and 254a, floating gates 242a and 252a, dielectric layers 241a, 243a, 245a, 251a, 253a, and 255a and conductive layers 247a and 257a can be formed by chemical vapor deposition (CVD) processes, ultra high vacuum chemical vapor deposition (UHVCVD) processes, atomic layer chemical vapor deposition (ALCVD) processes, metal organic chemical vapor deposition (MOCVD) processes or other CVD processes.

Figure 5C:
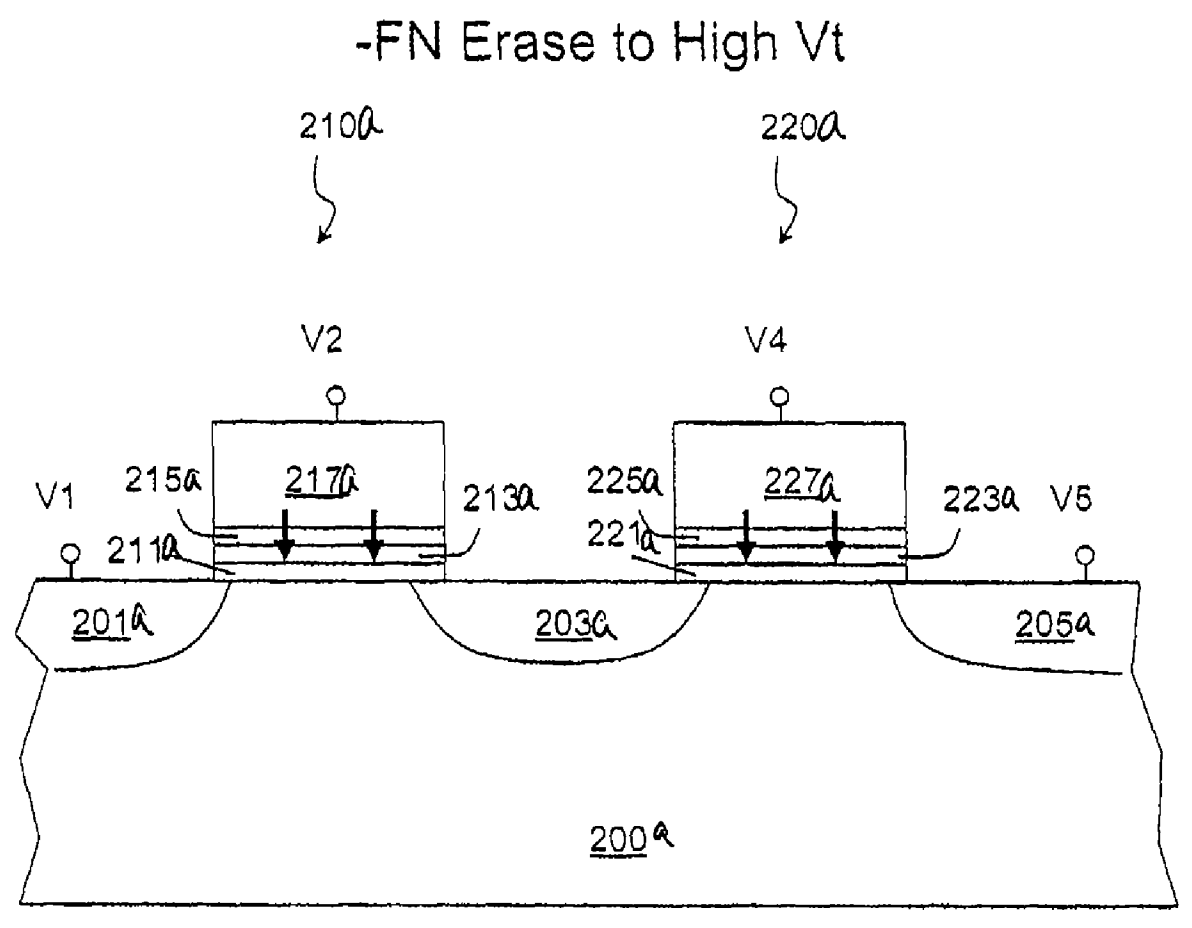

FIG. 5C is a schematic drawing showing an exemplary method for erasing at least one of the two exemplary memory cells. In some embodiments, cells 210a and/or 220a can be erased by injecting charges such as electrons from gates 217a and 227a into charge storage layers 213a, and 223a, respectively. In some embodiments erasing cells 210a and/or 220a, substrate 200a may be substantially grounded, voltages V1 and V5 can be floating. Doped region 203a can be floating. A first negative voltage can be applied to gate 217a. A second negative voltage can be applied to gate 227a. In some embodiments, the first negative voltage can be substantially equal to the second negative voltage. In some embodiments, substrate 200a may be substantially grounded, voltages V1 and V5 can be floating, doped region 203a can be floating, and voltages V2 and V4 can be about −20V. Due to the voltage drop between gates 217a, 227a and substrate 200a, electrons can be injected into charge storage layer 213a, 223a, such that cells 210a and 220a can be erased. In some embodiments, this erasing method can be referred to as a negative gate Fowler-Nordheim (−FN) erasing method. It is noted that the scope of the present invention is not limited to the specific voltages described above. One of ordinary skill in the art can modify the voltages to desirably erase cells 210a and/or 220a.

Figure 5D:
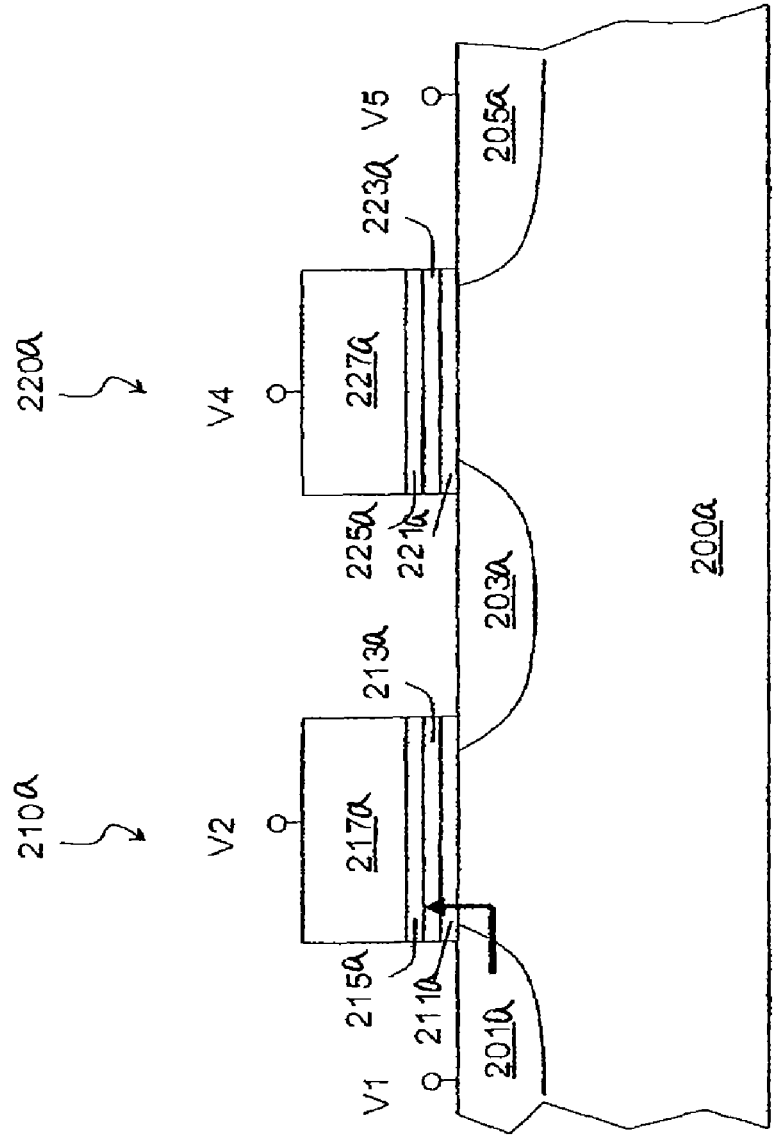
FIG. 5D is a schematic drawing showing an exemplary method for programming one of two exemplary memory cells.

FIG. 5D is a schematic drawing showing an exemplary method for programming one of two exemplary memory cells. In some embodiments, cells 210a and/or 220a can be erased and have charges, e.g., electrons, trapped in charge storage layers 213a, and 223a, respectively. In some embodiments programming cell 210a, substrate 200a may be substantially grounded, a positive voltage can be applied to doped region 201a, a negative voltage can be applied to gate 217a, doped region 203a can be floating, cell 220a can be configured to serve as a select transistor and be turned on, and doped region 205a can be substantially grounded. In some embodiments, the absolute value of the negative voltage applied to gate 217a can be substantially equal to the positive voltage of V1. After the programming, the threshold voltage of the programmed cell 210a is reduced. In some embodiments, substrate 200a can be substantially grounded, voltage V1 can be about 5V, voltage V2 can be about −5V, doped region 203a is floating, cell 220a can be turned on, and voltage V5 can be substantially grounded. In some embodiments, this programming method can be referred to as a band-to-band tunneling induced hot hole programming method. It is noted that the scope of the present invention is not limited to the specific voltages described above. One of ordinary skill in the art can modify the voltages to desirably program cells 210a and/or 220a.

In some embodiments, the programming process described above in conjunction with FIG. 5D can be repeated one or more times so as to form a multi-state to cells 210a and/or 220a. In other embodiments, cell 210a can be programmed once with some voltages higher than voltages V1 and/or V2, such that the threshold voltage of the programmed cell 210a meets one level of several target voltages. Accordingly, cells 210a and/or 220a can be used for multi-level cells.

Figure 5E:
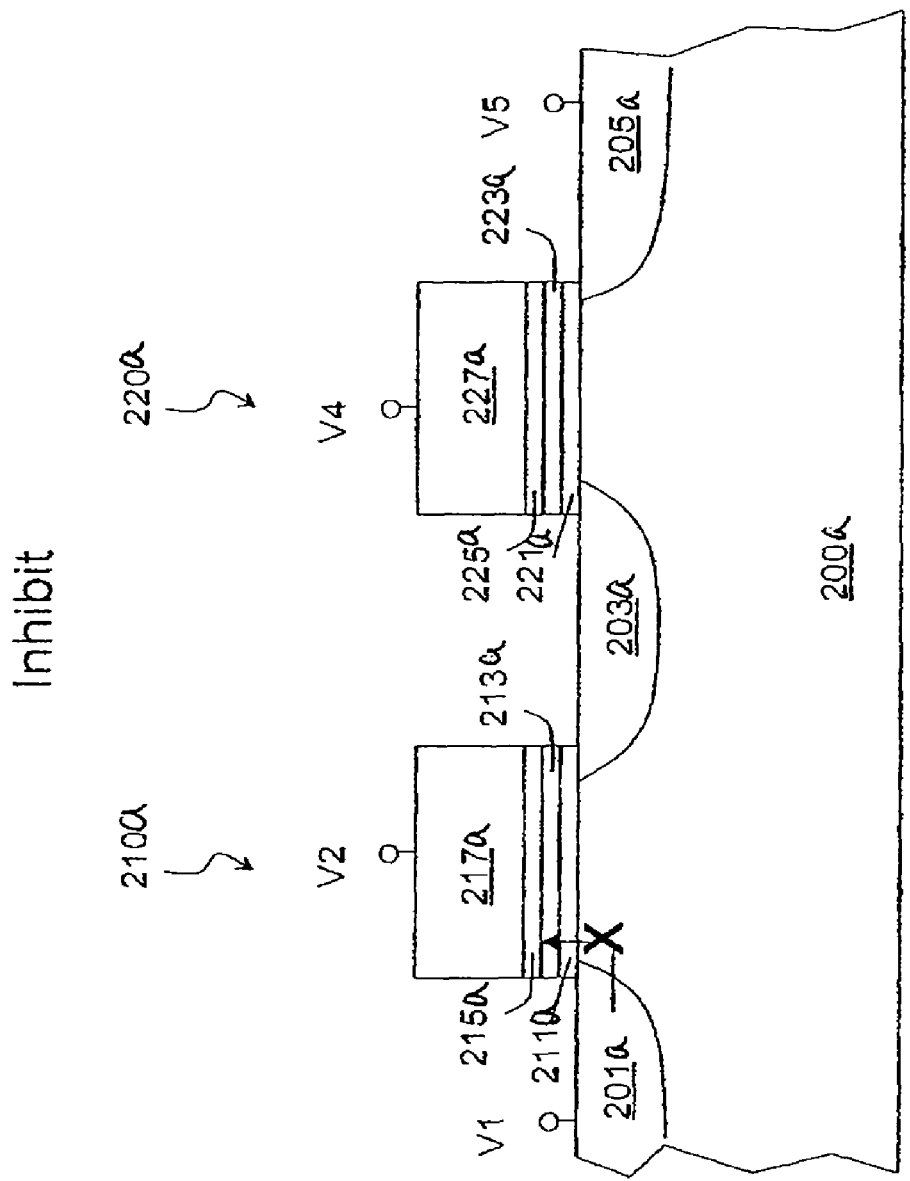
FIG. 5E is a schematic drawing showing an exemplary method for inhibiting programming disturbance of one of two exemplary memory cells.
Figure 5A:
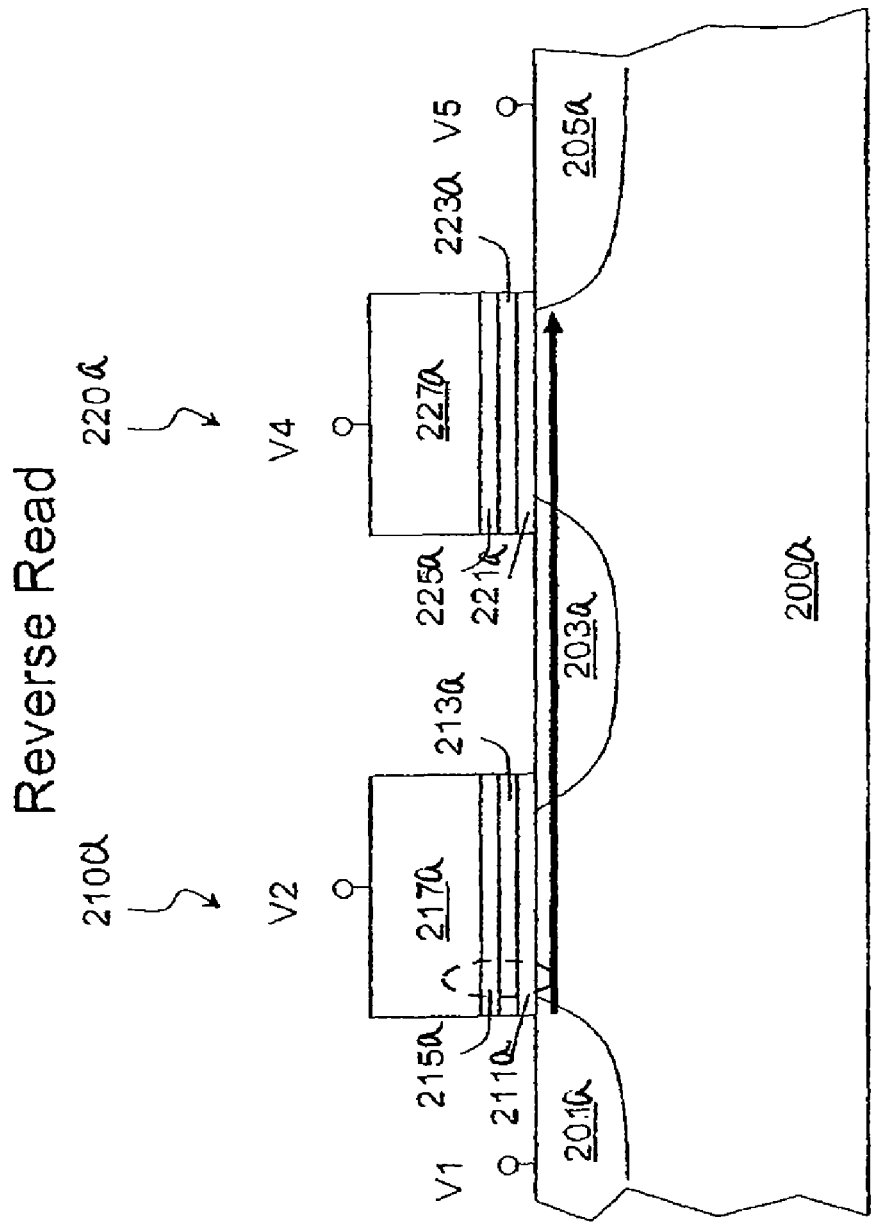

FIG. 5E is a schematic drawing showing an exemplary method for inhibiting programming disturbance of one of two exemplary memory cells. In some embodiments, cells 210a and/or 220a can be erased and have charges, e.g., electrons, trapped in charge storage layers 213a, and 223a, respectively. In some embodiments programming cell (not shown) adjacent to cell 210a, the programming step may disturb cell 210a. In some embodiments, substrate 200a may be substantially grounded, a positive voltage can be applied to doped region 201a, a negative voltage can be applied to gate 217a, doped region 203a can be floating, cell 220a can be configured to serve as a select transistor and be turned on, and doped region 205a can be coupled to a positive voltage. Since cell 220a is turned on, the positive voltage of doped region 205a can be coupled to doped region 203a. Due to the coupled voltage of doped region 203a, hot holes injected from doped region 201a into charge storage layer 217a can be desirably reduced. In some embodiments, the absolute value of the negative voltage applied to gate 217a can be substantially equal to the positive voltage of V1. In some embodiments, substrate 200a can be substantially grounded, voltage V1 can be about 5V, voltage V2 can be about −5V, doped region 203a is floating, cell 220a can be turned on, and voltage V5 can be about 3V. It is noted that the scope of the present invention is not limited to the specific voltages described above. One of ordinary skill in the art can modify the voltages to desirably avoid programming disturbance to cells 210a and/or 220a.

FIG. 5F is a schematic drawing showing an exemplary method for two unselected exemplary memory cells. In some embodiments, cells 210a and 220a can be unselected cells. To desirably avoid programming disturbances, voltages V2 and V4 can be substantially grounded and/or a negative bias. In some embodiments, the negative bias applied to voltages V2 and/or V4 may desirably prevent programming disturbance. In some embodiments, voltages V1 can be about 5V and V5 may be substantially grounded, and doped region 203a may be floating. With floating doped region 203a, the length between doped regions 201a and 205a is longer than the length between doped regions 203a, and 205a. The punch-through effect between doped regions 201a, and 205a can be desirably reduced. It is noted that the scope of the present invention is not limited to the specific voltages described above. One of ordinary skill in the art can modify the voltages to desirably prevent programming disturbance to cells 210a and/or cell 220a.

FIG. 5G is a schematic drawing showing an exemplary method for reading one of two exemplary memory cells. In some embodiments reading cell 210a, substrate 200a can be substantially grounded, voltage V5 can be higher than voltage V1, voltage V4 can be applied a voltage higher than a predetermined threshold voltage of cell 220a, such that voltage V4 can turn on cell 220a. Voltage V2 can be a sense voltage. In some embodiments, the sense voltage can be between a "0" state voltage and a "1" state voltage of cell 210a. In some embodiments having cell 210a being "1" state, voltage V2 can turn on cell 210a. Electrons can flow from doped region 201a to doped region 205a through floating doped region 203a. In some embodiments having cell 210a being "0" state, voltage V2 can not turn on cell 210a. Electrons thus may not substantially flow from doped region 201a to doped region 205a. In some embodiments reading cell 210a, voltage V1 can be substantially grounded, voltage V2 can be between a "0" state voltage and a "1" state voltage of cell 210a, doped region 203a can be floating, voltage V4 can turn on cell 220a, and voltage V5 can be about 1.6V.

In some embodiments reading cell 220a, substrate 200a can be substantially grounded, voltage V1 can be higher than voltage V5, voltage V2 can be applied a voltage higher than a predetermined threshold voltage of cell 210a, such that voltage V2 can turn on cell 210a. Voltage V4 can be a sense voltage. In some embodiments, the sense voltage can be between a "0" state voltage and a "1" state voltage of cell 220a. In some embodiments, this read method can be referred to as a reverse read method. It is noted that the scope of the present invention is not limited to the specific voltages described above. One of ordinary skill in the art can modify the voltages to desirably read cells 210a or 220a.

Figure 5H:
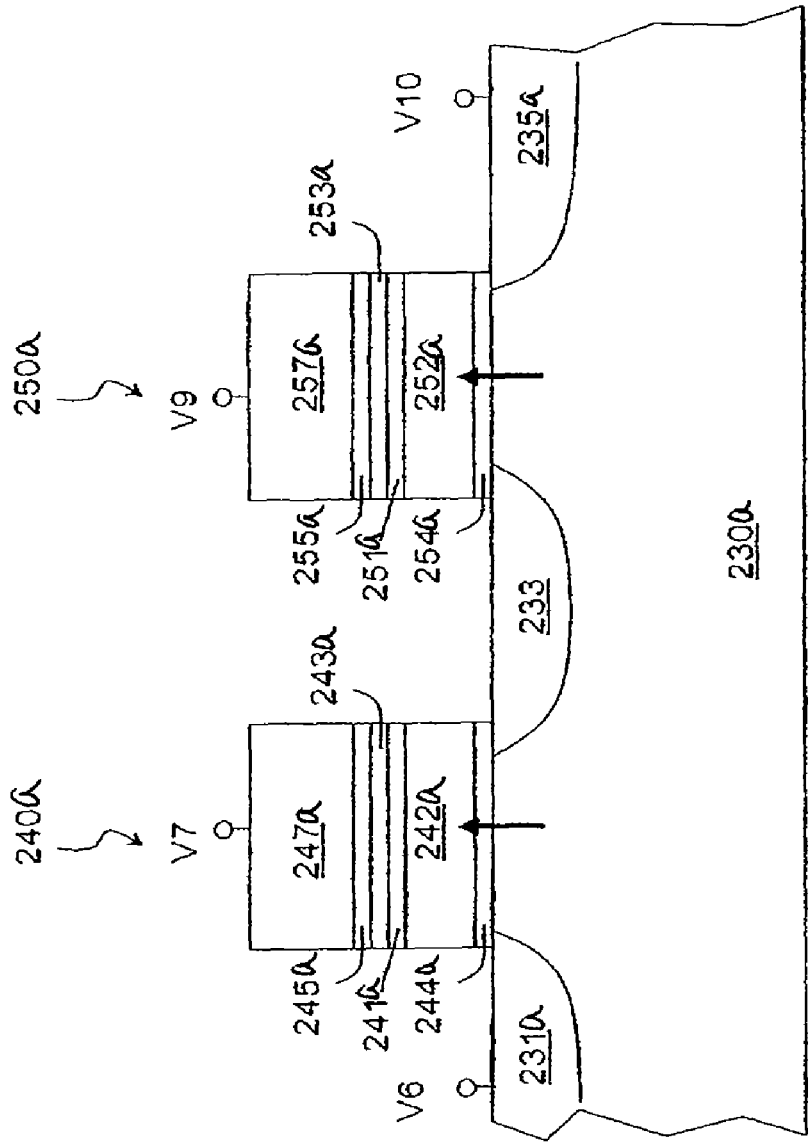
FIG. 5H is a schematic drawing showing an exemplary method for erasing at least one of the two exemplary memory cells.

FIG. 5H is a schematic drawing showing an exemplary method for erasing at least one of the two exemplary memory cells. In some embodiments, cells 240a and/or 250a can be erased by injecting charges such as electrons from substrate 230a to floating gates 242a and 252a. In some embodiments erasing cells 240a and/or 250a, substrate 230a may be substantially grounded, voltages V6 and V10 can be substantially grounded. Doped region 233a can be floating. A first positive voltage can be applied to gate 247a. A second positive voltage can be applied to gate 257a. In some embodiments, the first positive voltage can be substantially equal to the second positive voltage. In some embodiments, substrate 230a may be substantially grounded, voltages V6 and V10 can be substantially grounded, doped region 203a can be floating, and voltages V7 and V9 can be about 20V. Due to the voltage drop between gates 247a, 257a and substrate 230a, electrons can be injected into floating gates 242a, 252a, such that cells 240a and 250a can be erased. The threshold voltages of erased cells 240a and 250a are thus increased. In some embodiments, this erasing method can be referred to as a positive gate Fowler-Nordheim (+FN) erasing method. It is noted that the scope of the present invention is not limited to the specific voltages described above. One of ordinary skill in the art can modify the voltages to desirably erase cells 240a and/or 250a.

Figure 5I:
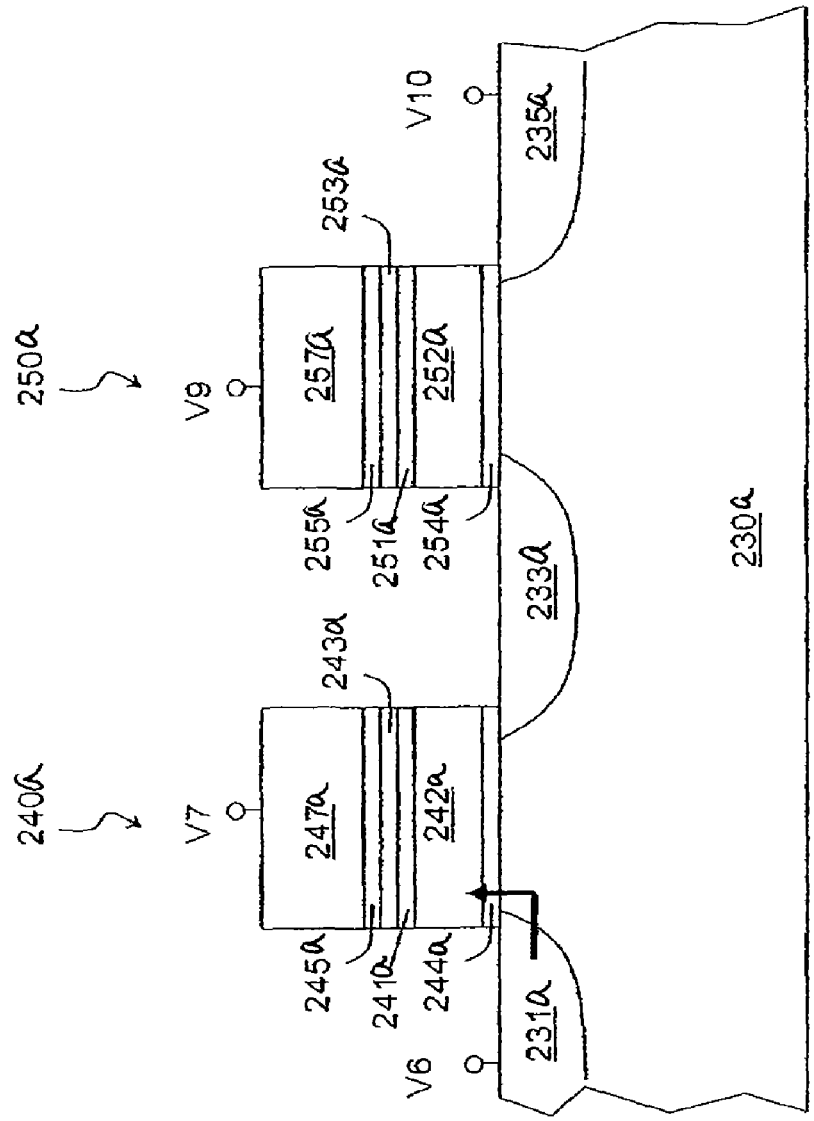
FIG. 5I is a schematic drawing showing an exemplary method for programming one of two exemplary memory cells.

FIG. 5I is a schematic drawing showing an exemplary method for programming one of two exemplary memory cells. In some embodiments, cells 240a and/or 250a can be erased and have charges, e.g., electrons, trapped in floating gates 242a, and 252a, respectively. In some embodiments programming cell 240a, substrate 230a may be substantially grounded, a positive voltage can be applied to doped region 231a, a negative voltage can be applied to gate 247a, doped region 233a can be floating, cell 250a can serve as a select transistor and be turned on, and doped region 235a can be substantially grounded. In some embodiments, the absolute value of the negative voltage applied to gate 247a can be substantially equal to the positive voltage of V6. After the programming step, the threshold voltage of programmed cell 240a is reduced. In some embodiments, substrate 230a can be substantially grounded, voltage V6 can be about 5V, voltage V7 can be about −5V, doped region 203a is floating, cell 220a can be turned on, and voltage V10 can be substantially grounded. In some embodiments, this programming method can be referred to as a band-to-band tunneling induced hot hole programming method. It is noted that the scope of the present invention is not limited to the specific voltages described above. One of ordinary skill in the art can modify the voltages to desirably program cells 240a and/or 250a.

In some embodiments, the programming process described above in conjunction with FIG. 5I can be repeated one or more times so as to form a multi-state to cells 240a and/or 250a. In other embodiments, cell 240a can be programmed once with some voltages higher than voltages V6 and/or V7, such that the threshold voltage of the programmed cell 240a meets one level of several target voltages. Accordingly, cells 240a and/or 250a can be used for multi-level cells.

Figure 5J:
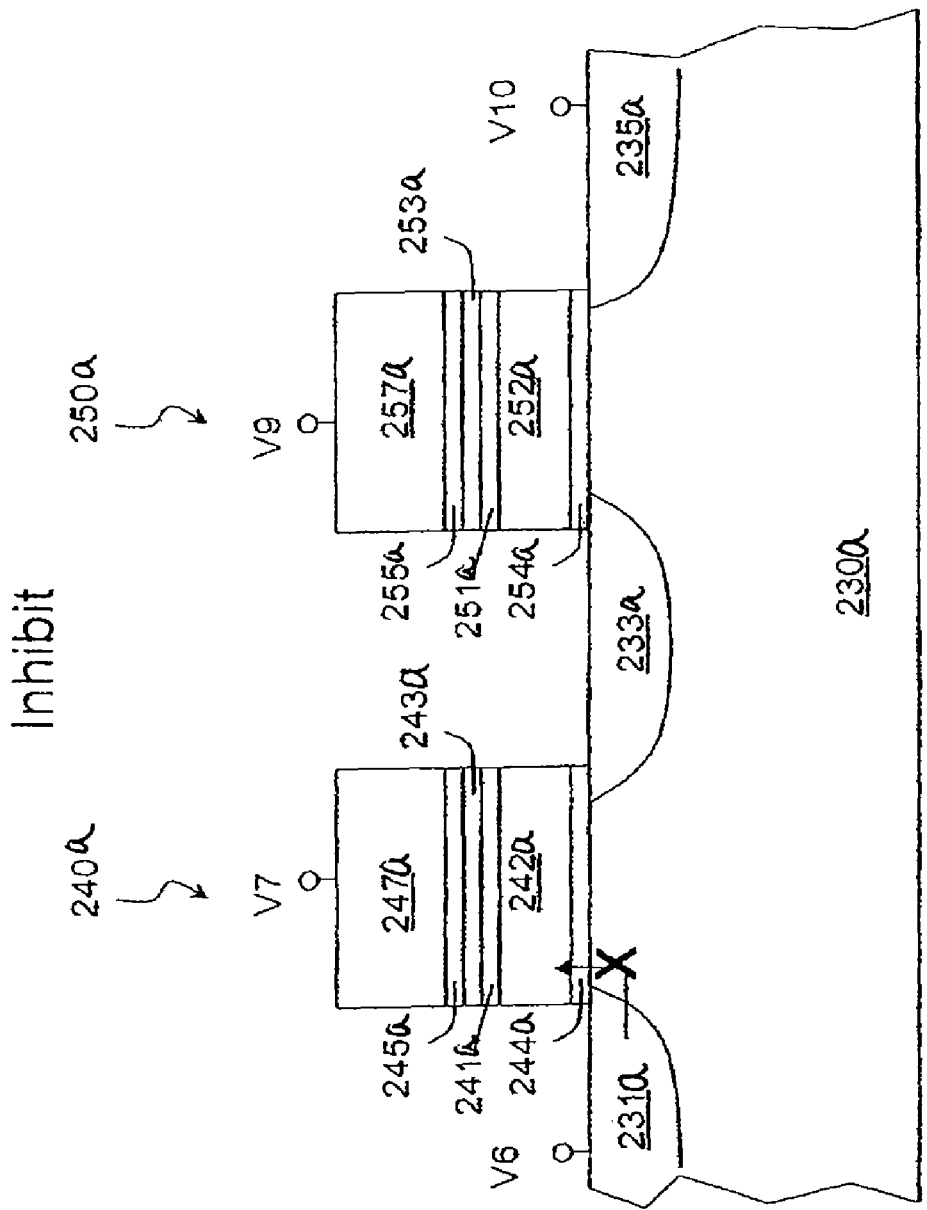
FIG. 5J is a schematic drawing showing an exemplary method for inhibiting programming disturbance of one of two exemplary memory cells.

FIG. 5J is a schematic drawing showing an exemplary method for inhibiting programming disturbance of one of two exemplary memory cells. In some embodiments, cells 240a and/or 250a can be erased and have charges, e.g., electrons, trapped in floating gates 242a, and 252a, respectively. In some embodiments programming cell (not shown) adjacent to cell 240a, the programming step may disturb cell 240a. In some embodiments for desirably reducing programming disturbance, substrate 230a may be substantially grounded, a positive voltage can be applied to doped region 231a, a negative voltage can be applied to gate 247a, doped region 233a can be floating, cell 250a can be configured to serve as a select transistor and be turned on, and doped region 235a can be coupled to a positive voltage. Since cell 250a is turned on, the positive voltage of doped region 235a can be coupled to doped region 233a. Due to the coupled voltage of doped region 233a, hot holes injected from doped region 231a into floating gate 242a can be desirably reduced. In some embodiments, the absolute value of the negative voltage applied to gate 247a can be substantially equal to the positive voltage of V6. In some embodiments, substrate 230a can be substantially grounded, voltage V6 can be about 5V, voltage V7 can be about −5V, doped region 233a is floating, cell 240a can be turned on, and voltage V10 can be about 3V. It is noted that the scope of the present invention is not limited to the specific voltages described above. One of ordinary skill in the art can modify the voltages to desirably avoid programming disturbance to cells 240a and/or 250a.

Figure 5K:
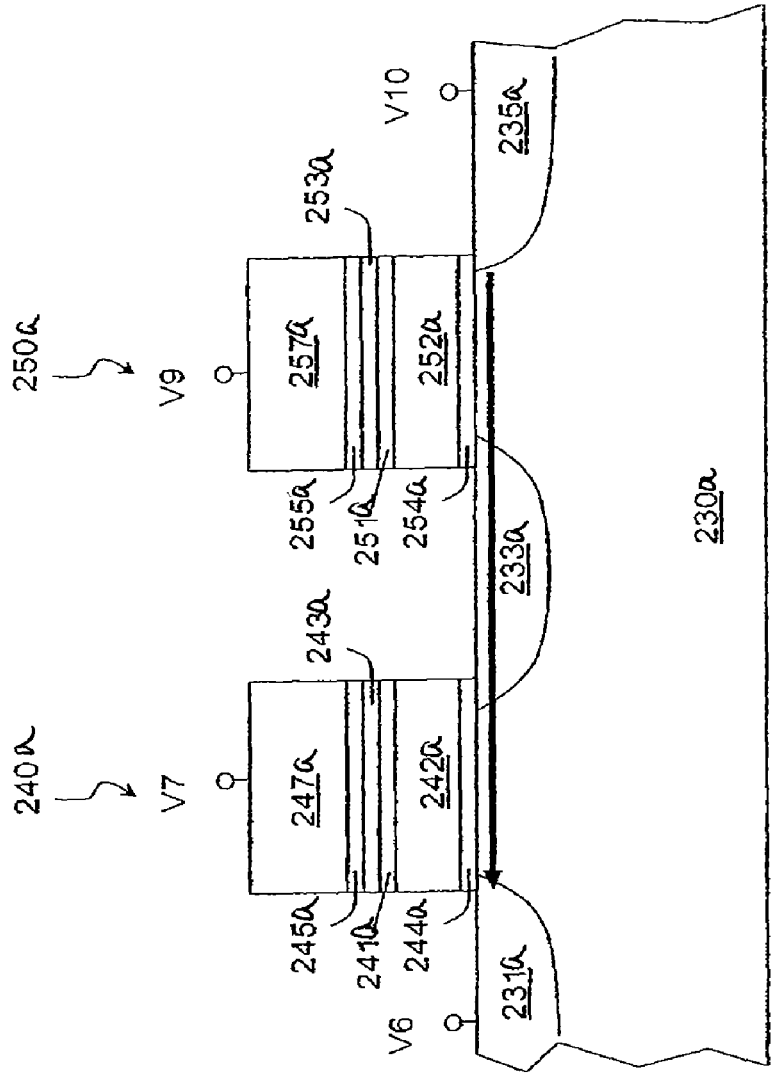
FIG. 5K is a schematic drawing showing an exemplary method for reading one of two exemplary memory cells.

FIG. 5K is a schematic drawing showing an exemplary method for reading one of two exemplary memory cells. In some embodiments reading cell 240a, substrate 230a can be substantially grounded, voltage V6 can be higher than voltage V10, voltage V9 can be applied a voltage higher than a predetermined threshold voltage of cell 250a, such that voltage V9 can turn on cell 250a. Voltage V7 can be a sense voltage. In some embodiments, the sense voltage can be between a "0" state voltage and a "1" state voltage of cell 240a. In some embodiments having cell 240a being "1" state, voltage V7 can turn on cell 240a. Electrons can flow from doped region 235a to doped region 231a through floating doped region 233a. In some embodiments having cell 240a being "0" state, voltage V7 can not turn on cell 240a. Electrons thus may not substantially flow from doped region 235a to doped region 231a. In some embodiments reading cell 240a, voltage V6 can be about 0.6V, voltage V7 can be between a "0" state voltage and a "1" state voltage of cell 240a, doped region 233a can be floating, voltage V9 can turn on cell 250a, and voltage V10 can be substantially grounded.

In some embodiments reading cell 250a, substrate 230a can be substantially grounded, voltage V10 can be higher than voltage V6, voltage V7 can be applied a voltage higher than a predetermined threshold voltage of cell 240a, such that voltage V7 can turn on cell 240a. Voltage V9 can be a sense voltage. In some embodiments, the sense voltage can be between a "0" state voltage and a "1" state voltage of cell 250a. In some embodiments, this read method can be referred to as a forward read method. It is noted that the scope of the present invention is not limited to the specific voltages described above. One of ordinary skill in the art can modify the voltages to desirably read cells 240a or 250a.

Figure 6A:
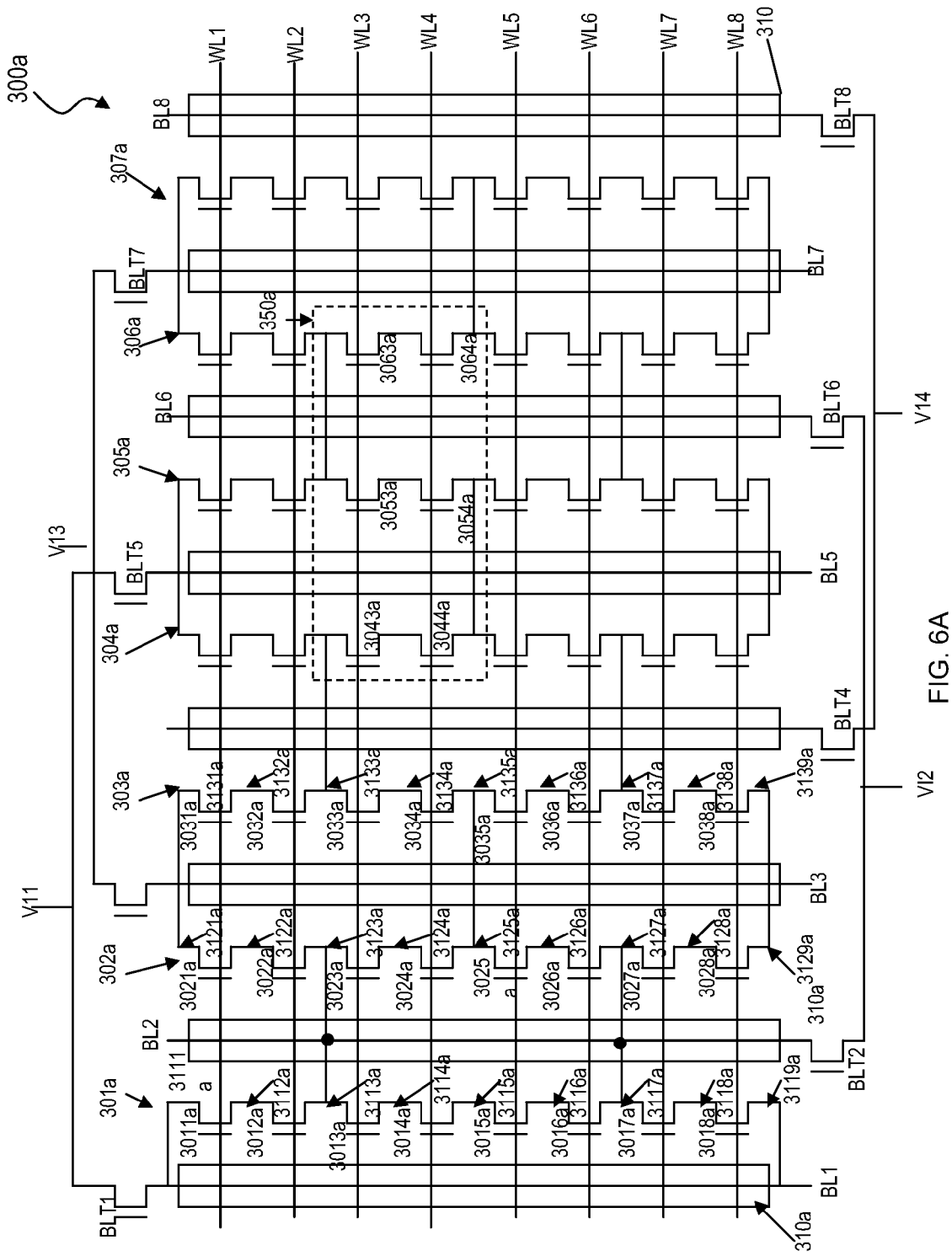
FIG. 6A is a schematic drawing showing a portion of an exemplary array structure.

FIG. 6A is a schematic drawing showing a portion of an exemplary array structure. In some embodiments, a memory array structure comprises a plurality of parallel series of cells and a plurality of bit lines substantially parallel to the plurality of parallel series of cells. In some embodiments, at least one isolation structure 310a is configured between two adjacent parallel series of cells. Each of the plurality of parallel series of cells can be configured between two of the plurality of bit lines. The plurality of parallel series of cells can comprise a $2m^{th}$ series of cells being configured between a $2m-1^{th}$ series of cells and a $2m+1^{th}$ series of cells. The $2m^{th}$ series of cells can comprise $4n+1^{th}$ doped regions coupled to $4n+1^{th}$ doped regions of the $2m+1^{th}$ series of cells, respectively. The $2m^{th}$ series of cells can comprise $4n+2^{th}$ and $4n+4^{th}$ doped regions which are floating. The $2m^{th}$ series of cells can comprise $4n+3^{th}$ doped regions coupled to $4n+3^{th}$ doped regions of the $2m-1^{th}$ series of cells, respectively, wherein m and n are integers. First word lines can be coupled to a plurality of the first cells of the plurality of parallel series of the cells. Second word lines can be coupled to a plurality of the second cells of the plurality of series of the cells, and so on. In some embodiments, the cells of array structure 300a can be cells 210a, 220a, 240a, and/or 250a described above in conjunction with FIGS. 5A and 5B.

Referring again to FIG. 6A, in some embodiments, array structure 300a, for example, can include parallel series of cells 301a-307a and bit lines BL1-BL8. Series of cells 301a-303a can include cells 3011a-3018a, 3021a-3028a, and 3031a-3038a, respectively. Series of cells 301a-303a can include doped regions 3111a-3119a, 3121a-3129a, and 3131a-3139a, respectively. Word lines WL1-WL8 can be configured substantially perpendicular to bit lines BL1-BL8. Word line WL1 can be coupled to first cells of the parallel series of cells 301a-307a. Word line WL2 can be coupled to second cells of the parallel series of cells 301a-307a. For series of cells 302a, doped regions 3121a, 3125a, and 3129a can be coupled to doped regions 3131a, 3135a, and 3139a, respectively. Doped regions 3123a and 3127a can be coupled to doped regions 3113a and 3117a, respectively. Doped regions 3122a, 3124a, 3126a, and 3128a can be floating.

In some embodiments, bit lines BL1-BL8 can be coupled to bit line transistors BLT1-BLT8, respectively. In some embodiments, bit line transistors BLT 1 and BLT 5 can be coupled to a voltage V11. Bit line transistor BLT2 and BLT6 can be coupled to a voltage V12. Bit line transistors BLT3 and BLT7 can be coupled to a voltage V13. Bit line transistors BLT4 and BLT8 can be coupled to a voltage V14. In some embodiments, bit line transistors BLT1-BLT8 can be configured to control the applying of voltages V11-V14 to respective bit lines BL1-BL8.

Figure 6B:
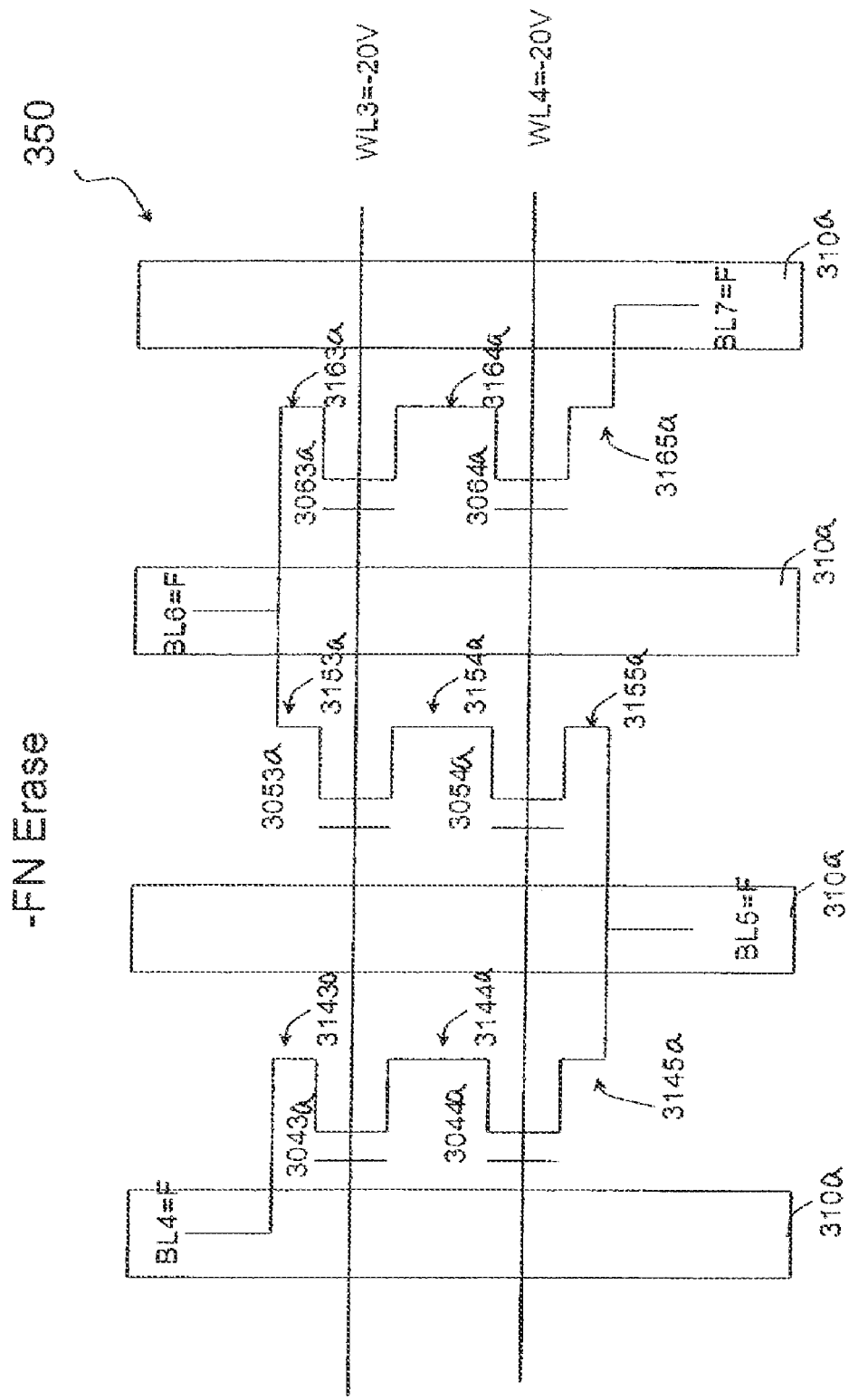
FIG. 6B is a schematic drawing showing an exemplary method for erasing at least one cell of area 350a shown in FIG. 6A.

FIG. 6B is a schematic drawing showing an exemplary method for erasing at least one cell of area 350a shown in FIG. 6A. For embodiments with cells 210a and 220a described above in conjunction with FIG. 5A, cells 3053a and/or 3054a can be erased and have charges, e.g., electrons, trapped in charge storage layers of cells 3053a and/or 3054a. In some embodiments erasing cells 3053a and/or 3054a, the substrate of array structure 300a may be substantially grounded, bit line BL5 can be floating, a voltage of word line WL3 can be about –20V, doped region 3154a can be floating, a voltage of word line WL4 can be about –20V, and bit line BL6 can be floating. Due to the voltage drop between word lines WL3, WL4 and the voltage of the substrate of array structure 300a, electrons can be injected from gates of cells 3053a and 3054a into charge storage layers of cells 3053a and 3054a, respectively. In some embodiments, this erasing method can be referred to as a negative gate Fowler-Nordheim (–FN) erasing method. It is noted that the scope of the present invention is not limited to the specific voltages described above. One of ordinary skill in the art can modify the voltages to desirably erase cells 3053a and/or 3054a.

In some embodiments, other bit lines such as bit lines BL4 and BL7 can be floating, such that cells 3043a, 3044a, 3063a, and 3064a can be erased. With this configuration, a regional or block erasing can be desirably achieved.

Figure 6C:
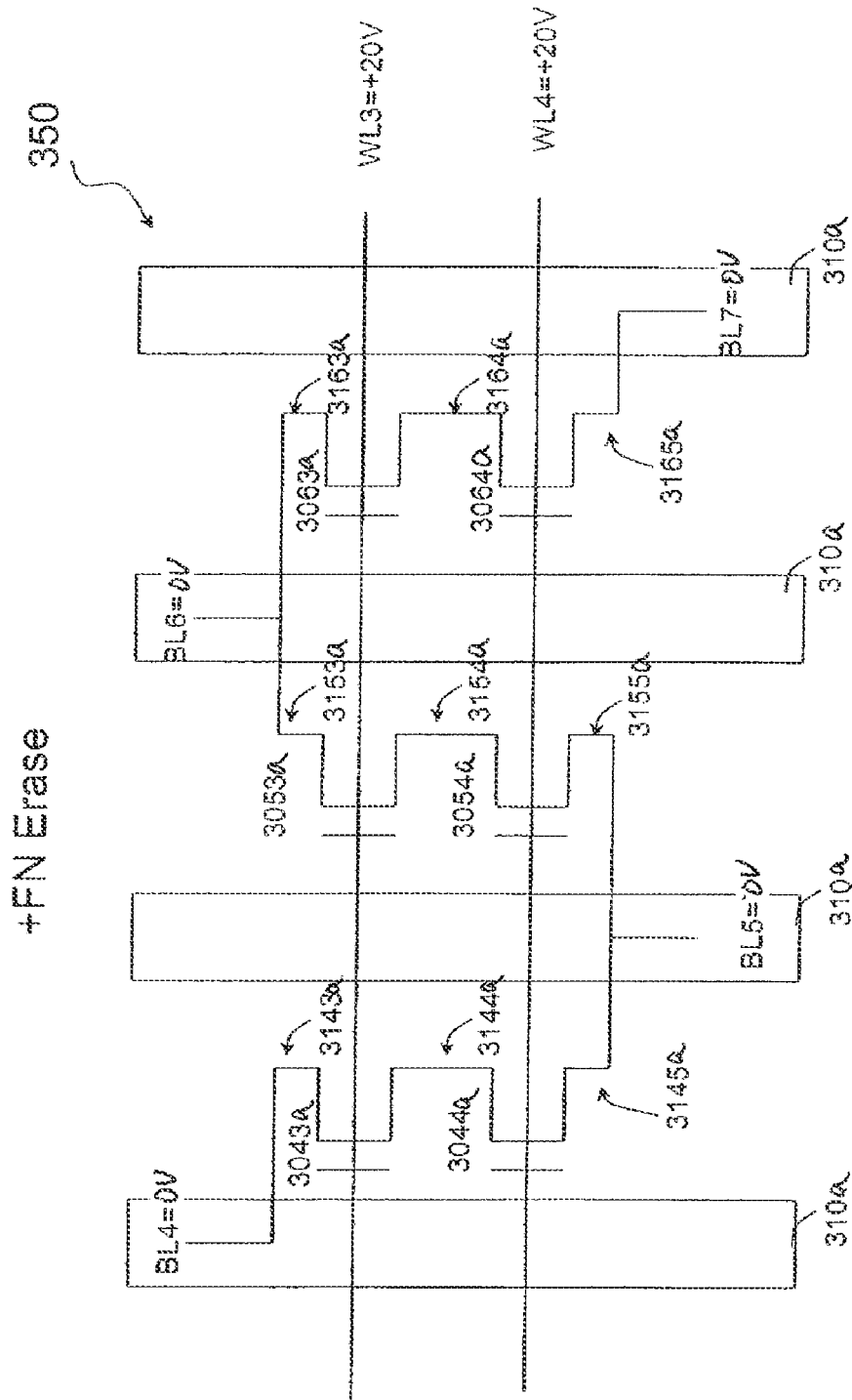
FIG. 6C is a schematic drawing showing an exemplary method for erasing at least one cell of area 350a shown in FIG. 6A.
Figure 6P:
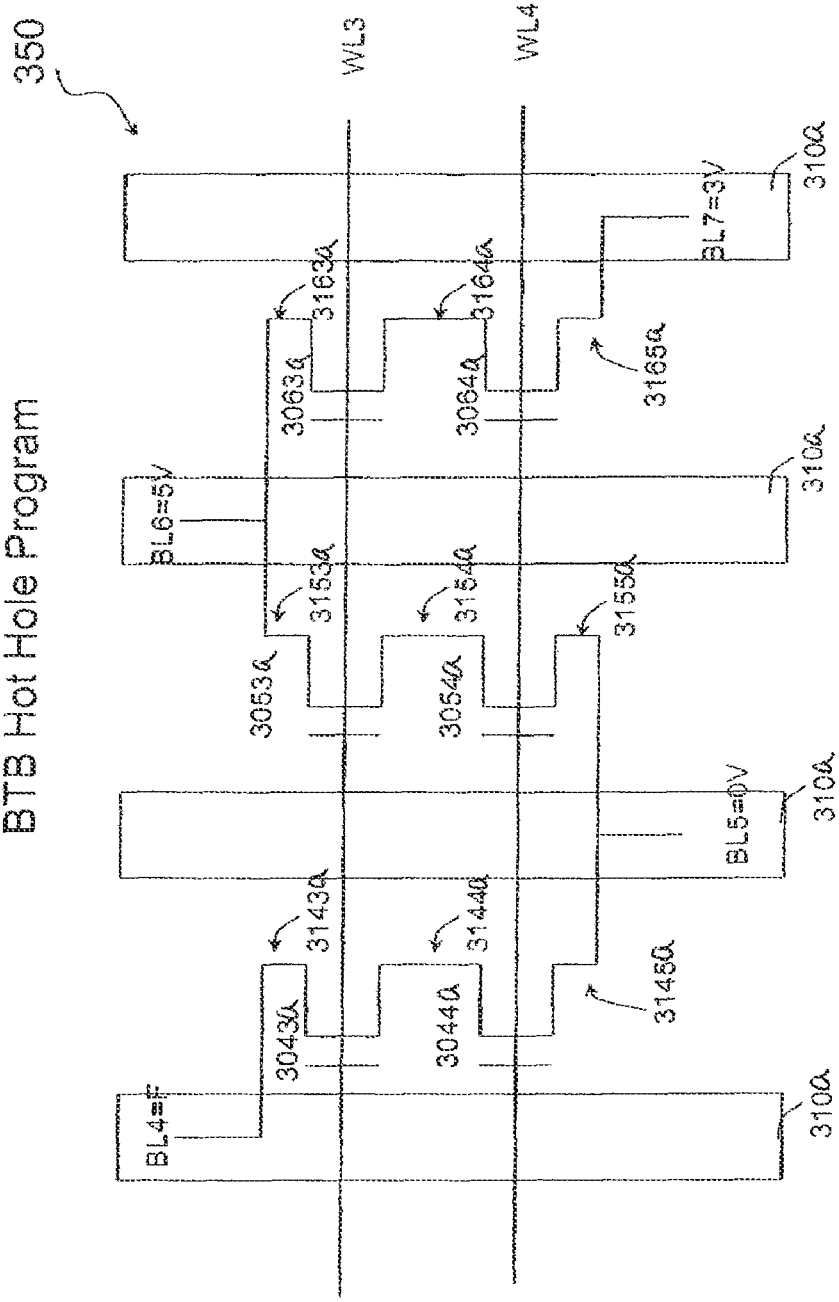
FIG. 6D is a schematic drawing showing an exemplary process for programming a cell of area 350a shown in FIG. 6A.

FIG. 6C is a schematic drawing showing an exemplary method for erasing at least one cell of area 350a shown in FIG. 6A. For embodiments with cells 240a and 250a described above in conjunction with FIG. 5B, cells 3053a and/or 3054a can be erased and have charges, e.g., electrons, trapped in floating gates of cells 3053a and/or 3054a. In some embodiments erasing cells 3053a and/or 3054a, the substrate of array structure 300a may be substantially grounded, bit line BL5 can be grounded, a voltage of word line WL3 can be about 20V, doped region 3154a can be floating, a voltage of word line WL4 can be about 20V, and bit line BL6 can be grounded. Due to the voltage drop between word lines WL3, WL4 and the voltage of the substrate of array structure 300a, electrons can be injected from the substrate of array structure 300a into floating gates of cells 3053a and 3054a. In some embodiments, this erasing method can be referred to as a positive gate Fowler-Nordheim (+FN) erasing method. It is noted that the scope of the present invention is not limited to the specific voltages described above. One of ordinary skill in the art can modify the voltages to desirably erase cells 3053a and/or 3054a.

In some embodiments, other bit lines such as bit lines BL4 and BL7 can be grounded, such that cells 3043a, 3044a, 3063a, and 3064a can be erased. With this configuration, a regional or block erasing can be desirably achieved.

FIG. 6D is a schematic drawing showing an exemplary process for programming a cell of area 350a shown in FIG. 6A. In some embodiments, cells 3053a and/or 3054a can be erased and have charges, e.g., electrons, trapped in charge storage layers or floating gates. In some embodiments programming cells 3053a, the substrate of array structure 300a may be substantially grounded. Bit line transistors BLT5 and BLT6 (shown in FIG. 6A) can be turned on. Bit line BL5 can be about 0V, a voltage of word line WL3 can be about −5V, doped region 3154a can be floating, a voltage of word line WL4 can be about 10V for turning on cell 3054a, and bit line BL6 can be 5V. Due to the voltage drop between voltages of bit line BL6 and word line WL3, hot holes can be injected into a charge storage layer or floating gate of cell 3053a to recombine with trapped electrons, such that cell 3053 can be programmed. In some embodiments, this programming method can be referred to as a band-to-band tunneling hot holes induced programming method. It is noted that the scope of the present invention is not limited to the specific voltages described above. One of ordinary skill in the art can modify the voltages to desirably erase cells 3053a and/or 3054a.

In some embodiments desirably reducing programming disturbance to cell 3063a, a voltage is applied to bit line BL7. The voltage of bit line BL7 can be lower than the voltage of bit line BL6. In some embodiments, the voltage of bit line BL7 is about 3V.

In some embodiments reading cell 3053a having a structure similar to cell 220a described above in conjunction with FIG. 5A, a voltage of the substrate of array structure 300a can be substantially grounded, a voltage of bit line BL5 can be higher than a voltage of bit line BL6, word line WL4 can be applied a voltage higher than a predetermined threshold voltage of cell 3054a, such that the voltage of word line WL4 can turn on cell 3054a. A voltage of word line WL3 can be a sense voltage. In some embodiments, the sense voltage can be between a "0" state voltage and a "1" state voltage of cell 3053a. In some embodiments having cell 3053a being "1" state, the voltage of word line WL3 can turn on cell 3053a. Electrons can flow from doped region 3153a to doped region 3155a through floating doped region 3154a. In some embodiments having cell 3053a being "0" state, the voltage of word line WL3 can not turn on cell 3053a. Electrons thus may not substantially flow from doped region 3153a to doped region 3155a. In some embodiments reading cell 3053a, the voltage of bit line BL5 can be about 1.6V, the voltage of word line WL4 can be about 10V, doped region 3154a can be floating, a voltage of word line WL3 can be between a "0" state voltage and a "1" state voltage of cell 3053a, and a voltage of bit line BL6 can be substantially grounded.

In some embodiments reading cell 3054a, the substrate of array structure 300a can be substantially grounded, a voltage of bit line BL6 can be higher than a voltage of bit line BL5, a voltage of word line WL3 can be applied a voltage higher than a predetermined threshold voltage of cell 3053a, such that the voltage of word line WL3 can turn on cell 3053a. A voltage of word line WL4 can be a sense voltage. In some embodiments, the sense voltage can be between a "0" state voltage and a "1" state voltage of cell 3054a. In some embodiments, this read method can be referred to as a reverse read method. It is noted that the scope of the present invention is not limited to the specific voltages described above. One of ordinary skill in the art can modify the voltages to desirably read cells 3053a or 3054a.

In some embodiments reading cell 3053a having a structure similar to cell 250a described above in conjunction with FIG. 5B, the substrate of array structure 300a can be substantially grounded, a voltage of bit line BL6 can be higher than a voltage of bit line BL5, word line WL4 can be applied a voltage higher than a predetermined threshold voltage of cell 3054a, such that the voltage of word line WL4 can turn on cell 3054a. A voltage of word line WL3 can be a sense voltage. In some embodiments, the sense voltage can be between a "0" state voltage and a "1" state voltage of cell 3053a. In some embodiments having cell 3053a being "1" state, the voltage of word line WL3 can turn on cell 3053a. Electrons can flow from doped region 3155a to doped region 3153a through floating doped region 3154a. In some embodiments having cell 3053a being "0" state, the voltage of word line WL3 can not turn on cell 3053a. Electrons thus may not substantially flow from doped region 3155a to doped region 3153a. In some embodiments reading cell 3053a, bit line BL5 can be substantially grounded, the voltage of word line WL4 can be about 8V, doped region 3154a can be floating, the voltage of word line WL3 can be between a "0" state voltage and a "1" state voltage of cell 3053a, and bit line BL6 can be about 0.6V.

In some embodiments reading cell 3054a, the substrate of array structure 300a can be substantially grounded, the voltage of bit line BL5 can be higher than the voltage of bit line BL6, the voltage of word line WL3 can be higher than a predetermined threshold voltage of cell 3053a, such that the voltage of word line WL3 can turn on cell 3053a. The voltage of word line WL4 can be a sense voltage. In some embodiments, the sense voltage can be between a "0" state voltage and a "1" state voltage of cell 3054a. In some embodiments, this read method can be referred to as a forward read method. It is noted that the scope of the present invention is not limited to the specific voltages described above. One of ordinary skill in the art can modify the voltages to desirably read cells 3053a or 3054a.

Table III shows exemplary methods for operating cells 3053a and/or 3054a array structure 300a described above in conjunction with FIG. 6A.

TABLE III

| | Cell | Inhibit cell | WL3 | WL4 | BL4 | BL5 | BL6 | BL7 | Substrate | Other unselected WL |
|---|---|---|---|---|---|---|---|---|---|---|
| Program (BTB HH) | 3053a | 3063a | −5 V | 12 V | Floating | 0 V | 5 V | 3 V | 0 V | 0 V or −Vg |
| | 3054a | 3044a | 12 V | −5 V | 3 V | 5 V | 0 V | Floating | 0 V | 0 V or −Vg |
| Read (Reverse) | 3053a | | 5 V | 10 V | Floating | 1.6 V | 0 V | Floating | 0 V | 0 V or −Vg |
| | 3054a | | 10 V | 5 V | Floating | 0 V | 1.6 V | Floating | 0 V | 0 V or −Vg |
| Read (Forward) | 3053a | | 5 V | 8 V | Floating | 0 V | 0.6 V | Floating | 0 V | 0 V or −Vg |
| | 3054a | | 8 V | 5 V | Floating | 0.6 V | 0 V | Floating | 0 V | 0 V or −Vg |
| Erase (−FN) | All | | −20 V | −20 V | Floating | Floating | Floating | Floating | 0 V | −20 V |
| Erase (+FN) | All | | +20 V | +20 V | 0 V | 0 V | 0 V | 0 V | 0 V | +20 V |

It is noted that the scope of the present invention is not limited to the specific voltages described above. One of ordinary skill in the art can modify the voltages to desirably operate cells 3053a or 3054a.

Figure 7A:
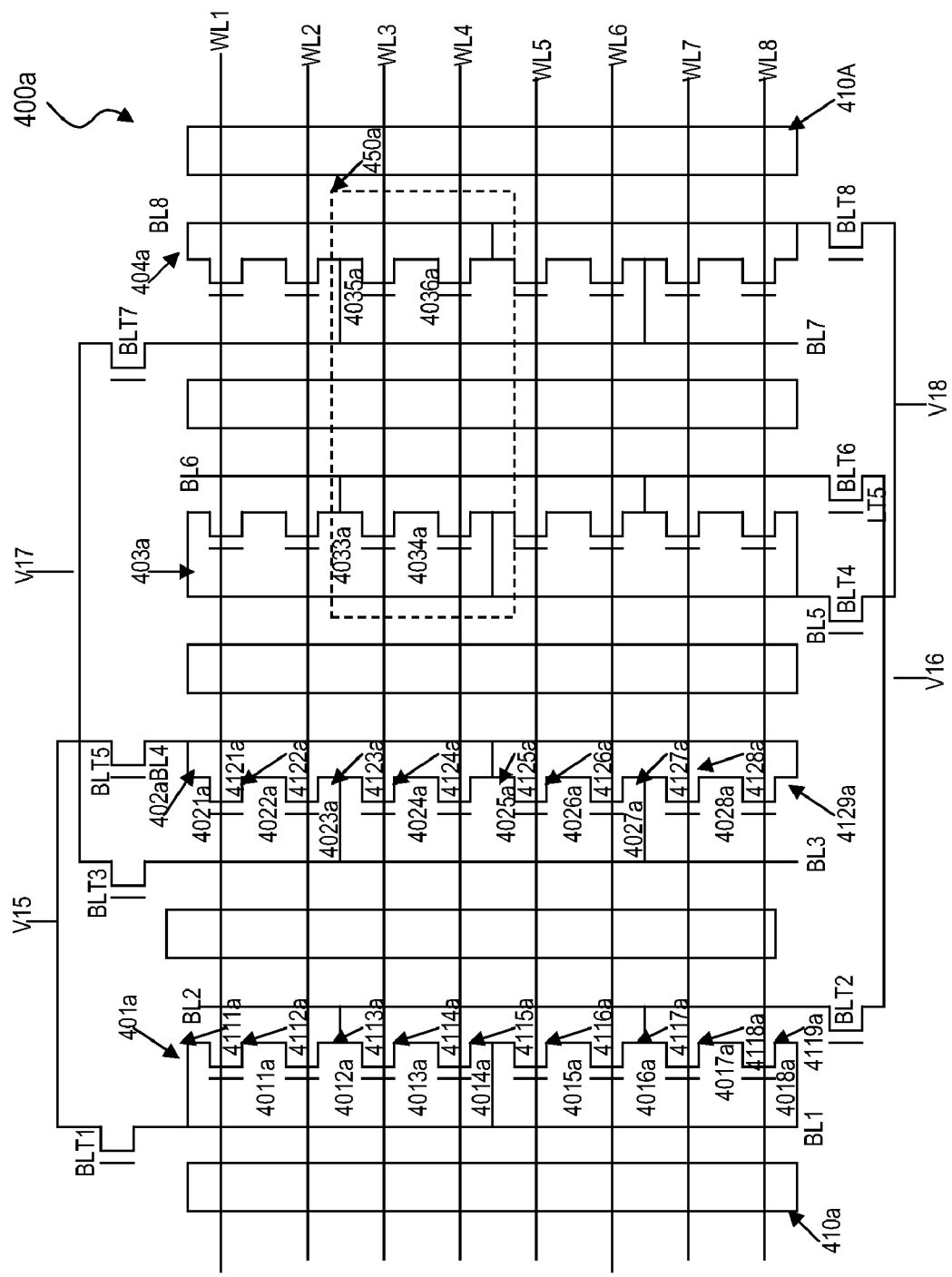
FIG. 7A is a schematic drawing showing a portion of an exemplary array structure.

FIG. 7A is a schematic drawing showing a portion of an exemplary array structure. In some embodiments, a memory array structure comprises a plurality of parallel series of cells and a plurality of bit lines substantially parallel to the plurality of series of cells. Each of the plurality of series of cells can be configured between two bit lines. Each of the plurality of parallel series of cells can include $4n+1^{th}$, $4n+2^{th}$, $4n+3^{th}$, and $4n+4^{th}$ doped regions. The $4n+1^{th}$ doped regions can be coupled to first one of the two bit lines, the $4n+2^{th}$, and $4n+4^{th}$ doped region can be floating, and the $4n+3^{th}$ doped regions can be coupled to second one of the two bit lines, wherein n is an integer. In some embodiments, each of the series of cells can be configured between two isolation structures 410. First word lines can be coupled to the first cells of the plurality of parallel series of the cells. Second word lines can be coupled to the second cells of the plurality of series of the cells. In some embodiments, the cells of array structure 400a can be cells 210a, 220a, 240a, and/or 250a described above in conjunction with FIGS. 5A and 5B.

Referring again to FIG. 7A, in some embodiments, array structure 400a, for example, can include parallel series of cells 401a-404a and bit lines BL1-BL8. Series of cells 401a and 402a can include cells 4011a-4018a, and 4021a-4028a, respectively. Series of cells 401a and 402a can include doped regions 4111a-4119a, and 4121a-4129a, respectively. Word lines WL1-WL8 can be configured substantially perpendicular to bit lines BL1-BL8. Word line WL1 can be coupled to first cells of the parallel series of cells 401a-404a. Word line WL2 can be coupled to second cells of the parallel series of cells 401a-404a. For series of cells 402a, doped regions 4121a, 4125a, and 4129a can be coupled to bit line BL4. Doped regions 4123a and 4127a can be coupled to bit line BL3. Doped regions 4122a, 4124a, 4126a, and 4128a can be floating.

In some embodiments, bit lines BL1-BL8 can be coupled to bit line transistors BLT1-BLT8, respectively. In some embodiments, bit line transistors BLT1 and BLT5 can be coupled to a voltage V15. Bit line transistors BLT2 and BLT6 can be coupled to a voltage V16. Bit line transistors BLT3 and BLT7 can be coupled to a voltage V17. Bit line transistors BLT4 and BLT8 can be coupled to a voltage V18. In some embodiments, bit line transistors BLT1-BLT8 can be configured to control the applying of voltages V15-V18 to respective bit lines BL1-BL8.

Figure 7B:
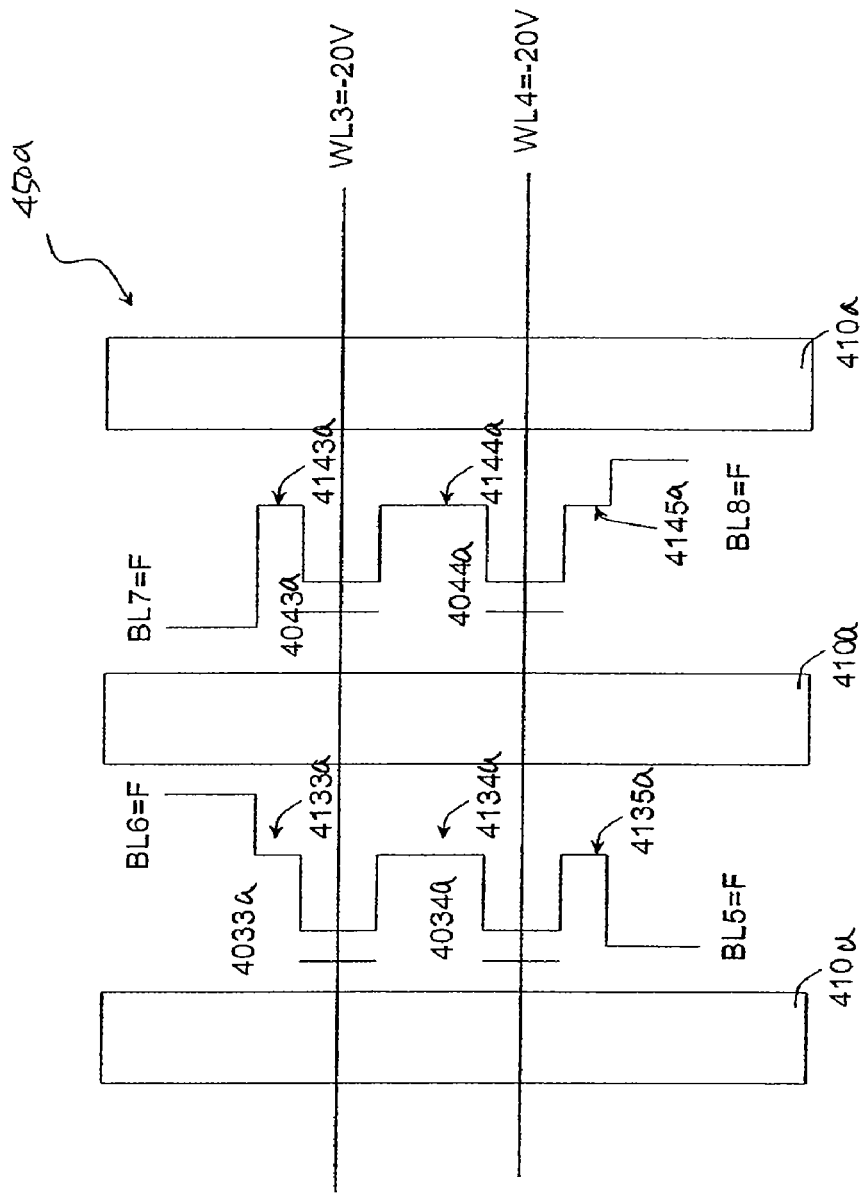
FIG. 7B is a schematic drawing showing an exemplary method for erasing at least one cell of area 450a shown in FIG. 7A.

FIG. 7B is a schematic drawing showing an exemplary method for erasing at least one cell of area 450a shown in FIG. 7A. For embodiments with cells 210a and 220a described above in conjunction with FIG. 5A, cells 4043a and/or 4044a can be erased and have charges, e.g., electrons, trapped in charge storage layers of cells 4043a and/or 4044a. In some embodiments erasing cells 4043a and/or 4044a, the substrate of array structure 400a may be substantially grounded, bit line BL7 can be floating, a voltage of word line WL3 can be about −20V, doped region 4144a can be floating, a voltage of word line WL4 can be about −20V, and bit line BL8 can be floating. Due to the voltage drop between word lines WL3, WL4 and the voltage of the substrate of array structure 400a, electrons can be injected from gates of cells 4043a and 4044a into charge storage layers of cells 4043a and 4044a, respectively. In some embodiments, this erasing method can be referred to as a −FN erasing method. It is noted that the scope of the present invention is not limited to the specific voltages described above. One of ordinary skill in the art can modify the voltages to desirably erase cells 4043a and/or 4044a.

In some embodiments, other bit lines such as bit lines BL5 and BL6 can be floating, such that cells 4033a and 4034a can be erased. With this configuration, a regional or block erasing can be desirably achieved.

Figure 7C:
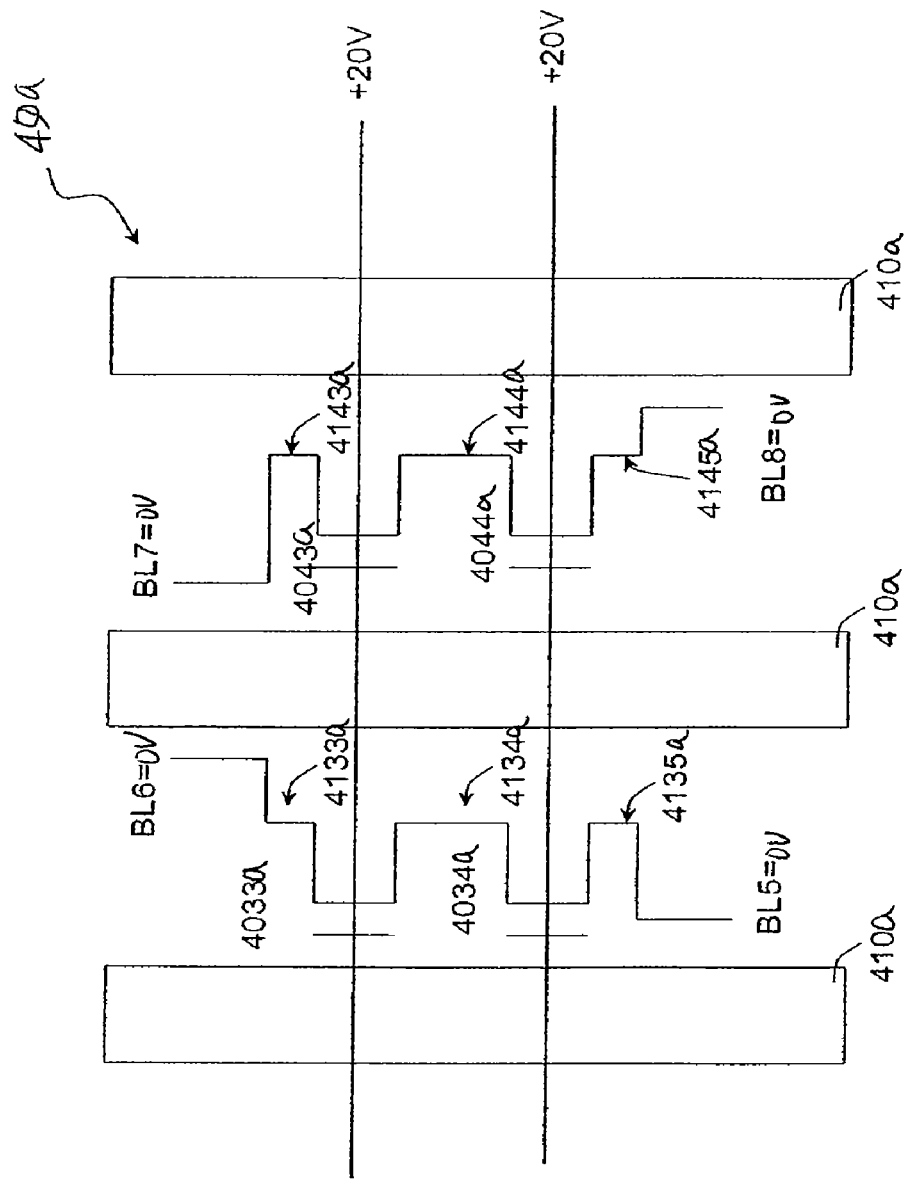
FIG. 7C is a schematic drawing showing an exemplary method for erasing at least one cell of area 450a shown in FIG. 7A.

FIG. 7C is a schematic drawing showing an exemplary method for erasing at least one cell of area 450a shown in FIG. 7A. For embodiments with cells 240a and 250a described above in conjunction with FIG. 5B, cells 4043a and/or 4044a can be erased and have charges, e.g., electrons, trapped in floating gates of cells 4043a and/or 4044a. In some embodiments erasing cells 4043a and/or 4044a, the substrate of array structure 400a may be substantially grounded, bit line BL7 can be grounded, a voltage of word line WL3 can be about 20V, doped region 4144a can be floating, a voltage of word line WL4 can be about 20V, and bit line BL8 can be grounded. Due to the voltage drop between word lines WL3, WL4 and the voltage of the substrate of array structure 400a, electrons can be injected from the substrate of array structure 400 into floating gates of cells 4043a and 4044a. In some embodiments, this erasing method can be referred to as a +FN erasing method. It is noted that the scope of the present invention is not limited to the specific voltages described above. One of ordinary skill in the art can modify the voltages to desirably erase cells 4043a and/or 4044a.

In some embodiments, other bit lines such as bit lines BL5 and BL6 can be grounded, such that cells 4033a and 4034a can be erased. With this configuration, a regional or block erasing can be desirably achieved.

Figure 7D:
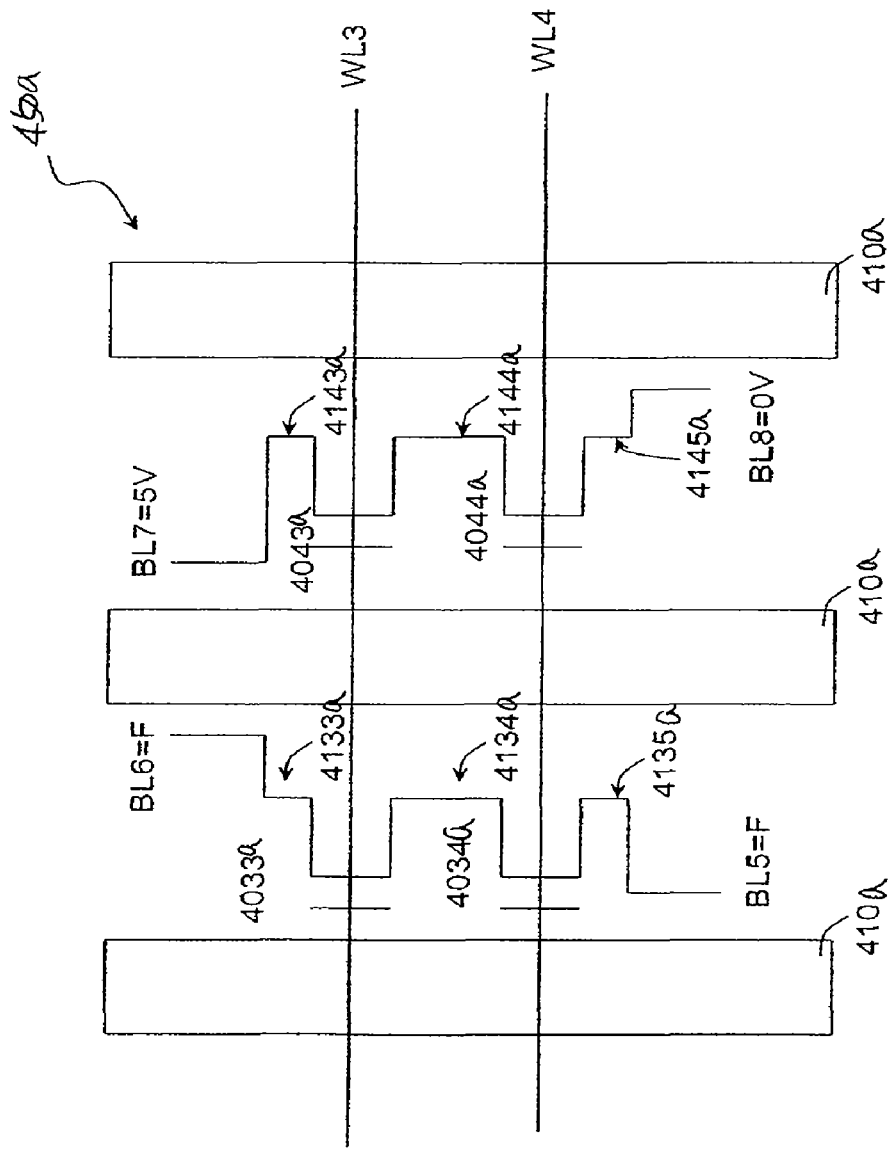
FIG. 7D is a schematic drawing showing an exemplary process for programming a cell of area 450a shown in FIG. 7A.

FIG. 7D is a schematic drawing showing an exemplary process for programming a cell of area 450a shown in FIG. 7A. In some embodiments, cells 4043a and/or 4044a can be erased and have charges, e.g., electrons, trapped in charge storage layers or floating gates. In some embodiments programming cells 4043a, the substrate of array structure 400a may be substantially grounded. Bit line transistors BLT7 and BLT8 (shown in FIG. 7A) can be turned on. Bit line BL8 can be about 0V, a voltage of word line WL3 can be about −5V, doped region 4144a can be floating, a voltage of word line WL4 can be about 10V for turning on cell 4044a, and bit line BL7 can be 5V. Due to the voltage drop between voltages of bit line BL7 and word line WL3, hot holes can be injected into a charge storage layer or floating gate of cell 4043a to recombine with trapped electrons, such that cell 4043a can be programmed. In some embodiments, this programming method can be referred to as a band-to-band tunneling induced hot hole programming method. It is noted that the scope of the present invention is not limited to the specific voltages described above. One of ordinary skill in the art can modify the voltages to desirably erase cells 4043a and/or 4044a.

In some embodiments reading cell 4043a having a structure similar to cell 220a described above in conjunction with FIG. 5A, a voltage of the substrate of array structure 400a can be substantially grounded, a voltage of bit line BL8 can be higher than a voltage of bit line BL7, word line WL4 can be applied a voltage higher than a predetermined threshold voltage of cell 4044a, such that the voltage of word line WL4 can turn on cell 4044a. A voltage of word line WL3 can be a sense voltage. In some embodiments, the sense voltage can be between a "0" state voltage and a "1" state voltage of cell 4043a. In some embodiments having cell 4043a being "1" state, the voltage of word line WL3 can turn on cell 4043a. Electrons can flow from doped region 4143a to doped region 4145a through floating doped region 4144a. In some embodiments having cell 4043a being "0" state, the voltage of word line WL3 can not turn on cell 4043a. Electrons thus may not substantially flow from doped region 4143a to doped region 4145a. In some embodiments reading cell 4043a, the voltage of bit line BL8 can be about 1.6V, the voltage of word line WL4 can be about 10V, doped region 4144a can be floating, a voltage of word line WL3 can be between a "0" state voltage and a "1" state voltage of cell 4043a, and a voltage of bit line BL7 can be substantially grounded.

In some embodiments reading cell 4044a, the substrate of array structure 300a can be substantially grounded, a voltage of bit line BL7 can be higher than a voltage of bit line BL8, a voltage of word line WL3 can be applied a voltage higher than a predetermined threshold voltage of cell 4043a, such that the voltage of word line WL3 can turn on cell 4043a. A voltage of word line WL4 can be a sense voltage. In some embodiments, the sense voltage can be between a "0" state voltage and a "1" state voltage of cell 4044a. In some embodiments, this read method can be referred to as a reverse read method. It is noted that the scope of the present invention is not limited to the specific voltages described above. One of ordinary skill in the art can modify the voltages to desirably read cells 4043a or 4044a.

In some embodiments reading cell 4043a having a structure similar to cell 250a described above in conjunction with FIG. 5B, the substrate of array structure 400a can be substantially grounded, a voltage of bit line BL7 can be higher than a voltage of bit line BL8, word line WL4 can be applied a voltage higher than a predetermined threshold voltage of cell 4044a, such that the voltage of word line WL4 can turn on cell 4044a. A voltage of word line WL3 can be a sense voltage. In some embodiments, the sense voltage can be between a "0" state voltage and a "1" state voltage of cell 4043a. In some embodiments having cell 4043a being "1" state, the voltage of word line WL3 can turn on cell 4043a. Electrons can flow from doped region 4145a to doped region 4143a through floating doped region 4144a. In some embodiments having cell 4043a being "0" state, the voltage of word line WL3 can not turn on cell 4043a. Electrons thus may not substantially flow from doped region 4145a to doped region 4143a. In some embodiments reading cell 4043a, bit line BL8 can be substantially grounded, the voltage of word line WL4 can be about 8V, doped region 4144a can be floating, the voltage of word line WL3 can be between a "0" state voltage and a "1" state voltage of cell 4043a, and bit line BL7 can be about 0.6V.

In some embodiments reading cell 4044a, the substrate of array structure 400a can be substantially grounded, the voltage of bit line BL8 can be higher than the voltage of bit line BL7, the voltage of word line WL3 can be higher than a predetermined threshold voltage of cell 4043a, such that the voltage of word line WL3 can turn on cell 4043a. The voltage of word line WL4 can be a sense voltage. In some embodiments, the sense voltage can be between a "0" state voltage and a "1" state voltage of cell 4044a. In some embodiments, this read method can be referred to as a forward read method. It is noted that the scope of the present invention is not limited to the specific voltages described above. One of ordinary skill in the art can modify the voltages to desirably read cells 4043a or 4044a.

Table IV shows exemplary methods for operating cells 4043a and/or 4044a array structure 400a described above in conjunction with FIG. 7A.

It is noted that the scope of the present invention is not limited to the specific voltages described above. One of ordinary skill in the art can modify the voltages to desirably operate cells 4043a or 4044a.

While foregoing is directed to some exemplary embodiments, other and further embodiments may be devised without departing from the basic scope thereof, and the scope thereof is determined by the claims that follow.

What is claimed is:

1. An integrated circuit, comprising:
  a memory cell structure, including:
    a first cell including a first storage structure and a first gate over a substrate, the first gate being over the first storage structure;
    a second cell including a second storage structure and a second gate over the substrate, the second gate being over the second storage structure, the first gate being separated from the second gate;
    a first doped region adjacent to the first cell, the first doped region being coupled to a first source;
    a second doped region adjacent to the second cell, the second doped region being coupled to a second source; and
    at least one third doped region between the first cell and the second cell, the third doped region being floating; and
  a circuit unit configured to apply a programming bias arrangement, including:
    applying a first voltage to the first doped region;
    applying a second voltage to the second doped region, the first voltage being higher than the second voltage;
    applying a third voltage to the first gate;
    applying a fourth voltage to the second gate; and
    applying a fifth voltage to the substrate, thereby programming the first cell;
  wherein the programming bias arrangement injects a first type of charges to the first storage structure of the first cell and is insufficient to turn on the first cell.

2. The integrated circuit of claim 1, wherein the third doped region is floating and free from being coupled to a source.

3. The integrated circuit of claim 1, wherein the circuit unit further configured to apply an erase bias arrangement to erase the first cell comprises:
  applying a sixth voltage to the substrate; and
  applying a seventh voltage to the first gate, whereby a second type of charges are injected from the first gate to the first storage structure of the first cell.

4. The integrated circuit of 1, wherein the circuit unit further configured to apply an erase bias arrangement to erase the first cell comprises:
  applying a sixth voltage to the substrate;
  applying a seventh voltage to the first gate; and
  applying an eighth voltage to the first doped region,

TABLE IV

|  | Cell | WL3 | WL4 | BL5 | BL6 | BL7 | BL8 | Substrate | Other unselected |
|---|---|---|---|---|---|---|---|---|---|
| Program (BTB HH) | 3053a | −5 V | 12 V | Floating | Floating | 5 V | 0 V | 0 V | 0 V or −Vg |
|  | 3054a | 12 V | −5 V | Floating | Floating | 0 V | 5 V | 0 V | 0 V or −Vg |
| Read (Reverse) | 3053a | 5 V | 10 V | Floating | Floating | 0 V | 1.6 V | 0 V | 0 V or −Vg |
|  | 3054a | 10 V | 5 V | Floating | Floating | 1.6 V | 0 V | 0 V | 0 V or −Vg |
| Read (Forward) | 3053a | 5 V | 8 V | Floating | Floating | 0.6 V | 0 V | 0 V | 0 V or −Vg |
|  | 3054a | 8 V | 5 V | Floating | Floating | 0 V | 0.6 V | 0 V | 0 V or −Vg |
| Erase (−FN) | All | −20 V | −20 V | Floating | Floating | Floating | Floating | 0 V | −20 V |
| Erase (+FN) | All | +20 V | +20 V | 0 V | 0 V | 0 V | 0 V | 0 V | +20 V | whereby the first type of charges are removed from the first storage structure of the first cell.

5. The integrated circuit of claim 1, wherein the circuit unit further configured to apply an erase bias arrangement to erase the first cell comprises:
 applying a sixth voltage to the substrate;
 applying a seventh voltage to the first gate; and
 applying an eighth voltage to the first doped region, whereby a second type of charges are injected from the substrate to the first storage structure of the first cell.

6. The integrated circuit of claim 1, wherein the circuit unit further configured to read the first cell by at least:
 applying a sixth voltage to the first doped region;
 applying a seventh voltage to the second doped region, wherein the seventh voltage is higher than the sixth voltage;
 applying an eighth voltage to the first gate; and
 applying a ninth voltage to the second gate to turn on the second cell.

7. The integrated circuit of claim 1, wherein the circuit unit further configured to read the first cell by at least:
 applying a sixth voltage to the first doped region;
 applying a seventh voltage to the second doped region, wherein the sixth voltage is higher than the seventh voltage;
 applying an eighth voltage to the first gate; and
 applying a ninth voltage to the second gate to turn on the second cell.

8. The integrated circuit of claim 1, wherein each of the plurality of memory cells include a gate over a storage structure and each storage structure is capable of holding multiple bits of information, the circuit unit further configured to program the memory cell until a threshold voltage of the memory cell is within a predetermined range of a threshold voltage target.

9. The integrated circuit of claim 1, wherein the circuit unit is configured to apply a programming bias arrangement for programming by band-to-band tunneling induced hot holes.

10. The integrated circuit of claim 1, wherein the programming bias arrangement is configured to apply to the first cell a voltage that is below a threshold voltage of the first cell and is insufficient to turn on the first cell.

11. The integrated circuit of claim 1, wherein the first doped region and the second doped region comprise contacts for connecting to a first bit line and a second bit line, respectively.

12. The integrated circuit of claim 1, wherein the fourth voltage applied to the second gate is higher than the first voltage, and the programming bias arrangement is configured to turn on the second cell.

13. An integrated circuit, comprising:
 a memory cell structure, including:
  a first cell including a first storage structure and a first gate over a substrate, the first gate being over the first storage structure;
  a second cell including a second storage structure and a second gate over the substrate, the second gate being over the second storage structure, the first gate being separated from the second gate;
  a first doped region adjacent to the first cell;
  a second doped region adjacent to the second cell, the second doped region being coupled to a second source; and
  at least one third doped region between the first cell and the second cell, the third doped region being floating; and
 a circuit unit configured to apply a programming bias arrangement, including:
  applying a first voltage to the first doped region through a first bit line which contacts the first doped region;
  applying a second voltage to the second doped region through a second bit line which contacts the second doped region, the first voltage being higher than the second voltage;
  applying a third voltage to the first gate;
  applying a fourth voltage to the second gate; and
  applying a fifth voltage to the substrate, thereby programming the first cell;
 wherein the programming bias arrangement injects a first type of charges to the first storage structure of the first cell and is insufficient to turn on the first cell.

14. The integrated circuit of claim 13, wherein the first doped region is directly coupled to the first bit line.

15. The integrated circuit of claim 13, wherein the second doped region is directly coupled to the second bit line.

16. The integrated circuit of claim 13, wherein the fourth voltage applied to the second gate is higher than the first voltage, and the programming bias arrangement is configured to turn on the second cell.

* * * * *